United States Patent
Yamamoto et al.

(10) Patent No.: US 9,064,889 B2
(45) Date of Patent: Jun. 23, 2015

(54) SEMICONDUCTOR DEVICE WITH EPITAXIAL SEMICONDUCTOR LAYER FOR SOURCE/DRAIN ON SUBSTRATE, AND METHOD OF MANUFACTURING THE SAME

(71) Applicant: RENESAS ELECTRONICS CORPORATION, Kawasaki-shi, Kanagawa (JP)

(72) Inventors: Kenichi Yamamoto, Kawasaki (JP); Hiromi Sasaki, Kawasaki (JP); Tomotake Morita, Kawasaki (JP); Masashige Moritoki, Kawasaki (JP)

(73) Assignee: RENESAS ELECTRONICS CORPORATION, Kanagawa (JP)

(*) Notice: Subject to any disclaimer, the term of this patent is extended or adjusted under 35 U.S.C. 154(b) by 0 days.

(21) Appl. No.: 13/954,343

(22) Filed: Jul. 30, 2013

(65) Prior Publication Data

US 2014/0077288 A1 Mar. 20, 2014

(30) Foreign Application Priority Data

Sep. 18, 2012 (JP) .................................. 2012-204838

(51) Int. Cl.
| | |
|---|---|
| *H01L 29/76* | (2006.01) |
| *H01L 29/94* | (2006.01) |
| *H01L 31/062* | (2012.01) |
| *H01L 31/113* | (2006.01) |
| *H01L 31/119* | (2006.01) |
| *H01L 29/66* | (2006.01) |
| *H01L 29/78* | (2006.01) |
| *H01L 21/28* | (2006.01) |
| *H01L 29/49* | (2006.01) |
| *H01L 21/8234* | (2006.01) |
| *H01L 21/8238* | (2006.01) |
| *H01L 27/088* | (2006.01) |

(52) U.S. Cl.
CPC .......... *H01L 29/66477* (2013.01); *H01L 29/78* (2013.01); *H01L 21/823418* (2013.01); *H01L 21/823425* (2013.01); *H01L 21/823468* (2013.01); *H01L 21/823814* (2013.01); *H01L 27/088* (2013.01); *H01L 21/28035* (2013.01); *H01L 29/4925* (2013.01); *H01L 29/66628* (2013.01); *H01L 29/7834* (2013.01)

(58) Field of Classification Search
CPC ............... H01L 21/823418; H01L 21/823814; H01L 29/41783
USPC .................. 257/368, 369, 377, 382, E27.062, 257/E27.06

See application file for complete search history.

(56) References Cited

U.S. PATENT DOCUMENTS

| 6,017,823 A | 1/2000 | Shishiguchi et al. | |
|---|---|---|---|
| 8,673,699 B2* | 3/2014 | Adam et al. | 438/154 |
| 2007/0001239 A1* | 1/2007 | Deleonibus | 257/408 |

FOREIGN PATENT DOCUMENTS

JP 10-242464 A 9/1998

*Primary Examiner* — Hoai V Pham
(74) *Attorney, Agent, or Firm* — McDermott Will & Emery LLP

(57) ABSTRACT

To improve performance of a semiconductor device. Over a semiconductor substrate, a gate electrode is formed via a first insulating film for a gate insulating film, and a second insulating film extends from over a side wall of the gate electrode to over the semiconductor substrate. Over the semiconductor substrate in a part exposed from the second insulating film, a semiconductor layer, which is an epitaxial layer for source/drain, is formed. The second insulating film has a part extending over the side wall of the gate electrode and a part extending over the semiconductor substrate, and a part of the semiconductor layer lies over the second insulating film in the part extending over the semiconductor substrate.

4 Claims, 28 Drawing Sheets

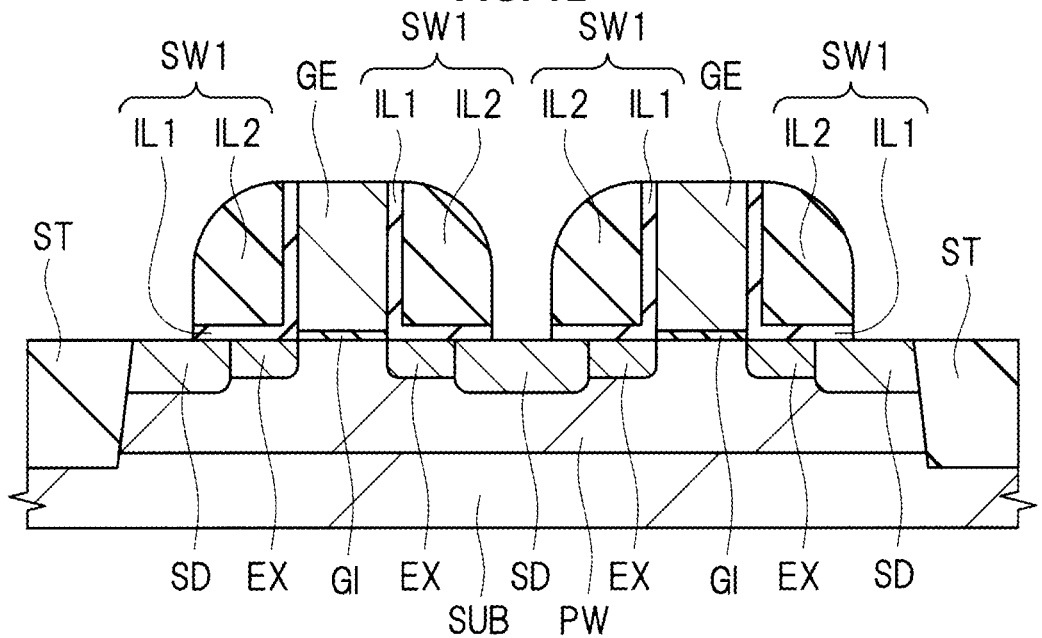
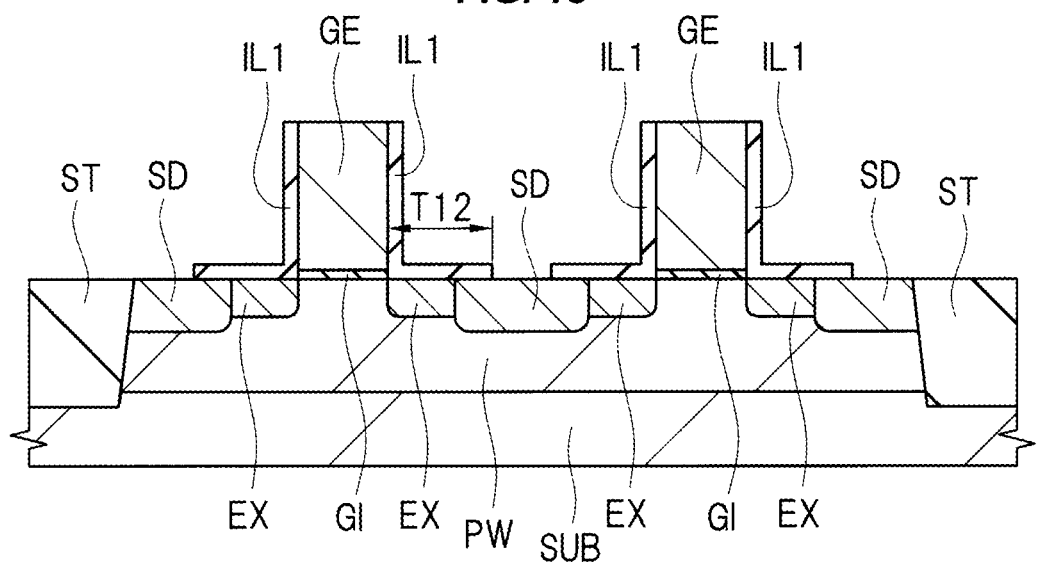

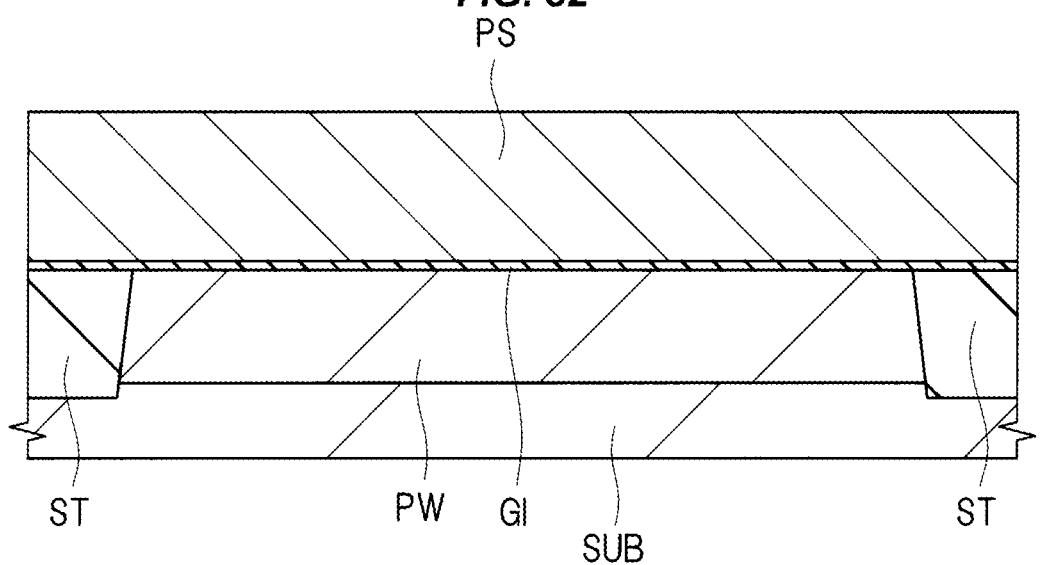
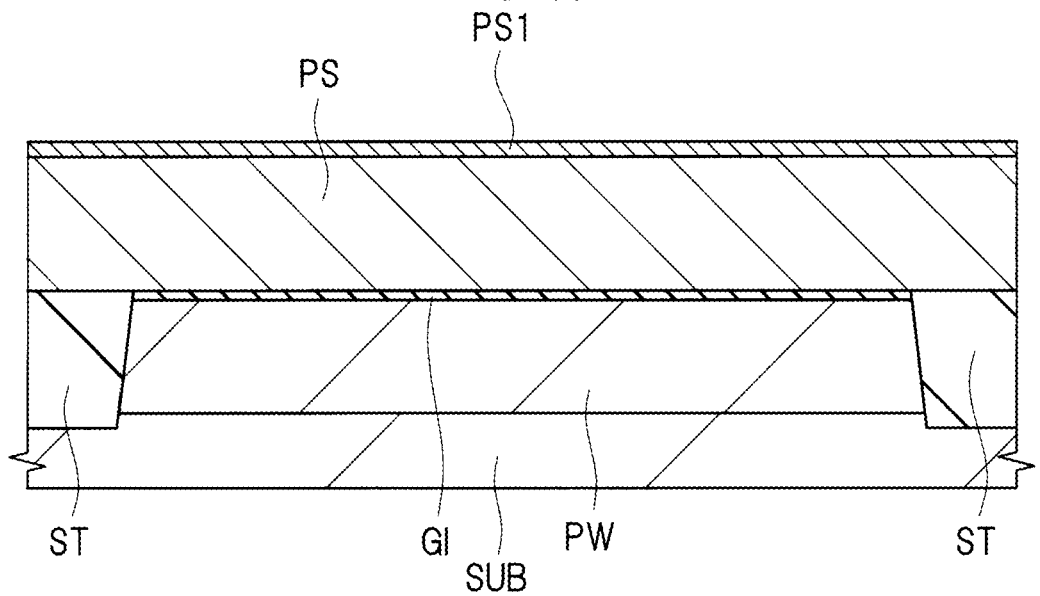

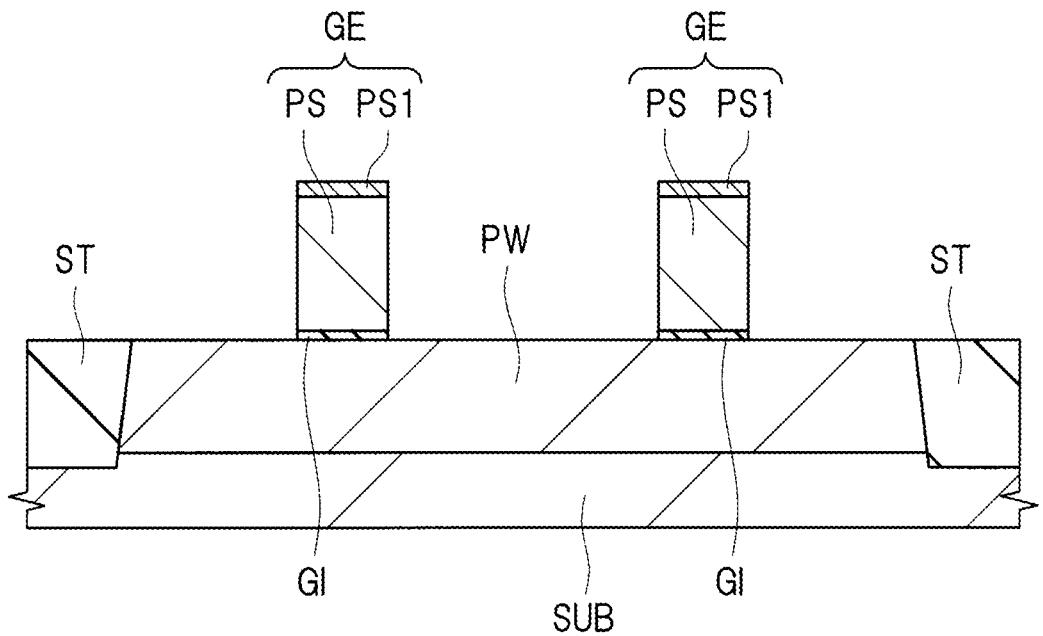
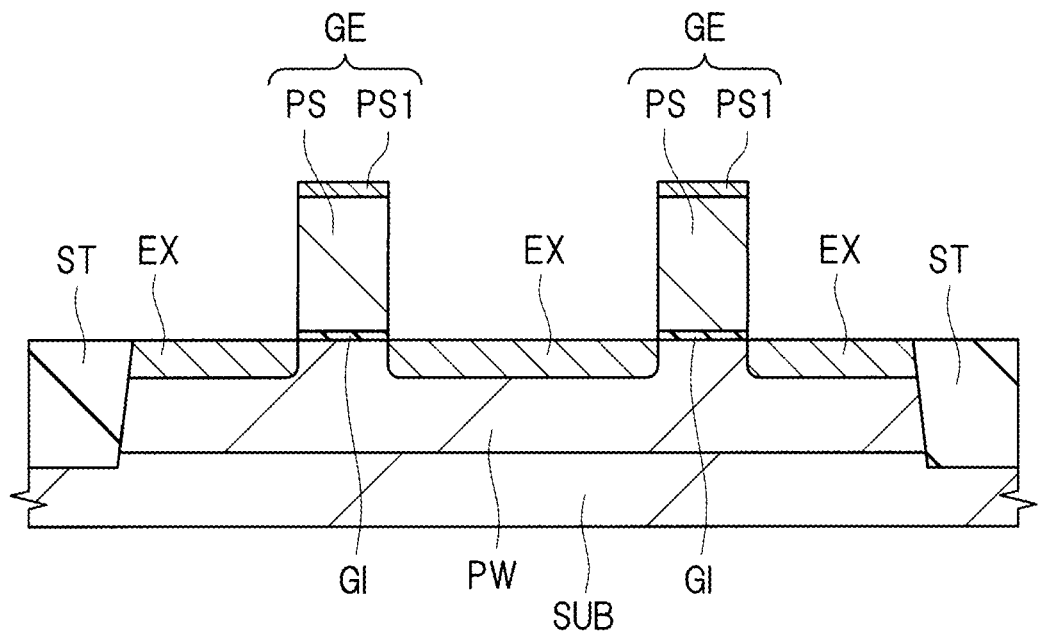

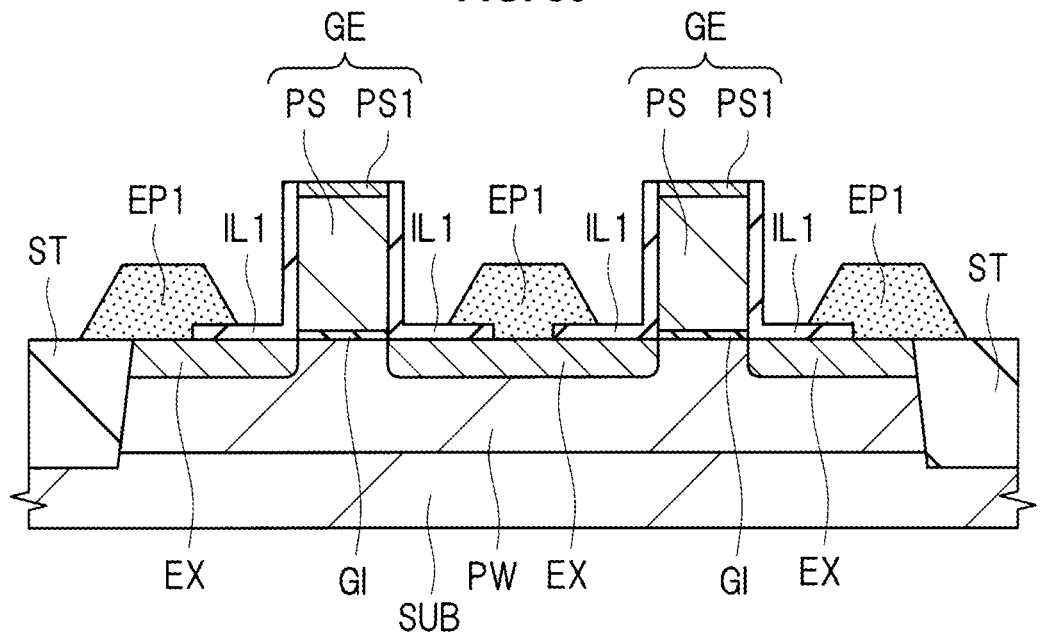
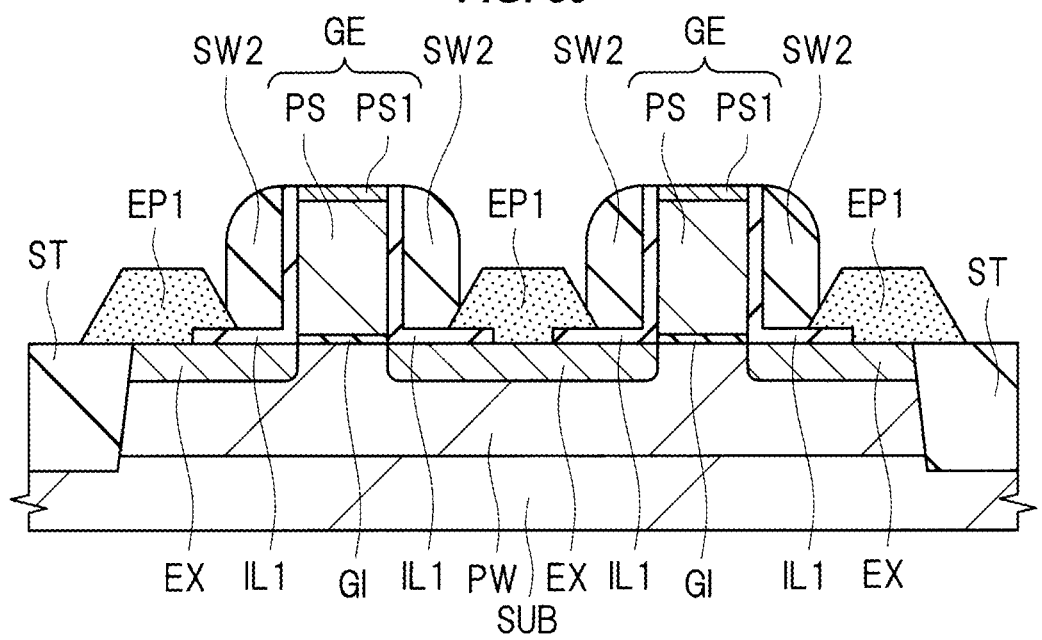

SEMICONDUCTOR DEVICE WITH EPITAXIAL SEMICONDUCTOR LAYER FOR SOURCE/DRAIN ON SUBSTRATE, AND METHOD OF MANUFACTURING THE SAME

CROSS-REFERENCE TO RELATED APPLICATION

The disclosure of Japanese Patent Application No. 2012-204838 filed on Sep. 18, 2012 including the specification, drawings and abstract is incorporated herein by reference in its entirety.

BACKGROUND

The present invention relates to a semiconductor device and a method of manufacturing the same, and can be favorably utilized, for example, for semiconductor devices including a MISFET and a method of manufacturing the same.

The MISFET is formed by forming a gate electrode over a semiconductor substrate via a gate insulating film, and forming source/drain regions over the substrate.

Further, there is a technique for forming the MISFET by growing an epitaxial layer for source/drain over a semiconductor substrate.

In Japanese Patent Laid-Open No. 1998-242464, a technique of raising regions to be source/drain diffusion layers by selective Si growth is described.

SUMMARY

Even in semiconductor devices in which a MISFET is formed by growing selectively an epitaxial layer over a semiconductor substrate, it is desired to improve performances as far as possible.

Other subjects and the new feature will become clear from the description of the present specification and the accompanying drawings.

According to an embodiment, a semiconductor device has a MISFET including a gate electrode formed over a semiconductor substrate via a gate insulating film, a first side wall insulating film extending from over the side wall of the gate electrode to over the semiconductor substrate, and a first epitaxial semiconductor layer formed over the semiconductor substrate in apart exposed from the first side wall insulating film. Further, apart of the first epitaxial semiconductor layer lies over the first side wall insulating film of the part extending over the semiconductor substrate.

Further, according to an embodiment, after forming a gate electrode over a semiconductor substrate via a gate insulating film, a stacked film having a first insulating film and a second insulating film over the first insulating film is formed, and, after that, the stacked film is etched back to form a first sidewall spacer over a side wall of the gate electrode. Then, after removing the second insulating film configuring the first sidewall spacer, a first semiconductor layer is grown epitaxially on the semiconductor substrate in a part exposed from the first insulating film. On this occasion, apart of the epitaxially grown first semiconductor layer runs on the first insulating film. After that, on the first semiconductor layer, a reacted layer of a metal and the first semiconductor layer is formed.

According to the embodiment, the performance of the semiconductor device can be improved.

BRIEF DESCRIPTION OF THE DRAWINGS

FIG. 12 is an essential part cross-sectional view in the process of manufacturing the semiconductor device following FIG. 11;

FIG. 13 is an essential part cross-sectional view in the process of manufacturing the semiconductor device following FIG. 12;

FIG. 32 is an essential part cross-sectional view in a manufacturing process of a semiconductor device of a Third Embodiment;

FIG. 33 is an essential part cross-sectional view in the process of manufacturing the semiconductor device following FIG. 32;

FIG. 34 is an essential part cross-sectional view in the process of manufacturing the semiconductor device following FIG. 33;

FIG. 35 is an essential part cross-sectional view in the process of manufacturing the semiconductor device following FIG. 34;

FIG. 38 is an essential part cross-sectional view in the process of manufacturing the semiconductor device following FIG. 37;

FIG. 39 is an essential part cross-sectional view in the process of manufacturing the semiconductor device following FIG. 38;

DETAILED DESCRIPTION

Figure 1:
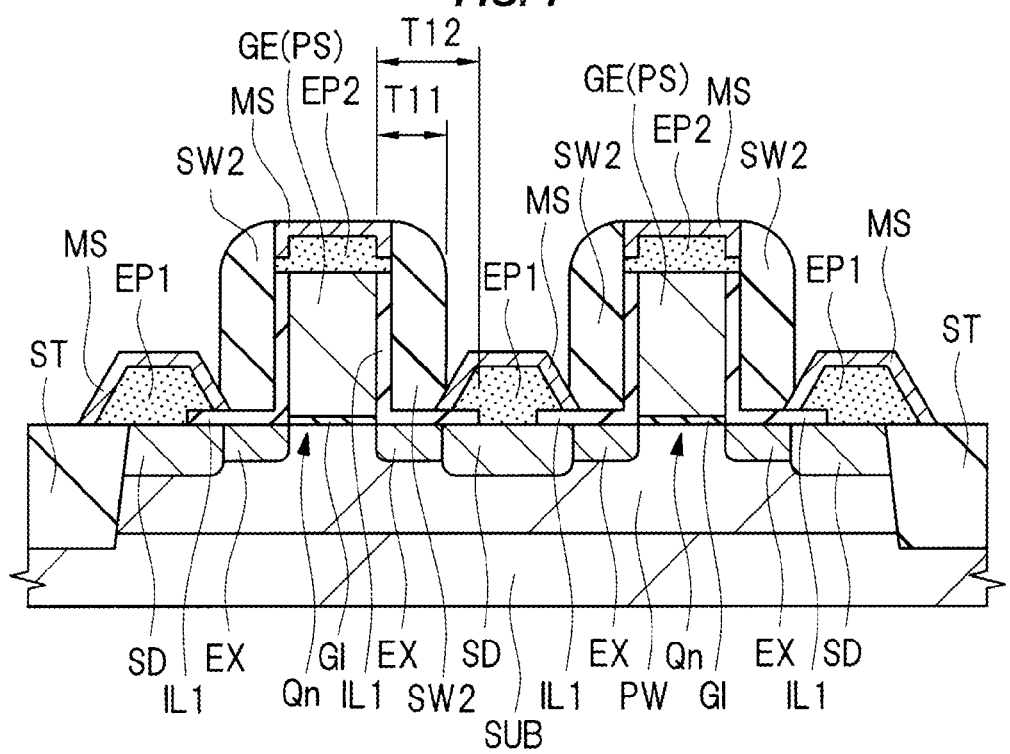
FIG. 1 is an essential part cross-sectional view of a semiconductor device of a First Embodiment.

The following embodiments will be explained, divided into plural sections or embodiments, if necessary for convenience. Except for the case where it shows clearly in particular, they are not mutually unrelated and one has relationships such as a modification, details, and supplementary explanation of some or entire of another. In the following embodiments, when referring to the number of elements and the like. (including the number, a numeric value, an amount, a range, and the like), they may be not restricted to the specific number but may be greater or smaller than the specific number, except for the case where they are clearly specified in particular and where they are clearly restricted to a specific number theoretically. Furthermore, in the following embodiments, it is needless to say that an element (including an element step and the like) is not necessarily indispensable, except for the case where it is clearly specified in particular and where it is considered to be clearly indispensable from a theoretical point of view or the like. Similarly, in the following embodiments, when shape, position relationship, or the like. of an element or the like are referred to, what resembles or is similar to the shape substantially shall be included, except for the case where it is clearly specified in particular and where it is considered to be clearly not right from a theoretical point of view. This statement also applies to the numeric value and range described above.

Hereinafter, embodiments will be explained in detail on the basis of the drawings. Meanwhile, in all the drawings for explaining embodiments, the same symbol is attached to the member having the same function, and the repeated explanation thereof is omitted. Furthermore, in the following embodiments, the explanation for the same or similar part is not repeated, as a principle, except for the case where it is necessary in particular.

In the drawings for use in embodiments, in order to make a drawing intelligible, hatching may be omitted even if it is a cross-sectional view. Further, in order to make a drawing intelligible, hatching may be attached even if it is a plan view.

(First Embodiment)

<About Structure of Semiconductor Device>

A semiconductor device of the present embodiment will be explained with reference to the drawings. FIG. 1 is an essential part cross-sectional view of the semiconductor device of the present embodiment.

As shown in FIG. 1, the semiconductor device of the present embodiment is a semiconductor device including a MISFET (Metal Insulator Semiconductor Field Effect Transistor).

Over a semiconductor substrate SUB configuring the semiconductor device, a plurality of MISFETs are formed, and, in FIG. 1, as representatives of these, two n-channel type MISFETs (Metal Insulator Semiconductor Field Effect Transistor: MIS-type Field Effect Transistor) Qn are shown. Meanwhile, in FIG. 1, the case, where two n-channel type MISFETs Qn (gate electrodes GE thereof) are adjacent to each other in the gate length direction while holding a source/drain region (an n+-type semiconductor region SD and a semiconductor layer EP1 over the n+-type semiconductor region SD) in common.

As shown in FIG. 1, the semiconductor substrate SUB including a p-type single crystalline silicon having, for example, a specific resistance of around 1 to 10 Ωcm has active regions defined and separated electrically from each other by an element isolation region ST made of an insulating body, and, in the active region of the semiconductor substrate SUB, a p-type well PW is formed. Over the surface of the p-type well PW, via an insulating film GI that functions as a gate insulating film of the n-channel type MISFET Qn, a gate electrode GE of the n-channel type MISFET Qn is formed.

The gate electrode GE includes an electroconductive film, and, in the present embodiment, includes a silicon film PS such as a polycrystalline silicon film (a polysilicon film, a doped polysilicon film). The silicon film PS has preferably been introduced with an impurity to give a low resistivity.

In the p-type well PW, as source and drain regions of an LDD (Lightly doped Drain) structure of the n-channel type MISFET Qn, an n−-type semiconductor region (an extension region, a source/drain extension region, an LDD region) EX and an n+-type semiconductor region (a source/drain region) SD having an impurity concentration higher than that in the region EX are formed. The n+-type semiconductor region SD has a deeper junction depth and a higher impurity concentration than the n−-type semiconductor region EX.

On the n+-type semiconductor region SD, a semiconductor layer EP1, which is an epitaxial layer (an epitaxially grown layer), is formed. Further, in the upper part of the silicon film PS configuring the gate electrode GE, a semiconductor layer EP2, which is an epitaxial layer (an epitaxially grown layer), is formed. The semiconductor layers EP1 and EP2 are epitaxial layers formed in the same process (the same epitaxial growth process), and the semiconductor layer EP1 and the semiconductor layer EP2 include the same kind of semiconductor material. The semiconductor layer EP1 is, for example, a Si (silicon) layer, and, when the semiconductor layer EP1 is a Si (silicon) layer, the semiconductor layer EP2 is also a Si (silicon) layer.

As the semiconductor layers EP1 and EP2, it is also possible to apply a semiconductor layer other than a Si (silicon) layer. For example, when the semiconductor layer EP1 is a SiGe (silicon germanium) layer, the semiconductor layer EP2 is also a SiGe (silicon germanium) layer, and, when the semiconductor layer EP1 is a Ge (germanium) layer, the semiconductor layer EP2 is also a Ge (germanium) layer.

The semiconductor layer EP1 is a single crystalline layer, because it grows on the semiconductor substrate SUB (specifically, on the semiconductor substrate SUB in a part that forms the n+-type semiconductor region SD) having a single crystal. On the other hand, the semiconductor layer EP2 becomes a single crystalline layer, or, while reflecting that it grows on the gate electrode GE having polycrystal (polycrystalline silicon), may become polycrystal.

The semiconductor layer EP1, with the n+-type semiconductor region SD on the lower side of the semiconductor layer EP1, functions as a semiconductor region for the source/drain of the n-channel type MISFET Qn, and, therefore, is introduced with an impurity (here, an n-type impurity) to have a low resistance. That is, the semiconductor layer EP1 has the same conductivity type as the n−-type semiconductor region EX and the n+-type semiconductor region SD (here the n type), and has a higher impurity concentration than the n−-type semiconductor region EX. Into the semiconductor layer EP2, too, an impurity (an impurity having the same conductivity type as the impurity introduced to the silicon film PS) is introduced to make the resistance low.

Over the side wall of the gate electrode GE, as a side wall insulating film, an insulating film (a side wall insulating film) IL1 is formed. The insulating film IL1 is formed continuously from over the side wall (the side face) of the gate electrode GE to over the surface of the semiconductor substrate SUB. However, the insulating film IL1 is not formed over the upper face of the gate electrode GE, and it is not formed over the whole surface of the semiconductor substrate SUB, but is formed in a region within a prescribed distance from the side wall of the gate electrode GE (a distance corresponding to a length T12 to be descried later) in the surface of the semiconductor substrate SUB. The insulating film IL1 extends from over the semiconductor substrate SUB to over the side wall of the gate electrode GE in an approximately even (uniform) thickness. That is, the insulating film IL1 extends from over the side wall of the gate electrode GE to over the semiconductor substrate SUB, and has a part extending along the side wall of the gate electrode GE over the side wall of the gate electrode GE, and a part extending within a prescribed distance (a distance corresponding to the distance T12 to be described later) over the main surface of the semiconductor substrate SUB along the main surface of the semiconductor substrate SUB.

In the p-type well PW, the n−-type semiconductor region EX is formed below the insulating film IL1 in a part extending over the semiconductor substrate SUB. The n−-type semiconductor region EX is formed in a self-alignment manner with the gate electrode GE. However, when the impurity in the n−-type semiconductor region EX diffuses also in a lateral direction (a gate length direction) by a heat treatment in the manufacturing process, a part of the n−-type semiconductor region EX overlaps the gate electrode GE in the plan view. That is, a part of the n−-type semiconductor region EX overlaps with a part of the gate electrode GE in the plan view.

In the p-type well PW, the n+-type semiconductor region SD is formed in a position separated from the channel region of the n-channel type MISFET Qn to an extent of the n−-type semiconductor region EX, so as to be in contact with (in adjacent to) the n−-type semiconductor region EX. That is, the n−-type semiconductor region EX is formed between the n+-type semiconductor region SD and the channel region. Meanwhile, the channel region of the n-channel type MISFET Qn is formed in the substrate region directly below the gate electrode GE (the semiconductor substrate SUB in a part in adjacent to the insulating film GI (close in the thickness direction of the semiconductor substrate SUB) directly below the gate electrode GE).

As to the n−-type semiconductor region EX, approximately the whole thereof is covered with the insulating film IL1, and is not exposed from the insulating film IL1. On the other hand, as to the n+-type semiconductor region SD, at least a part thereof is not covered with the insulating film IL1 (that is, it does not overlap the insulating film IL1 in the plan view) and there is an exposed face exposed from the insulating film IL1, and, on the exposed face, the semiconductor layer EP1 is grown epitaxially.

The n+-type semiconductor region SD is formed in a self-alignment manner with the end part of the insulating film IL1 extending over the semiconductor substrate SUB, but when the impurity diffuses also in the lateral direction (the gate length direction) by a heat treatment in the manufacturing process, a part of the n⁺-type semiconductor region SD overlaps the insulating film IL1 in the part extending over the semiconductor substrate SUB. That is, apart of the n⁺-type semiconductor region SD overlaps a part of the insulating film IL1 in the plan view.

The semiconductor layer EP1 is formed on the exposed face of the semiconductor substrate SUB in the part not covered with the insulating film IL1 (here, an exposed face of the n⁺-type semiconductor region SD), but, as the result of the growth also in lateral direction (the direction parallel to the gate length direction of the n-channel type MISFET Qn) in the epitaxial growth of the semiconductor layer EP1, a part of the semiconductor layer EP1 runs on the insulating film IL1. That is, in the gate length direction (the gate length direction of the gate electrode GE of the n-channel type MISFET Qn), an end part of the semiconductor layer EP1 (the end part of the side facing the gate electrode GE) runs over (is located over) the insulating film IL1. In other words, the semiconductor layer EP1 is formed on the upper face of the n⁺-type semiconductor region SD not covered with but exposed from the insulating film IL1, and is in the state where a part (a part of the semiconductor layer EP1) extends over the insulating film IL1. That is, the whole upper face of the n⁺-type semiconductor region SD not covered with but exposed from the insulating film IL1 is in contact with the semiconductor layer EP1, and a part of the semiconductor layer EP1 lies over the insulating film IL and is in contact with the insulating film IL1.

When the n⁺-type semiconductor region SD is in adjacent to the element isolation region ST, the semiconductor layer EP1 is formed on the upper face of the n⁺-type semiconductor region SD not covered with but exposed from the insulating film IL1, and is, at the same time, in the state where a part thereof runs over the insulating film IL1 and another part runs over the element isolation region ST. That is, in the gate length direction (the gate length direction of the gate electrode GE of the n-channel type MISFET Qn), there is such a state that one end part (the end part on the side facing the gate electrode GE) of the semiconductor layer EP1 runs (is located) over the insulating film IL1 and another end part runs (is located) over the element isolation region ST.

The semiconductor layer EP1 is adjacent to the n⁺-type semiconductor region SD (adjacent in the thickness direction of the semiconductor substrate SUB), the n⁺-type semiconductor region SD is adjacent to the n⁻-type semiconductor region EX (adjacent in the gate length direction of the gate electrode GE), and the n⁻-type semiconductor region EX is adjacent to the channel region of the n-channel type MISFET Qn (adjacent in the gate length direction of the gate electrode GE, that is, in the channel length direction). Further, between the n⁺-type semiconductor region SD and the channel region, the n⁻-type semiconductor region EX is interposed, and, between the semiconductor layer EP1 and the n⁻-type semiconductor region EX, the n⁺-type semiconductor region SD is interposed. Since the n⁻-type semiconductor region EX adjacent to the channel region has an impurity concentration lower than those in the n⁺-type semiconductor region SD and the semiconductor layer EP1, the n⁻-type semiconductor region EX, the n⁺-type semiconductor region SD adjacent to the region EX and the semiconductor layer EP1 adjacent to the region SD function as a semiconductor region for a source or drain having an LDD (Lightly doped Drain) structure of the n-channel type MISFET Qn.

On surfaces (upper faces) of the semiconductor layers EP1 and EP2, a metal compound layer, which is a compound layer (a reacted layer) of a metal and an element configuring the semiconductor layers EP1 and EP2, here a metal silicide layer MS is formed. When the semiconductor layers EP1 and EP2 are silicon (Si) layers, the metal silicide layer MS is formed on surfaces (upper faces) of the semiconductor layers EP1 and EP2, and, when the semiconductor layers EP1 and EP2 are SiGe (silicon germanium) layers, in place of the metal silicide layer MS, a metal silicon germanide layer is formed. When the semiconductor layers EP1 and EP2 are Ge (germanium) layers, in place of the metal silicide layer MS, a metal germanide layer is formed.

Over the side wall of the gate electrode GE, a sidewall spacer (a side wall insulating film) SW2 having an insulating film is formed with the insulating film IL1 interposed.

The sidewall spacer SW2 does not contact with the gate electrode GE (the side wall thereof), but, between the sidewall spacer SW2 and the gate electrode GE (the side wall thereof), the insulating film IL1 is interposed. Further, the sidewall spacer SW2 does not contact with a substrate region (a Si substrate region) of the semiconductor substrate SUB, but, between the sidewall spacer SW2 and the semiconductor substrate SUB, the insulating film IL1 is interposed. After the formation of the semiconductor layer EP1, the sidewall spacer SW2 is formed, and, preferably, a part of the sidewall spacer SW2 runs over the semiconductor layer EP1.

A total thickness (dimension) T11 of the insulating film IL1 and the sidewall spacer SW2 formed over the side wall of the gate electrode GE is smaller than the length (dimension, distance) T12 of the part of the insulating film IL1 extending over the semiconductor substrate SUB (that is, T11<T12). The total thickness (dimension) T11 of the insulating film IL1 and the sidewall spacer SW2 formed over the side wall of the gate electrode GE corresponds to the thickness (dimension) in the direction along the gate length direction (which corresponds to the gate length direction of the gate electrode GE over the side wall of which the sidewall spacer SW2 is formed). The length (dimension, distance) T12 of the insulating film IL1 in the part extending over the semiconductor substrate SUB corresponds to the length (dimension, distance) in the direction along the gate length direction (which corresponds to the gate length direction of the gate electrode GE over the side wall of which the insulating film IL1 is formed). Consequently, the measuring direction of the thickness T11 is the same as the measuring direction of the length T12 (each is the gate length direction).

Consequently, in the insulating film IL1 in the part extending over the semiconductor substrate SUB, a side adjacent to the gate electrode GE is covered with the sidewall spacer SW2, but vicinity of an end part on the opposite side is not covered with the sidewall spacer SW2. That is, the insulating film IL1 extends over both regions of a region between the semiconductor substrate SUB (the n--type semiconductor region EX) and the sidewall spacer SW2, and a region between the gate electrode GE and the sidewall spacer SW2, and, furthermore, extends even to an region outside the sidewall spacer SW2 (a region not covered with the sidewall spacer SW2).

In addition, an insulating film IL3, a contact hole CNT, a plug PG, an insulating film IL4 and a wiring M1 to be described later are formed, but, here, illustration and explanation thereof are omitted.

<About Manufacturing Process of Semiconductor Device>

Figure 2:
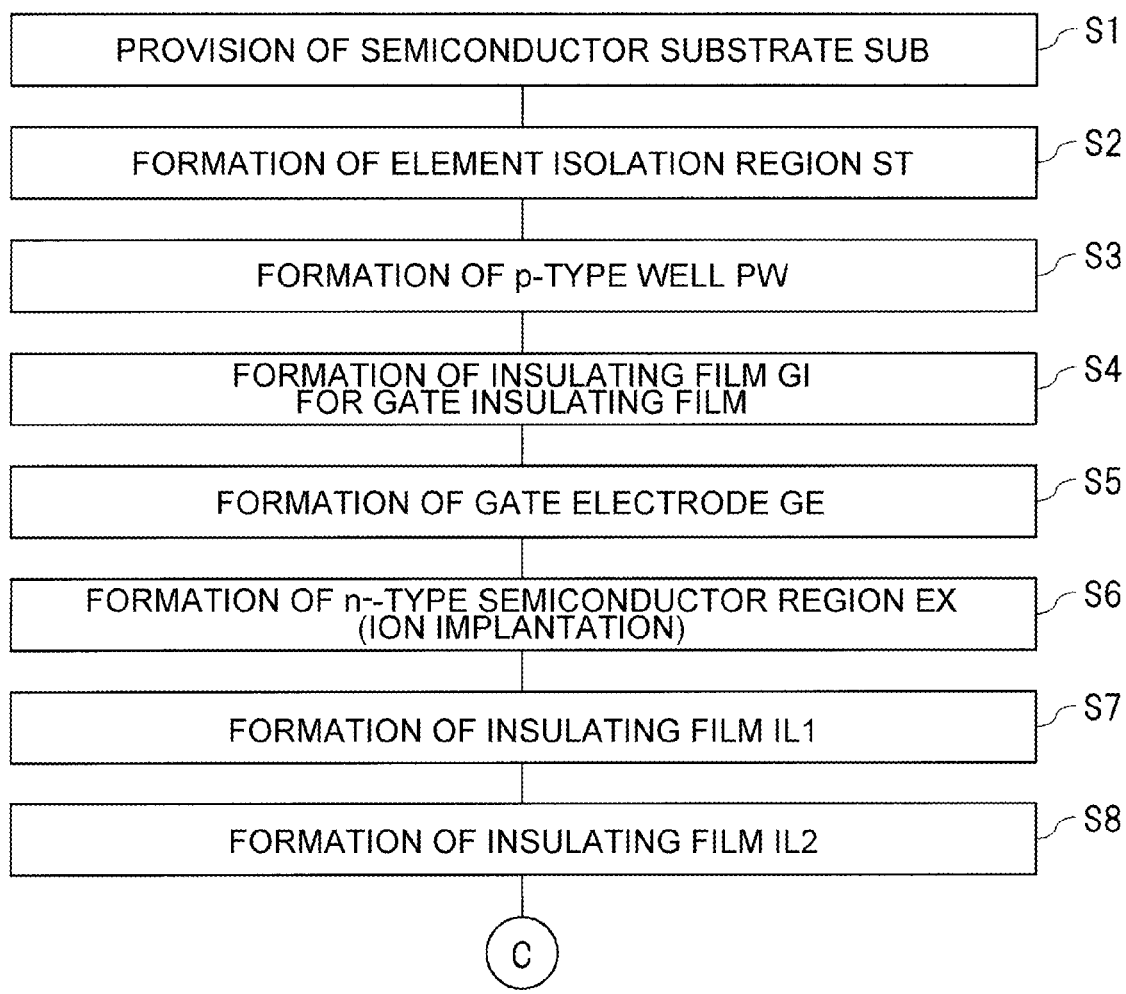
FIG. 2 is a process flow chart showing a process of manufacturing the semiconductor device of the First Embodiment.
Figure 3:
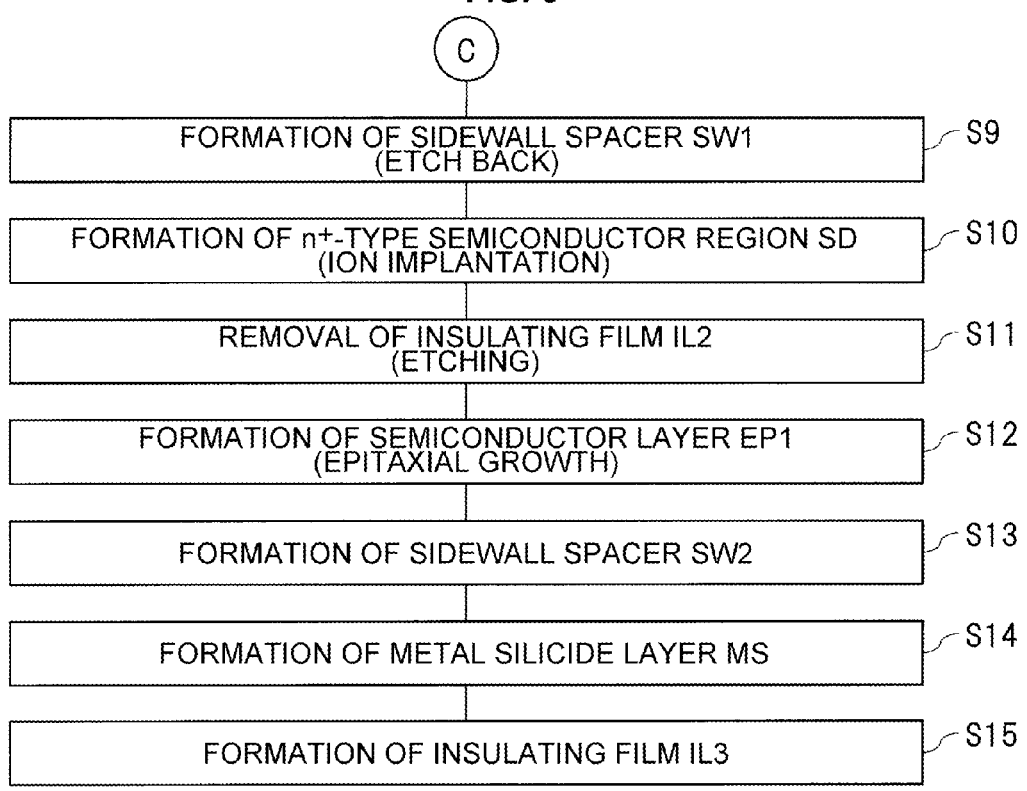
FIG. 3 is a process flow chart showing the process of manufacturing the semiconductor device of the First Embodiment.

A process of manufacturing a semiconductor device of the present embodiment will be explained with reference to the drawings. FIGS. 2 and 3 are process flowcharts showing the process of manufacturing a semiconductor device of the present embodiment. FIGS. 4 to 21 are essential part cross-sectional views in the process of manufacturing a semiconductor device of the present embodiment, which show cross-sections corresponding to that in FIG. 1.

Figure 4:
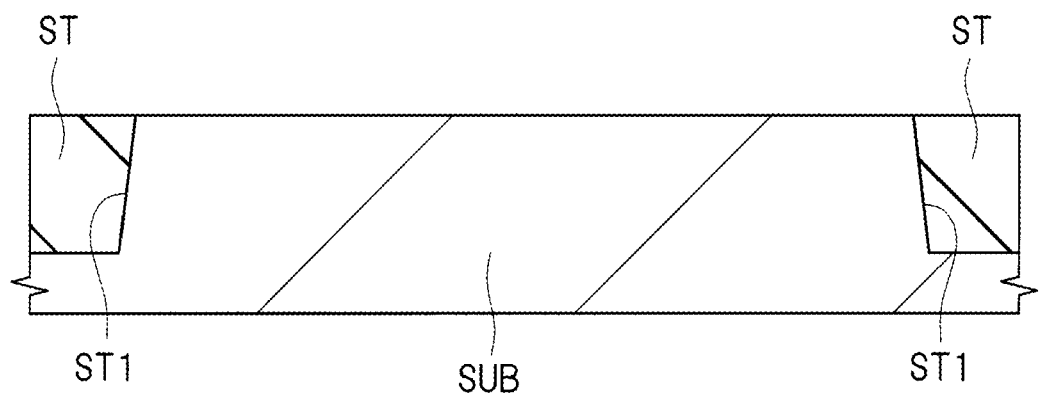
FIG. 4 is an essential part cross-sectional view in the process of manufacturing the semiconductor device of the First Embodiment.

As shown in FIG. 4, first, for example, a semiconductor substrate (a semiconductor wafer) SUB including p-type single crystalline silicon having a specific resistance of around 1 to 10 Ωcm is provided (prepared) (Step S1 in FIG. 2).

Next, in the main surface of the semiconductor substrate SUB, an element isolation region (an inter-element separation and insulation region) ST defining (demarcating) an active region is formed (Step S2 in FIG. 2).

The element isolation region ST includes an insulating body such as silicon oxide, and is formed, for example, by an STI (Shallow Trench Isolation) method. For example, after forming an element isolation trench (a trench for isolating elements) ST1 in the main surface of the semiconductor substrate SUB using a photolithographic technique, dry etching technique or the like, by embedding an insulating film (for example, a silicon oxide film) into the element isolation trench ST1 using a deposition technique, a CMP technique or the like, the element isolation region ST including an insulating film embedded in the element isolation trench ST1 can be formed. In the semiconductor substrate SUB, in the active region defined by the element isolation region ST, a MISFET is formed as will be explained below.

Figure 5:
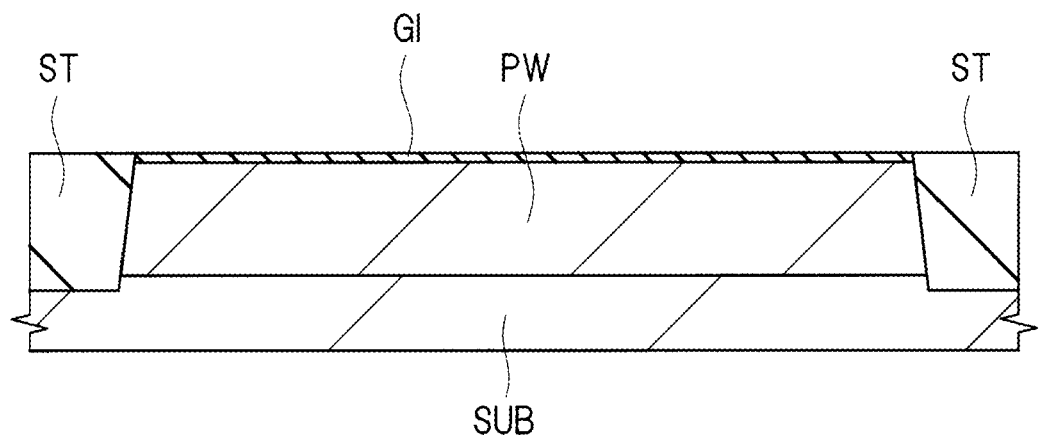
FIG. 5 is an essential part cross-sectional view in the process of manufacturing the semiconductor device following FIG. 4.

Next, as shown in FIG. 5, in the semiconductor substrate SUB in a region in which the formation of the n-channel type MISFET is planned, a p-type well (a p-type semiconductor region) PW is formed over a prescribed depth from the main surface of the semiconductor substrate SUB (Step S3 in FIG. 2). The p-type well PW can be formed by ion-implanting a p-type impurity (for example, boron) into the semiconductor substrate SUB, and the like.

Next, for example, by wet etching using an aqueous hydrofluoric acid (HF) solution, or the like, the surface of the semiconductor substrate SUB is cleansed (cleaned), and, after that, over the surface (the main surface) of the semiconductor substrate SUB, the insulating film GI for a gate insulating film is formed (Step S4 in FIG. 2). The insulating film GI includes, for example, a thin silicon oxide film or the like, and, can be formed, for example, by a thermal oxidation method or the like. The insulating film GI may be a silicon nitride oxide film In this case, a silicon nitride oxide film may be formed, for example, by RTO (Rapid Thermal Oxidation) and RTN (Rapid Thermal Nitridation).

Next, the gate electrode GE is formed (Step S5 in FIG. 2). The gate electrode GE can be formed according to the following way (FIGS. 6 and 7).

Figure 6:
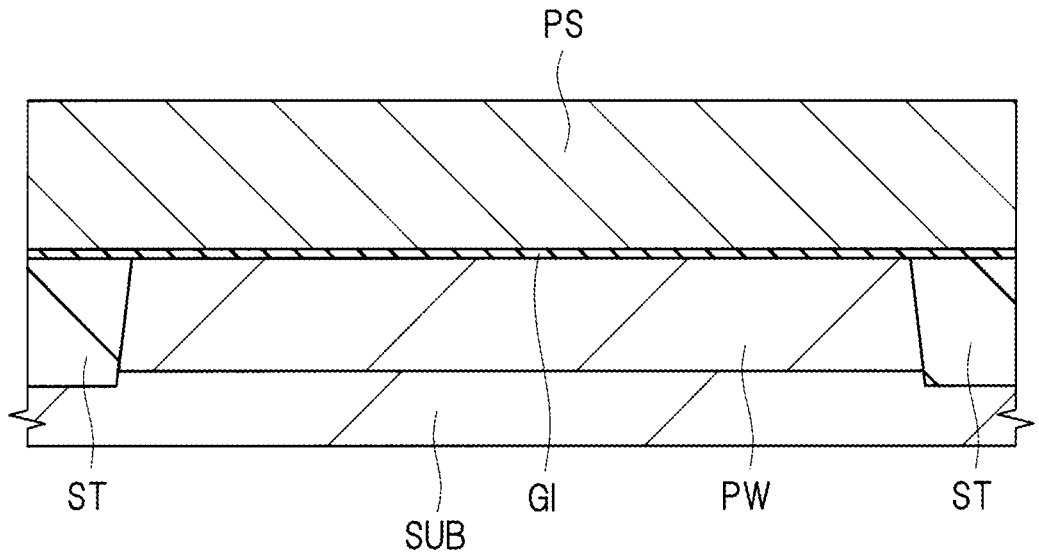
FIG. 6 is an essential part cross-sectional view in the process of manufacturing the semiconductor device following FIG. 5.

First, as shown in FIG. 6, over the whole main surface of the semiconductor substrate SUB (that is, over the insulating film GI), a silicon film PS such as a polycrystalline silicon (polysilicon) film is formed as an electroconductive film for forming a gate electrode. It is preferable to make the silicon film PS, by introducing an impurity in deposition or after deposition, be a semiconductor film having a low resistivity (a doped polysilicon film).

Figure 7:
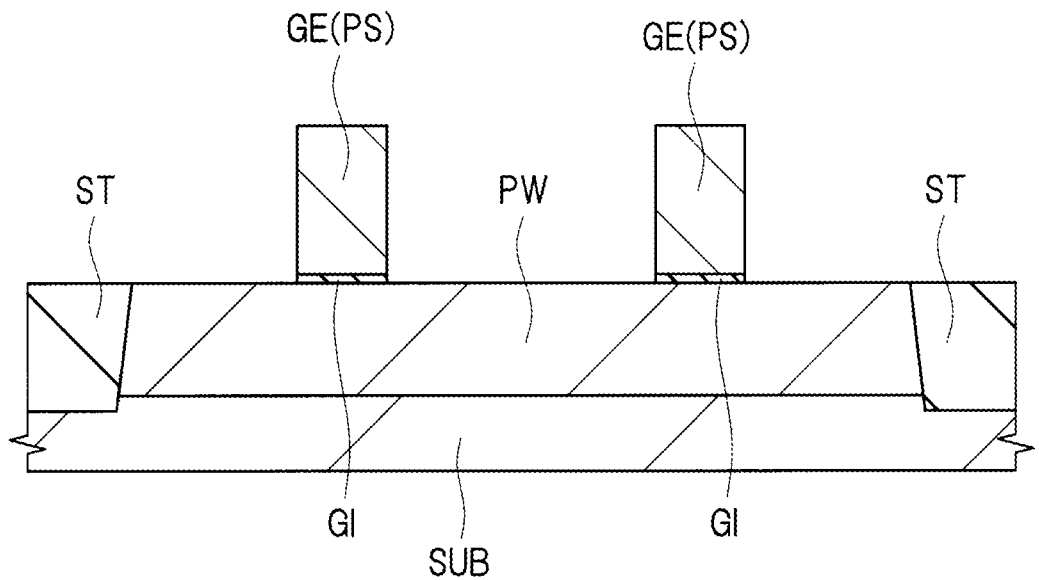
FIG. 7 is an essential part cross-sectional view in the process of manufacturing the semiconductor device following FIG. 6.
Figure 8:
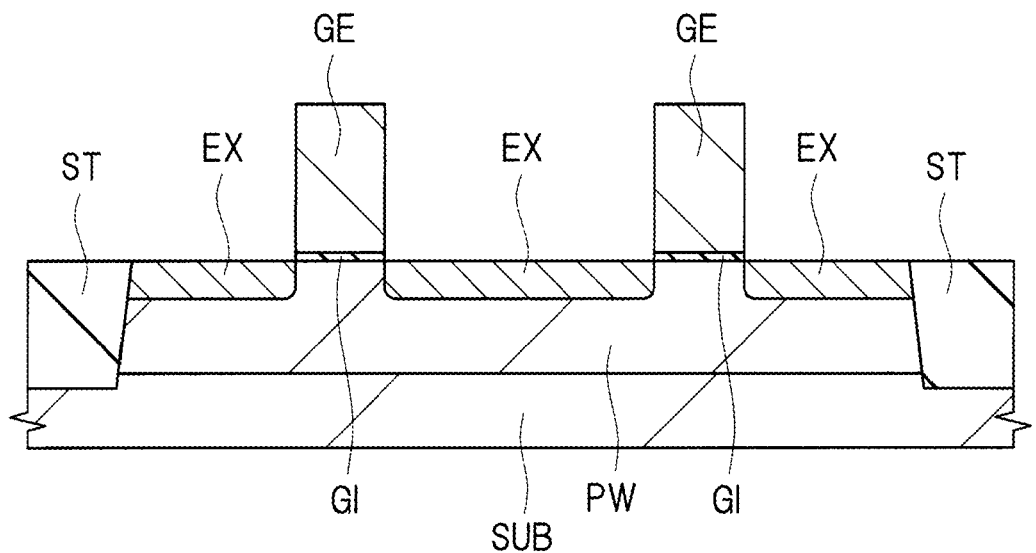
FIG. 8 is an essential part cross-sectional view in the process of manufacturing the semiconductor device following FIG. 7.

Then, by patterning the silicon film PS using a photolithographic method and a dry etching method, as shown in FIG. 7, it is possible to form the gate electrode GE. In this case, the gate electrode GE is made of the patterned silicon film PS.

The silicon film PS that was an amorphous silicon film at deposition may be changed into a polycrystalline silicon film by a heat treatment after the deposition. As another mode, in place of the silicon film PS, a film of another semiconductor material, for example, a silicon germanium (SiGe) film may also be used.

In FIG. 7, the case, where a part of the insulating film GI, which is not covered with the gate electrode GE, has been removed in the etching process for forming the gate electrode GE, is shown, in which the insulating film GI remains below the gate electrode GE. As another mode, it is also possible to make the part of the insulating film GI, which is not covered with the gate electrode GE, be left, in addition to the part of the insulating film GI, which is covered with the gate electrode GE, in the etching process for forming the gate electrode GE. This case makes it easy to suppress or prevent substrate damage brought about by the etching. It is also possible to pattern the silicon film PS by dry etching and, after that, to remove the part of the insulating film GI, which is not covered with the gate electrode GE, by wet etching.

The insulating film GI remaining below the gate electrode GE becomes the gate insulating film of the MISFET, and the gate electrode GE becomes the gate electrode of the MISFET. The gate electrode GE is formed over the semiconductor substrate SUB (the p-type well PW) via the insulating film GI as the gate insulating film. That is, the gate electrode GE is formed over the gate insulating film (the insulating film GI) formed over the semiconductor substrate SUB.

Next, in regions on both sides of the gate electrode GE of the semiconductor substrate SUB (the p-type well PW) in a region in which the formation of the n-channel type MISFET is planned, an $n^-$-type semiconductor region (an extension region, source/drain extension region, LDD region) EX is formed by ion-implanting an n-type impurity (a dopant) such as phosphorous (P) or arsenic (As) (Step S6 in FIG. 2).

In the ion implantation for forming the $n^-$-type semiconductor region EX, the gate electrode GE functions as a mask (an ion implantation-blocking mask) and ions are implanted into the semiconductor substrate SUB (the p-type well PW) in the region in which the formation of an n-channel type MISFET is planned. Consequently, into the region directly below the gate electrode GE in the p-type well PW, the implantation of impurity ions is prevented by being shielded by the gate electrode GE. Consequently, the $n^-$-type semiconductor region EX is formed in a self-alignment manner for the side wall (the side face) of the gate electrode GE in the semiconductor substrate SUB (the p-type well PW).

Furthermore, if necessary, it is also possible to form an offset spacer (a side wall insulating film for offset), prior to the ion implantation in Step S6, over the side wall of the gate electrode GE and, after that, to perform the ion implantation in Step S6 to form the $n^-$-type semiconductor region EX.

In addition, after the ion implantation for forming the $n^-$-type semiconductor region EX, a heat treatment (an annealing treatment) for activation of the introduced impurity (and removal of implantation damage) and the like may be performed. The introduced impurity may be diffused by the heat treatment.

In the present embodiment, after forming the gate electrode GE in Step S5 and before Step S7 (a process of forming the insulating film IL1) to be described later, Step S6 (the process of forming the $n^-$-type semiconductor region EX) is performed. As another mode, Step S6 (the process of forming $n^-$-type semiconductor region EX) may also be performed after Step S11 (a process of removing the insulating film IL2) to be described later and before Step S12 (a process of forming the semiconductor layer EP1) to be described later. When performing Step S6 after Step S11 to be described later and before Step S12 to be described later, in the ion implantation for forming the $n^-$-type semiconductor region EX in Step S6, ions are to be implanted into the semiconductor substrate SUB (the p-type well PW) in the region in which the formation of the n-channel type MISFET is planned, using the gate electrode GE and the insulating film IL1 to be described later as a mask (an ion implantation-blocking mask).

Figure 9:
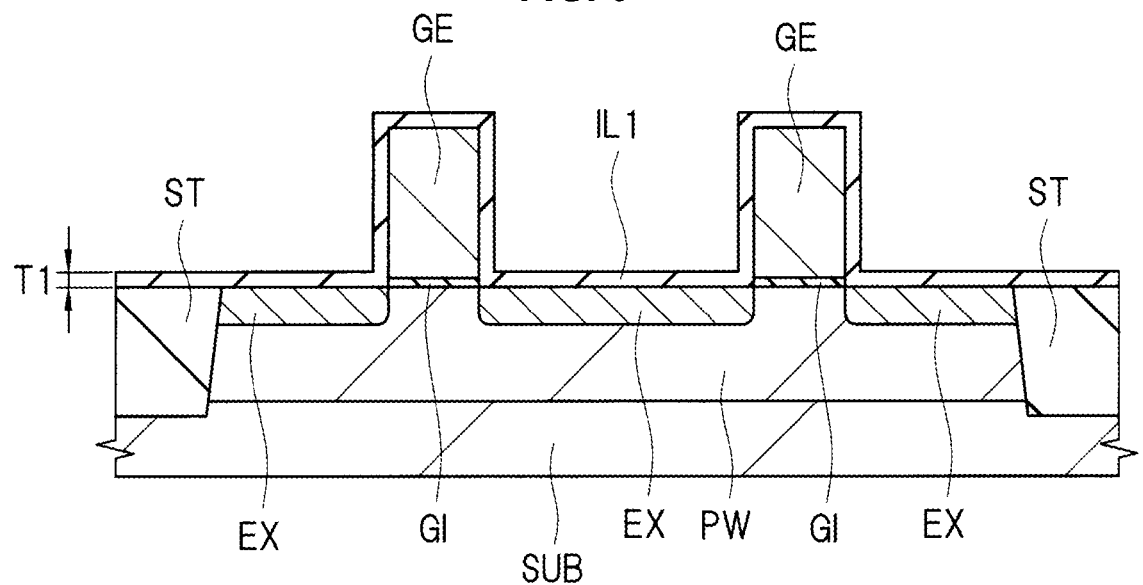
FIG. 9 is an essential part cross-sectional view in the process of manufacturing the semiconductor device following FIG. 8.
Figure 10:
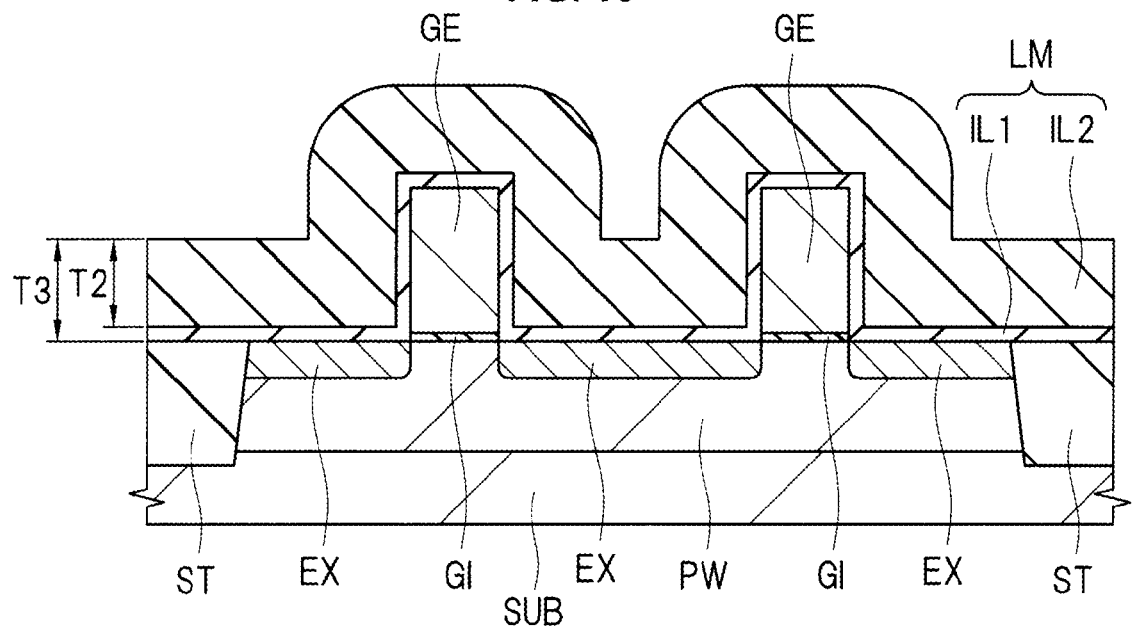
FIG. 10 is an essential part cross-sectional view in the process of manufacturing the semiconductor device following FIG. 9.

Next, as shown in FIG. 9, over the main surface (the whole main surface) of the semiconductor substrate SUB, the insulating film IL1 is formed so as to cover the gate electrode GE (Step S7 in FIG. 2). Then, as shown in FIG. 10, over the main surface (the whole main surface) of the semiconductor substrate SUB, that is, over the insulating film IL1, the insulating film IL2 is formed (Step S8 in FIG. 2). By performing Steps S7 and S8, the state, in which a stacked film LM of the insulating film IL1 and the insulating film IL2 over the insulating film IL1 is formed over the main surface of the semiconductor substrate SUB so as to cover the gate electrode GE, is brought about.

The insulating film IL1 and the insulating film IL2 contain different materials each other. Preferably, the insulating film IL1 has a silicon nitride film, and the insulating film IL2 has a silicon oxide film. As another mode, it is also possible to use a silicon oxide film as the insulating film IL1, and to use a silicon nitride film as the insulating film IL2.

The insulating films IL1 and IL2 can be formed, for example, by a CVD (Chemical Vapor Deposition) method, an ALD (Atomic layer Deposition) method, or the like. When using a silicon oxide film as the insulating film IL2, for example, it can be deposited by such a technique as a CVD method using an organic silane-based gas or a silane-based gas (for example, reduced pressure CVD or plasma CVD), an ALD method, or the like. Preferably, thickness (formed film thickness) T2 of the insulating film IL2 is larger than thickness (formed film thickness) T1 of the insulating film IL1 (that is, T2>T1). The thickness (formed film thickness) T1 of the insulating film IL1 may be set to be, for example, around 10 to 20 nm, and the thickness (formed film thickness) T2 of the insulating film IL2 may be set to be, for example, around 20 to 50 nm.

Further, since thickness T4 of a sidewall spacer SW1 to be formed later becomes one corresponding to thickness T3 of the stacked film LM (T4≈T3), by the thickness T3 of the stacked film LM, distance by which the $n^+$-type semiconductor region SD to be formed later is separated from an end part of the gate electrode GE (an end part in the gate length direction) can be controlled. Here, the thickness T3 of the stacked film LM corresponds to the total of the thickness T1 of the insulating film IL1 and the thickness T2 of the insulating film IL2 (that is, T3=T1+T2). Further, the thickness T4 of the sidewall spacer SW1 (the thickness T4 is shown in FIG. 11 to be described later) corresponds to thickness (dimension) in the direction along the gate length direction (which corresponds to the gate length direction of the gate electrode GE over the side wall over which the sidewall spacer SW1 is formed).

Figure 11:
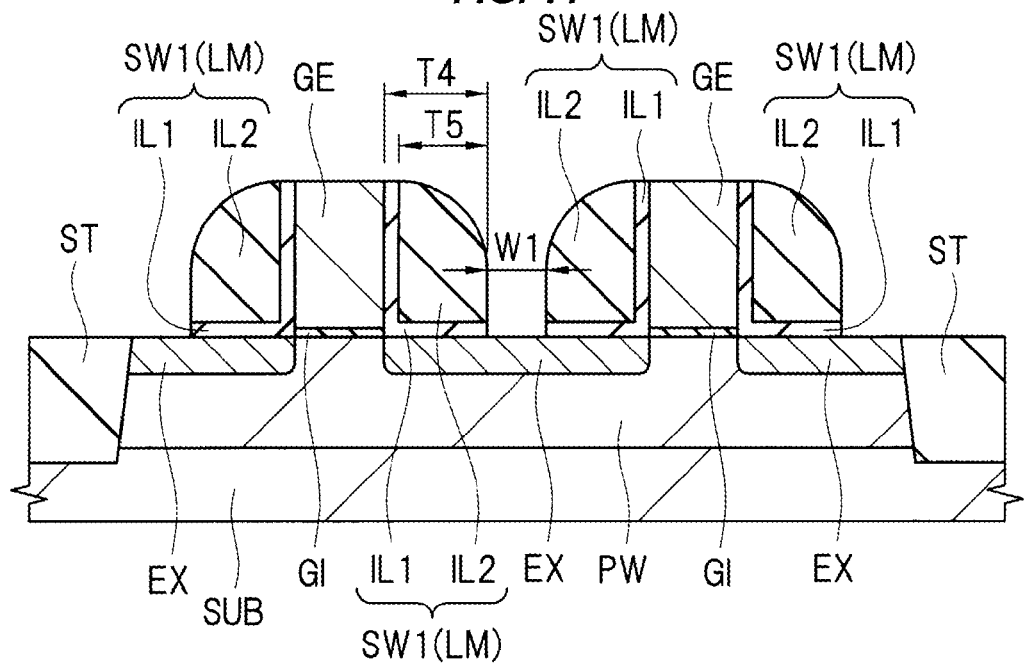
FIG. 11 is an essential part cross-sectional view in the process of manufacturing the semiconductor device following FIG. 10.

Next, as shown in FIG. 11, by etching back (etching, dry etching, anisotropically etching) the stacked film LM (the stacked film LM of the insulating film IL1 and the insulating film IL2) by an anisotropic etching technique, the sidewall spacer (the sidewall, side wall insulating film) SW1 is formed over both side walls of the gate electrode GE (Step S9 in FIG. 3).

In the etch back process in Step S9, by anisotropically etching (etching back) the stacked film LM (the stacked film LM of the insulating film IL1 and the insulating film IL2) by an amount of the deposited thickness of the stacked film LM, the stacked film LM is left over both side walls (side faces) of the gate electrode GE to form the sidewall spacer SW1, and the stacked film LM in other regions is removed. Consequently, as shown in FIG. 11, by the remaining stacked film LM over both side walls of the gate electrode GE, the sidewall spacer SW1 is formed.

When a silicon oxide film is used as the insulating film IL2 and a silicon nitride film is used as the insulating film IL1, as to conditions of the dry etching of the etch back process in Step S9, such conditions can be exemplified, as an example, that a mixed gas of $CF_4$, $CHF_3$, $CH_2F_2$, Ar, He, $O_2$ etc. is used, and that pressure is from 5 to 200 mT and power is from 200 to 1000 W in an upper part and from 20 to 300 W in a lower part.

The sidewall spacer SW1 has the stacked film LM of the insulating film IL1 and the insulating film IL2 over the insulating film IL1. Specifically, the sidewall spacer SW1 has the insulating film IL1 extending continuously from over the semiconductor substrate SUB to over the side wall of the gate electrode GE, and the insulating film IL2 separated from the semiconductor substrate SUB and the gate electrode GE via the insulating film IL1.

The insulating film IL1 configuring the sidewall spacer SW1 extends from over the semiconductor substrate SUB to over the side wall of the gate electrode GE in an approximately even (uniform) thickness. The insulating film IL2 configuring the sidewall spacer SW1 is separated from the semiconductor substrate SUB and the gate electrode GE by an amount of the insulating film IL1. That is, between the insulating film IL2 configuring the sidewall spacer SW1 and the semiconductor substrate SUB, and between the insulating film IL2 configuring the sidewall spacer SW1 and the gate electrode GE, the insulating film IL1 configuring the sidewall spacer SW1 is interposed.

Next, as shown in FIG. 12, by ion-implanting an n-type impurity (dopant) such as phosphorous (P) or arsenic (As) into regions on both sides of the gate electrode GE and sidewall spacer SW1 of the semiconductor substrate SUB (the p-type well PW), the $n^+$-type semiconductor region (the source/drain region) SD is formed (Step S10 in FIG. 3).

In the ion implantation for forming the $n^+$-type semiconductor region SD, ions are implanted into the semiconductor substrate SUB (the p-type well PW) in a region in which the formation of the n-channel type MISFET is planned, with the gate electrode GE and the sidewall spacer SW1 over the side wall thereof that function as a mask (an ion implantation-blocking mask). Therefore, into the region directly below the gate electrode GE and the sidewall spacer SW1 in the p-type well PW, the implantation of ions is prevented by being shielded with the gate electrode GE and the sidewall spacer SW1. Consequently, the $n^+$-type semiconductor region SD is formed in a self-alignment manner for a side face of the side wall SW1 (the side face opposite to the side adjacent to the gate electrode GE) over the side wall of the gate electrode GE, in the semiconductor substrate SUB (the p-type well PW).

After the ion implantation for forming the $n^+$-type semiconductor region SD, a heat treatment (an annealing treatment) for activating the introduced impurity (and removing implantation damage) or the like may also be performed.

In ion implantation, occasionally, an impurity (a dopant) may spread also in lateral directions, and, when performing a heat treatment after the ion implantation, the impurity (the dopant) furthermore diffuses in lateral directions. Consequently, a part of the $n^+$-type semiconductor region SD may intrude (extend) under the sidewall spacer SW1 (in FIG. 13, the state is shown).

The $n^+$-type semiconductor region SD has an impurity concentration higher than that in the $n^-$-type semiconductor region EX. Further, the $n^+$-type semiconductor region SD has a junction depth deeper than that in the $n^-$-type semiconductor region EX. A lower part region of the gate electrode GE in the semiconductor substrate SUB becomes a region in which a channel of the MISFET is to be formed (a channel-forming region). In the semiconductor substrate SUB, in regions separated from each other with the channel-forming region interposed, the $n^-$-type semiconductor region EX is formed, and, on the outside of the $n^-$-type semiconductor region EX (the side in a greater distance from the channel-forming region), the $n^+$-type semiconductor region SD is formed. That is, the $n^-$-type semiconductor region EX is adjacent to the channel-forming region, and the $n^+$-type semiconductor region SD is formed in a position which is separated from the channel-forming region by an amount of the $n^-$-type semiconductor region EX (separated in the channel length direction) and is adjacent to the $n^-$-type semiconductor region EX.

Meanwhile, in the present embodiment, the sidewall spacer SW1 functions as the ion implantation-blocking mask when performing the ion implantation for forming the $n^+$-type semiconductor region SD (the ion implantation in Step S10). On the other hand, in the case where $n^+$-type semiconductor region SD is not formed (Step S10 is not performed) as in a Third Embodiment to be described later, the sidewall spacer SW1 does not function as an ion implantation-blocking mask, and is a dummy (pseudo) sidewall spacer. In this case, the sidewall spacer SW1 is used for obtaining a structure in which the insulating film IL1 is formed from over the side wall (the side face) of the gate electrode GE to over the surface of the semiconductor substrate SUB (the structure of the insulating film IL1 in the step where the insulating film IL2 configuring the sidewall spacer SW1 has been removed in Step S11 to be described later).

Next, as shown in FIG. 13, the insulating film IL2 configuring the sidewall spacer SW1 is removed by etching (Step S11 in FIG. 3). As the result of the etching in Step S11, the insulating film IL2 configuring the sidewall spacer SW1 is removed and the insulating film IL1 having configured the sidewall spacer SW1 is exposed.

In Step S11, the etching is performed under such a condition (an etching condition) that etching speed of the insulating film IL2 is higher (faster) than the etching speed of the insulating film IL1. In other words, in Step S11, the etching is performed under such a condition (an etching condition) that the etching speed of the insulating film IL1 becomes lower (slower) than the etching speed of the insulating film IL2. That is, in Step S11, the etching is performed under such an etching condition that the insulating film IL1 is harder to etch than the insulating film IL2. Since the insulating film IL1 and the insulating film IL2 contain materials different from each other, an etching selection ratio of the insulating film IL2 relative to the insulating film IL1 can be secured.

Consequently, in the etching process in Step S11, it is possible to etch and remove the insulating film IL2 configuring the sidewall spacer SW1, and to make the insulating film IL1 having configured the sidewall spacer SW1 function as an etching stopper film. Consequently, in Step S11, the insulating film IL1 having configured the sidewall spacer SW1 is not removed but left.

Meanwhile, depending on etching conditions in Step S11, there may be such a case that the surface layer part (the upper layer part) of the insulating film IL1 exposed as the result of the removal of the insulating film IL2 that configured the sidewall spacer SW1 is removed by the etching, but, even in the case, the etching condition in Step S11 is set so that the insulating film IL1 is not completely removed but the insulating film IL1 is to be left in a layer. That is, the thickness of the insulating film IL1 is the same before and after Step S11, or the thickness of the insulating film IL1 is smaller after Step S11 than that before Step S11, but it is so programmed that, even after performing Step S11, the insulating film IL1 remains in a state of a layer and the substrate region (the semiconductor substrate SUB) covered with the insulating film IL1 configuring the sidewall spacer SW1 is not to be exposed. That is, the part of the substrate region (the semiconductor substrate SUB) having been covered with the insulating film IL1 just before Step S11 is maintained in the state of being covered with the insulating film IL1 also after Step S11 and is not exposed.

Therefore, even when the insulating film IL2 configuring the sidewall spacer SW1 is removed in Step S11, the state, where the insulating film IL1 extends continuously (in a state of a layer) from over the side wall of the gate electrode GE to over the $n^-$-type semiconductor region EX (and a part of the $n^+$-type semiconductor region SD), is maintained. That is, after performing Step S11, the insulating film IL1 remains in a state of a layer from over the side wall of the gate electrode GE to over the $n^-$-type semiconductor region EX (and a part of the $n^+$-type semiconductor region SD).

In Step S11, it is preferable that the substrate region of the semiconductor substrate SUB (the Si region) is not to be etched as far as possible. Therefore, in Step S11, it is preferable to perform the etching under such a condition (an etching condition) that the etching speed of the semiconductor substrate SUB is lower (slower) than the etching speed of the insulating film IL2. In other words, in Step S11, it is preferable to perform the etching under such a condition (an etching condition) that the etching speed of the insulating film IL2 is higher (faster) than that of the semiconductor substrate SUB. That is, in Step S11, it is preferable to perform the etching under such an etching condition that the semiconductor substrate SUB is harder to etch than the insulating film IL2. Consequently, in Step S11, it is possible to remove the insulating film IL2 configuring the sidewall spacer SW1 by etching and also to suppress or prevent the etching of the semiconductor substrate SUB.

In Step S11, use of an etching method capable of etching selectively the insulating film IL2 is preferable, and wet etching is preferable. Silicon oxide may be etched with a high selectivity ratio relative to silicon nitride and silicon, and, in this case, wet etching can favorably be employed. Therefore, when the insulating film IL2 is made of silicon oxide and the insulating film IL1 is made of silicon nitride, by wet etching, it is possible to etch and remove the insulating film IL2, and to suppress or prevent appropriately etching of the insulating film IL1 and the semiconductor substrate SUB. Therefore, the insulating film IL1 and the insulating film IL2 contain different materials, and it is more preferable that the insulating film IL1 is a silicon nitride film and the insulating film IL2 is a silicon oxide film.

That is, it is preferable to select each material of the insulating film IL1 and the insulating film IL2 so that a high etching selectivity ratio of the insulating film IL2 relative to the semiconductor substrate SUB and the insulating film IL1 can be secured, and, from this viewpoint, it is favorable to set the insulating film IL1 to be a silicon nitride film and to set the insulating film IL2 to be a silicon oxide film.

Even if a naturally oxidized film or the like is formed over the upper face (the Si face) of the $n^+$-type semiconductor region SD not covered with the insulating film IL1, it may be removed together when the insulating film IL2 is removed in Step S14.

Figure 14:
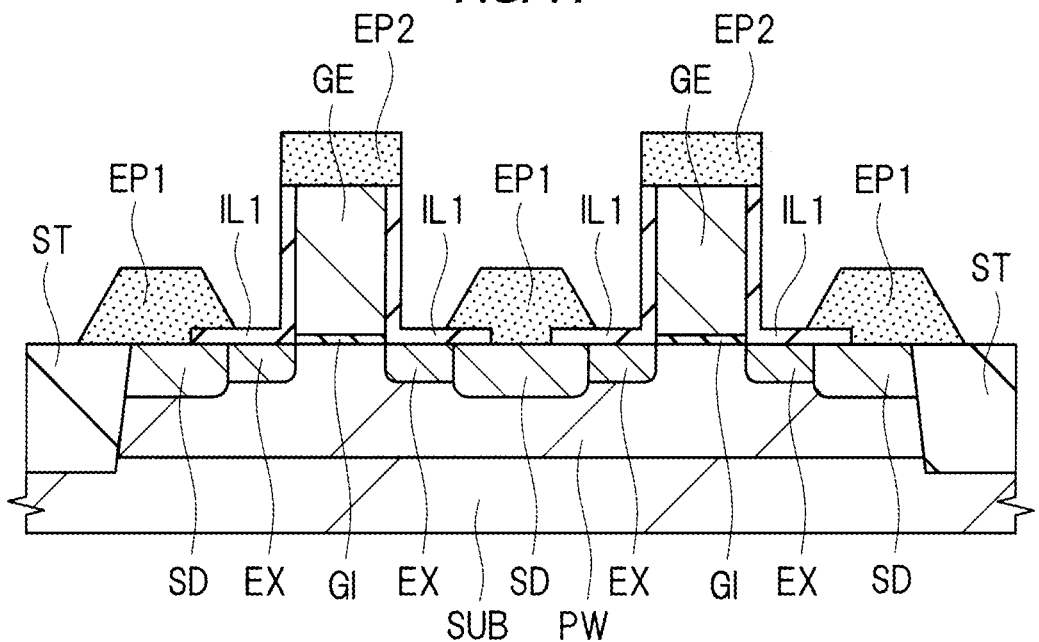
FIG. 14 is an essential part cross-sectional view in the process of manufacturing the semiconductor device following FIG. 13.

Next, as shown in FIG. 14, the semiconductor layer EP1, which is an epitaxial layer (an epitaxially grown layer, epitaxial semiconductor layer) is formed by epitaxial growth on the semiconductor substrate SUB (Step S12 in FIG. 3). Meanwhile, in FIG. 14, hatching of dots is given to the semiconductor layers EP1 and EP2.

In Step S12, since the semiconductor layer EP1 is formed by epitaxial growth, the epitaxial layer (the semiconductor layer EP1) grows selectively on an exposed face (a Si face) of the semiconductor substrate SUB. No epitaxial layer grows on the insulating film. Consequently, in Step S12, the epitaxial layer (the epitaxial layer to be the semiconductor layer EP1) grows selectively on the Si face (the Si exposed face) that is not covered with the gate insulating film (insulating film GI) or the insulating film IL1, but is exposed, in the main surface of the semiconductor substrate SUB.

Since the upper face (the Si face) of the $n^+$-type semiconductor region SD is not covered with the insulating film IL1 but is exposed, excluding a part (a part extending under the insulating film IL1) in the step just before Step S12, in Step S12, the epitaxial layer (the semiconductor layer EP1) grows selectively on the exposed face (the exposed upper face) of the $n^+$-type semiconductor region SD. On the other hand, in the step just before Step S12, since the insulating film IL1 lies over the $n^-$-type semiconductor region EX and the upper face of the $n^-$-type semiconductor region EX is not exposed, in Step S12, no epitaxial layer grows over the upper face of the $n^-$-type semiconductor region EX.

In Step S12, the epitaxial layer (the epitaxial layer to be the semiconductor layer EP1) grows upward on the upper face of the $n^+$-type semiconductor region SD, which is not covered with the insulating film IL1 but is exposed, and, when the upper face of the epitaxial layer becomes higher than the upper face of the insulating film IL1 on the way of growing, the epitaxial layer begins to grow not only in the upward direction but also in lateral directions. Here, the upward direction corresponds to a direction that is approximately vertical to the main surface of the semiconductor substrate SUB and a direction moves away from the main surface of the semiconductor substrate SUB, and lateral directions are directions approximately parallel to the main surface of the semiconductor substrate SUB. Consequently, the epitaxial layer (the epitaxial layer to be the semiconductor layer EP1) grows also in the direction parallel to the gate length direction along the upper face of the insulating film IL1. Accordingly, the epitaxial layer (the semiconductor layer EP1) is formed on the upper face of the $n^+$-type semiconductor region SD that is not covered with the insulating film IL1 but is exposed, and a part thereof runs and extends over the insulating film IL1.

Consequently, the semiconductor layer EP1 having the epitaxial layer grown on the upper face (the exposed face) of the $n^+$-type semiconductor region SD is in such a state that a part thereof has run over the insulating film IL1. That is, the semiconductor layer EP1 is in such a state that it is formed on the upper face of the $n^+$-type semiconductor region SD (the semiconductor substrate SUB), which is not covered with the insulating film IL1 but is exposed, and that a part (a part of the semiconductor layer EP1) has extended (nm) over the insulating film IL1. That is, the state is that, in the gate length direction (the gate length direction of the gate electrode GE of the n-channel type MISFET Qn), an end part of the semiconductor layer EP1 (an end part on the side facing the gate electrode GE) runs (lies) over the insulating film IL1. When the $n^+$-type semiconductor region SD is adjacent to the element isolation region ST, the semiconductor layer EP1 is in such a state that it is formed on the upper face of the $n^+$-type semiconductor region SD, which is not covered with the insulating film IL1 but is exposed, and that a part runs over the insulating film IL1 and another part runs over the element isolation region ST. That is, this case is in such a state that, in the gate length direction (the gate length direction of the gate electrode GE of the n-channel type MISFET Qn), one end part of the semiconductor layer EP1 (the end part facing the gate electrode GE) runs (lies) over the insulating film IL1, and another end part runs (lies) over the element isolation region ST.

That is, by removing the insulating film IL2 configuring the sidewall spacer SW1 in Step S11, and then allowing the semiconductor layer EP1 to grow epitaxially in Step S12, it is possible to allow the semiconductor layer EP1 to grow so as to expand to the region where the insulating film IL2 configuring the sidewall spacer SW1 lay. As the result of having removed the insulating film IL2 configuring the sidewall spacer SW1, the epitaxial layer (the semiconductor layer EP1) grown on the $n^+$-type semiconductor region SD grows laterally over the insulating film IL1 (the insulating film IL1 having configured the sidewall spacer SW1) remaining over the $n^-$-type semiconductor region EX (and a part of the $n^+$-type semiconductor region SD) and is in the state of running over the insulating film IL1.

In the present embodiment, since the insulating film IL2 having configured the sidewall spacer SW1 has been removed, the semiconductor layer EP1 can also grow in the lateral direction (the gate length direction) and run over the insulating film IL1, to increase the surface area of the semiconductor layer EP1. Consequently, in Step S14 (a process of forming the metal silicide layer MS) to be described later, it is possible to increase the surface of the boundary of the metal silicide layer MS (the boundary between the metal silicide layer MS and the semiconductor layer EP1), and to reduce parasitic resistance caused by the boundary of the metal silicide layer MS. This will be explained later in more detail.

The semiconductor layer EP1 is an epitaxially grown semiconductor layer and has a semiconductor material, and a Si (silicon) layer can favorably be used as the semiconductor layer EP1. As another mode, it is possible to use a semiconductor layer other than a Si layer, for example, a SiGe (silicon germanium) layer or a Ge (germanium) layer as the semiconductor layer EP1. In Step S12, by selecting the kind of gas (source gas, raw material gas) that is used when epitaxial growth is performed so as to correspond to the kind of semiconductor material to be grown, an intended semiconductor material can be grown epitaxially. When the semiconductor layer EP1 is a silicon layer, as a source gas, for example, disilane gas, silane gas, dichlorosilane gas or the like can be used.

In Step S12, in order to allow the epitaxially grown semiconductor layer EP1 to run easily over the insulating film IL1, it is preferable that the insulating film IL1 has been made thin in the step of performing Step S12. From this viewpoint, in the step of performing the process of forming the semiconductor layer EP1 in Step S12, the thickness of the insulating film IL1 (the thickness of the part extending over the semiconductor substrate SUB) is preferably not more than 10 nm. Further, by adjusting formation conditions of the semiconductor layer EP1 (for example, growth temperature and the like), it is possible to allow the epitaxially grown semiconductor layer EP1 to run easily over the insulating film IL1.

In addition, it is necessary to make the insulating film IL1 remain from over the side wall of the gate electrode GE to over the semiconductor substrate SUB so that the semiconductor substrate SUB (the Si face) is not exposed in the part that was covered with the insulating film IL1 configuring the sidewall spacer SW1, in the step of performing Step S12. Consequently, in the step of performing Step S12, the thickness of the insulating film IL1 (the thickness of the part extending over the semiconductor substrate SUB) is more preferably not less than 2 nm, and, consequently, the insulating film IL1 maintains easily a layer state.

Since the gate electrode GE is formed by a semiconductor layer (here, the silicon film PS), in Step S12, the semiconductor layer (the epitaxial layer) EP1 is formed on the $n^+$-type semiconductor region SD, and, also on the gate electrode GE, the semiconductor layer (the epitaxial layer) EP2 is formed by epitaxial growth. Since the side wall of the gate electrode GE is covered with the insulating film IL1, in Step S12, no epitaxial layer grows over the side wall of the gate electrode GE.

The semiconductor layer EP1 and the semiconductor layer EP2 are formed in the identical process (the identical epitaxial growth process), and are formed out of the same kind of material (a semiconductor material). When the semiconductor layer EP1 is a Si (silicon) layer, the semiconductor layer EP2, too, is a Si (silicon) layer. When the semiconductor layer EP1 is a SiGe (silicon germanium) layer, the semiconductor layer EP2, too, is a SiGe (silicon germanium) layer, and when the semiconductor layer EP1 is a Ge (germanium) layer, the semiconductor layer EP2, too, is a Ge (germanium) layer.

Since the semiconductor layer EP1 grows on the upper face (the exposed face) of the $n^+$-type semiconductor region SD consisting of a single crystal, the layer EP1 is a single crystalline layer. On the other hand, the semiconductor layer EP2 may be polycrystalline, while reflecting that it grows on the gate electrode GE having a polycrystal (polycrystalline silicon) (or, while reflecting the foundation).

When both n-channel type MISFET and p-channel type MISFET are to be formed over the semiconductor substrate SUB, there may be such cases that the semiconductor layers EP1 of the n-channel type MISFET and the p-channel type MISFET are made to have the same composition, or different compositions.

Figure 15:
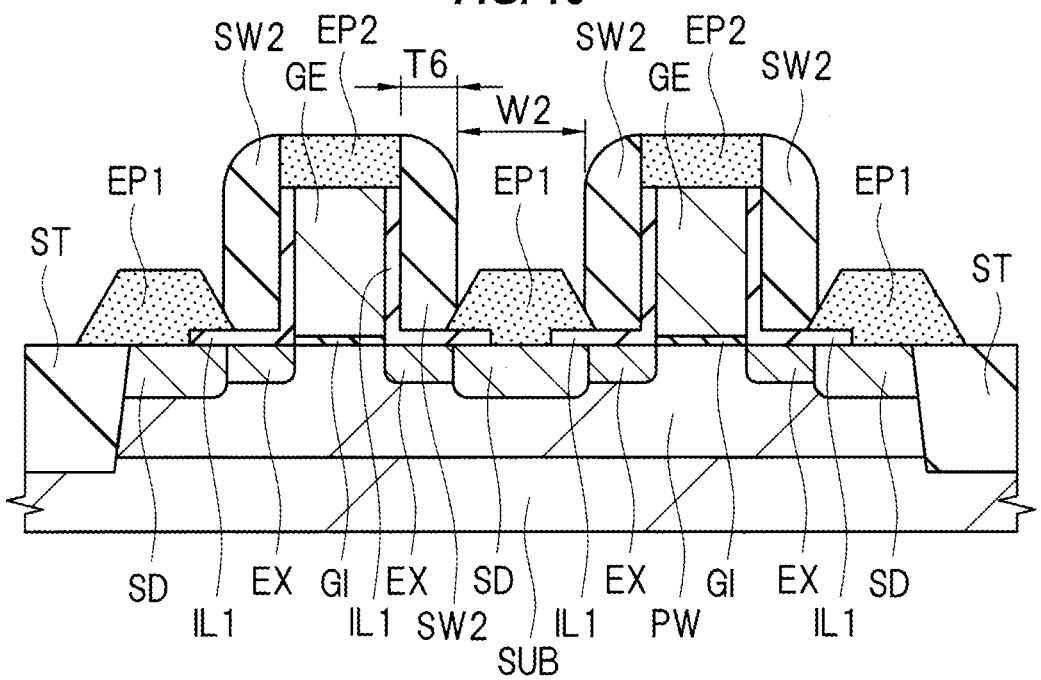
FIG. 15 is an essential part cross-sectional view in the process of manufacturing the semiconductor device following FIG. 14.

Next, as shown in FIG. 15, over the side wall of the gate electrode GE, the sidewall spacer SW2 is formed (Step S13 in FIG. 3). The sidewall spacer SW2 can be formed in the following lines.

That is, first, an insulating film for forming the sidewall spacer SW2 is formed over the main surface (the whole main surface) of the semiconductor substrate SUB so as to cover the gate electrode GE, the semiconductor layers EP1 and EP2, and the insulating film IL1. The insulating film for forming the sidewall spacer SW2 contains, for example, a silicon oxide film, a silicon nitride film or a stacked film thereof, and can be formed by a CVD method or the like. A low permittivity insulating film having a lower permittivity as compared with silicon oxide may also be employed as the insulating film for forming the sidewall spacer SW2. After that, by etching back (etching, dry etching, anisotropically etching) the insulating film for forming the sidewall spacer SW2 by an anisotropic etching technique, the insulating film for forming the sidewall spacer SW2 is left over both side walls (side faces) of the gate electrode GE and the insulating film for forming the sidewall spacer SW2 in other regions is removed. Consequently, by the insulating film for forming the sidewall spacer SW2 that remains over both side walls of the gate electrode GE, the sidewall spacer SW2 is formed. That is, the method of forming the sidewall spacer SW2 is basically the same as the method of forming the sidewall spacer SW1 except for the film configuration.

Since the insulating film IL1 has been formed over the side wall of the gate electrode GE in the step just before Step S13, in Step S13, the sidewall spacer SW2 is formed over the side wall of the gate electrode GE via the insulating film IL1. That is, between the sidewall spacer SW2 and the gate electrode GE (the side wall thereof), the insulating film IL1 is interposed. Further, the sidewall spacer SW2 does not contact with the substrate region of the semiconductor substrate SUB (the Si substrate region), but, between the sidewall spacer SW2 and the semiconductor substrate SUB, the insulating film IL1 is interposed. Further, the sidewall spacer SW2 is formed above the $n^-$-type semiconductor region EX formed over the semiconductor substrate SUB, and, between the sidewall spacer SW2 and the $n^-$-type semiconductor region EX, the insulating film IL1 is interposed. Consequently, the insulating film IL1 extends over both the region between the semiconductor substrate SUB (the $n^-$-type semiconductor region EX) and the sidewall spacer SW2, and the region between the gate electrode GE and the sidewall spacer SW2.

It is preferable that thickness T6 of the sidewall spacer SW2 formed over the side wall of the gate electrode GE after performing Step S13 is smaller (thinner) than thickness T5 of the insulating film IL2 that configures the sidewall spacer SW1 (that is, the insulating film IL2 removed in Step S11) (that is, T6<T5).

Here, the thickness T6 of the sidewall spacer SW2 corresponds to the thickness (the dimension) along the gate length direction (corresponding to the gate length direction of the gate electrode GE over the sidewall of which the spacer SW2 is formed), which is shown in FIG. 15. The thickness T6 of the sidewall spacer SW2 is one approximately corresponding to the thickness (formed film thickness) of the insulating film for forming the sidewall spacer SW2. The thickness T5 of the insulating film IL2 configuring the sidewall spacer SW1 corresponds to the thickness (the dimension) along the gate length direction (corresponding to the gate length direction of the gate electrode GE over the side wall of which the sidewall spacer SW1 is formed), which is shown in FIG. 11. Consequently, the measurement direction of the thickness T6 and the measurement direction of the thickness T5 are the same. The thickness T5 of the insulating film IL2 configuring the sidewall spacer SW1 is one approximately corresponding to the thickness (formed film thickness) T2 of the insulating film IL2 formed in Step S8. Accordingly, it is preferable that the thickness (formed film thickness) of the insulating film for forming the sidewall spacer SW2 is smaller (thinner) than the thickness (formed film thickness) T2 of the insulating film IL2 formed in Step S8.

Further, total thickness T11 of the insulating film IL1 and the sidewall spacer SW2 formed over the side wall of the gate electrode GE in the step in which Step S13 has been performed is smaller than the length T12 of the insulating film IL1 in the part extending over the semiconductor substrate SUB (that is, T11<T12). This can be realized by making the thickness T6 of the sidewall spacer SW2 smaller than the thickness T5 of the insulating film IL2 configuring the sidewall spacer SW1 (T6<T5). Meanwhile, the thickness T11 and the length T12 are shown in FIG. 1 (the length T12 is shown also in FIG. 13). Consequently, in the step in which Step S13 has been performed, the statute is that, in the insulating film IL1 in the part extending over the semiconductor substrate SUB, the side adjacent to the gate electrode GE is covered with the sidewall spacer SW2 but the side opposite to that side is not covered with the sidewall spacer SW2. That is, the insulating film IL1 is in such a state as extending over both regions of the region between the semiconductor substrate SUB (the $n^-$-type semiconductor region EX) and the sidewall spacer SW2 and the region between the gate electrode GE and the sidewall spacer SW2 and, furthermore, extending up to a region outside the sidewall spacer SW2 (a region not covered with the sidewall spacer SW2).

By controlling the thickness T6 of the sidewall spacer SW2 as described above, when forming the metal silicide layer MS in Step S14 to be described later, the formation of the metal silicide layer MS over the surface layer part of the semiconductor layer EP1 becomes less likely to be blocked with the sidewall spacer SW2, and the area of the boundary between the metal silicide layer MS and the semiconductor layer EP1 can surely be made larger.

Meanwhile, of the insulating films IL1 and IL2 configuring sidewall spacer SW1, in Step S9, the insulating film IL2 is removed and the insulating film IL1 is left in a state of a layer, and, therefore, the length T12 of the insulating film IL1 in the part extending over the semiconductor substrate SUB (see FIGS. 1 and 13) is nearly the same as the thickness T4 of the sidewall spacer SW1 (see FIG. 11) (that is, T12≈T4).

It is also preferable that the side of a side end part in the sidewall spacer SW2 (the side opposite to the side adjacent to the gate electrode GE) slightly runs over the semiconductor layer EP1. That is, it is preferable that the side end part of the sidewall spacer SW2 (the side face lower part of the side opposite to the side adjacent to the gate electrode GE) lies over the semiconductor layer EP1. That is, it is preferable that the sidewall spacer SW2 lies over the semiconductor layer EP1 in a part thereof. Consequently, even if deviation of the contact hole CNT (shift of formation position of the contact hole CNT from the design) arises when forming the contact hole CNT later, it becomes possible to prevent more appropriately the exposure of the n⁻-type semiconductor region EX from the contact hole CNT. Further, when introducing an impurity into the semiconductor layer EP1 by ion implantation after forming the sidewall spacer SW2, additional implantation of the impurity even into the n⁻-type semiconductor region EX can more surely be prevented.

Incidentally, the semiconductor layer EP1 functions as a semiconductor region for the source/drain of the MISFET, and, therefore, it is necessary to introduce an impurity into the layer to lower the resistivity. Further, in order to reduce the resistance of the gate electrode, it is desirable to introduce an impurity also into the semiconductor layer EP2 to lower the resistivity. When forming an n-channel type MISFET, the semiconductor layers EP1 and EP2 (in particular, the semiconductor layer EP1) are made to be an n-type semiconductor layer introduced with an n-type impurity.

Therefore, it is preferable, by introducing a doping gas into gas for deposition on the occasion of the epitaxial growth of semiconductor layers EP1 and EP2 in Step S12, to form (grow) an epitaxial layer (semiconductor layers EP1 and EP2) into which an impurity of the conductivity type (here, an n-type impurity) has been introduced. In this case, in the step in which the semiconductor layers EP1 and EP2 have been epitaxially grown in Step S12, the semiconductor layers EP1 and EP2 have become n-type semiconductor layers introduced with an n-type impurity. That is, in the step in which the semiconductor layer EP1 has been epitaxially grown in Step S12, the semiconductor layer EP1 has the same conductivity type (here, the n-type) as that of the n⁻-type semiconductor region EX, and has an impurity concentration higher than that in the n⁻-type semiconductor region EX.

As another mode, instead of introducing an impurity in a high concentration in epitaxial growth, it is also possible to introduce an impurity (an n-type impurity when forming the n-channel type MISFET) into the semiconductor layers EP1 and EP2 in a high concentration by ion implantation after growing epitaxially the semiconductor layers EP1 and EP2. Because of having introduced an impurity into the semiconductor layers EP1 and EP2 by ion implantation, the semiconductor layer EP1 has the same conductivity type as that of the n⁻-type semiconductor region EX (here, the n-type), and has an impurity concentration higher than that in the n⁻-type semiconductor region EX. In this case, it is preferable to perform ion implantation of an impurity (a dopant, here, an n-type impurity such as phosphorous (P) or arsenic (As)) into the semiconductor layers EP1 and EP2 after forming the sidewall spacer SW2 in Step S13 (and before a salicide process in Step S14 to be described later). By performing ion implantation after forming the sidewall spacer SW2, the gate electrode GE and the sidewall spacer SW2 function as a mask (an ion implantation-blocking mask). Therefore, it is possible to prevent the ion implantation into the lower side of the sidewall spacer SW2, and to prevent an additional introduction of the impurity into the n⁻-type semiconductor region EX on the lower side of the sidewall spacer SW2. If necessary, an impurity for applying stress or suppressing diffusion of the impurity may also be ion implanted additionally for the semiconductor layers EP1 and EP2. After the ion implantation into the semiconductor layers EP1 and EP2, a heat treatment (an annealing treatment) may also be performed for activating the introduced impurity (and removing implantation damage) and the like.

Next, by a salicide (Self Aligned Silicide) technique, the metal silicide layer MS is formed (Step S14 in FIG. 3). The metal silicide layer MS is formed over the surface (the upper layer part) of the semiconductor layers EP1 and EP2. The metal silicide layer MS can be formed according to the following way (processes in FIGS. 16 and 17).

Figure 16:
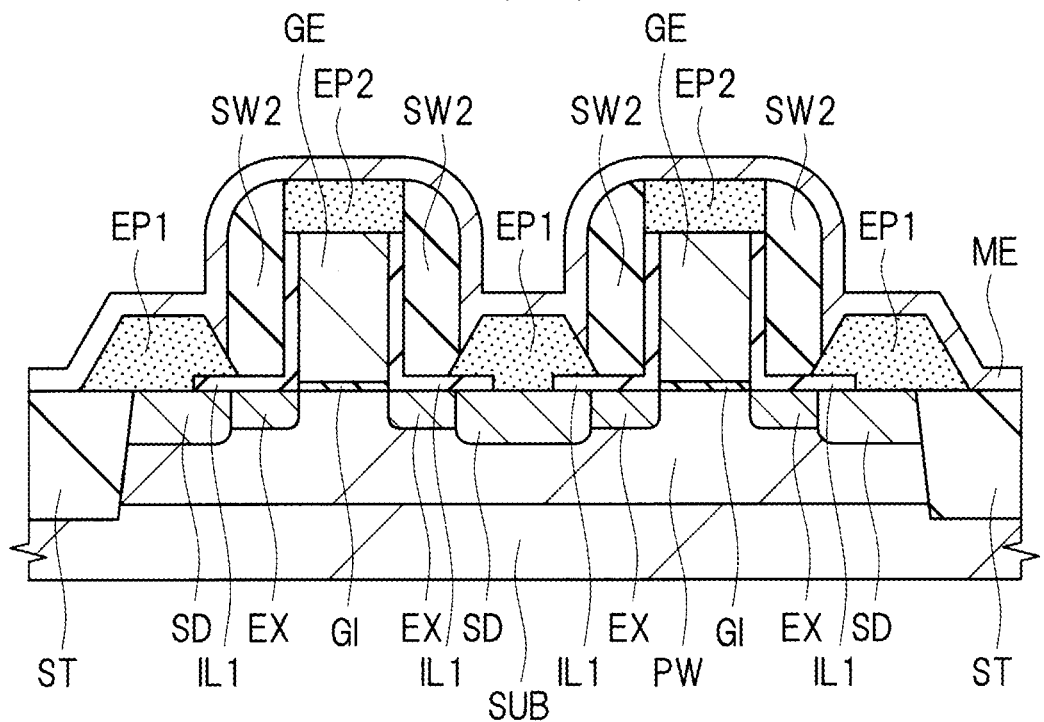
FIG. 16 is an essential part cross-sectional view in the process of manufacturing the semiconductor device following FIG. 15.
Figure 17:
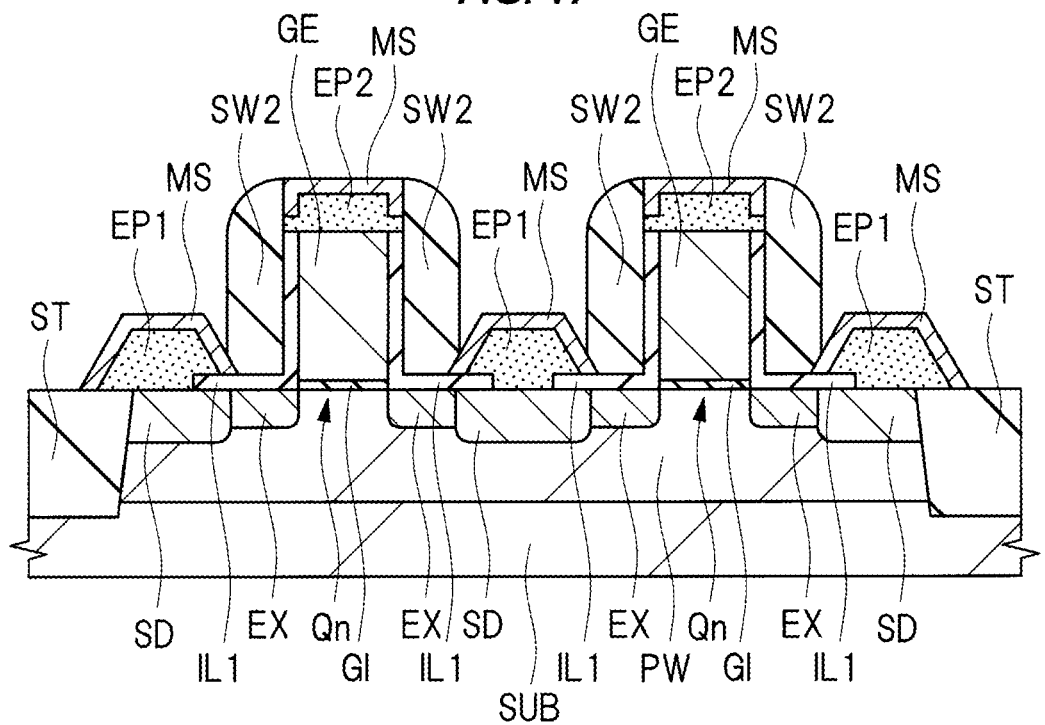
FIG. 17 is an essential part cross-sectional view in the process of manufacturing the semiconductor device following FIG. 16.

First, in the state where the surfaces (the upper faces) of the semiconductor layers EP1 and EP2 are exposed, as shown in FIG. 16, over the main surface (the whole main surface) of the semiconductor substrate SUB, a metal film ME is formed (deposited) so as to cover the gate electrode GE, the sidewall spacer SW2 and the semiconductor layers EP1 and EP2. The metal film ME contains, for example, a cobalt (Co) film, a nickel (Ni) film, a nickel-platinum alloy film or the like, which may be formed using a sputtering method or the like. Then, by a heat treatment, the metal film ME, and the semiconductor layers EP1 and EP2 are reacted. Consequently, as shown in FIG. 17, over the surface (the upper layer part) of the semiconductor layers EP1 and EP2, a metal silicide layer MS, which is a reacted layer of the metal film ME and the semiconductor layers EP1 and EP2 (a reacted layer of a metal and a semiconductor), is formed. After that, the unreacted metal film ME is removed. In FIG. 17, this step is shown. As the result of forming the metal silicide layer MS, the diffusion resistance, the contact resistance and the like of the semiconductor layers EP1 and EP2 can be made lower. As another mode, it is also possible to form the metal film ME, perform a first heat treatment to react the metal film ME with the semiconductor layers EP1 and EP2, remove once the unreacted (surplus) metal film ME, and, after that, perform a second heat treatment to form the metal silicide layer MS.

There is mentioned an example of conditions for forming the metal silicide layer MS when the metal film ME is a nickel (Ni) film and the semiconductor layers EP1 and EP2 are Si (silicon) layers. That is, after forming a nickel film as the metal film ME over the whole main surface of the semiconductor substrate SUB, a first heat treatment is performed at a temperature of around 250 to 400° C. to react the nickel film with the semiconductor layers EP1 and EP2, and the unreacted (surplus) nickel film is removed. Then, a heat treatment at around 400 to 600° C. is performed to enable a nickel silicide layer to be formed as the metal silicide layer MS.

On the heat treatment in the process of forming the metal silicide layer MS in Step S14, silicidation (formation of the metal silicide layer MS) proceeds on the surface of the semiconductor layer EP1 in the part contacting with the metal film ME. In addition to this, furthermore, also on the surface of the semiconductor layer EP1 in the part covered with the sidewall spacer SW2 (that is, the part lying below the sidewall spacer SW2), the silicidation (formation of the metal silicide layer MS) may proceed to some extent. The silicidation of the semiconductor layer EP1 in the part covered with the sidewall spacer SW2 can be controlled by adjusting an amount of the sidewall spacer SW2 running over the semiconductor layer EP1 (an overlapping distance of the sidewall spacer SW2 and the semiconductor layer EP1 in the gate length direction).

The metal silicide layer MS is a reacted layer of a metal (a metal configuring the metal film ME) with the semiconductor layers EP1 and EP2, and, accordingly, a compound layer (a metal compound layer) of the metal (the metal configuring the metal film ME) with the element configuring the semiconductor layers EP1 and EP2.

When the semiconductor layers EP1 and EP2 are Si (silicon) layers, the metal silicide layer MS is configured by a silicide of the metal element configuring the metal film ME (that is, a metal silicide). That is, when the semiconductor layers EP1 and EP2 are Si (silicon) layers, the metal silicide layer MS is a metal compound layer formed by the reaction of the metal element configuring the metal film ME with Si (silicon) configuring the semiconductor layers EP1 and EP2. On the assumption that the semiconductor layers EP1 and EP2 are Si (silicon) layers, when the metal film ME is a cobalt film, the metal silicide layer MS is a cobalt silicide layer, when the metal film ME is a nickel film, the metal silicide layer MS is a nickel silicide layer, and when the metal film ME is a nickel-platinum alloy film, the metal silicide layer MS is a nickel-platinum silicide layer.

On the other hand, when the semiconductor layers EP1 and EP2 are SiGe (silicon germanium) layers, instead of the metal silicide layer MS, a metal silicon germanide layer is formed. The metal silicon germanide layer is a metal compound layer formed by the reaction of the metal element configuring the metal film ME with Si (silicon) and Ge (germanium) configuring the semiconductor layers EP1 and EP2. When the semiconductor layers EP1 and EP2 are Ge (germanium) layers, instead of the metal silicide layer MS, a metal germanide layer is formed. The metal germanide layer is a metal compound layer formed by the reaction of the metal element configuring the metal film ME with Ge (germanium) configuring the semiconductor layers EP1 and EP2.

As described above, the n-channel type MISFET Qn is formed over the semiconductor substrate SUB. The gate electrode GE functions as the gate electrode of the n-channel type MISFET Qn, the insulating film GI below the gate electrode GE functions as the gate insulating film of the n-channel type MISFET Qn, and, in a substrate region furthermore below it, a channel region of the n-channel type MISFET Qn is formed. Further, the n⁻-type semiconductor region EX, the n⁺-type semiconductor region SD in contact with the region EX, and the semiconductor layer EP1 in contact with the region SD function as a semiconductor region for a source or drain having an LDD structure of the n-channel type MISFET Qn. A source voltage or a drain voltage to be supplied to the n-channel type MISFET Qn is supplied to the metal silicide layer MS formed over the semiconductor layer EP1 from a wiring M1 to be described later via a plug PG to be described later.

Figure 18:
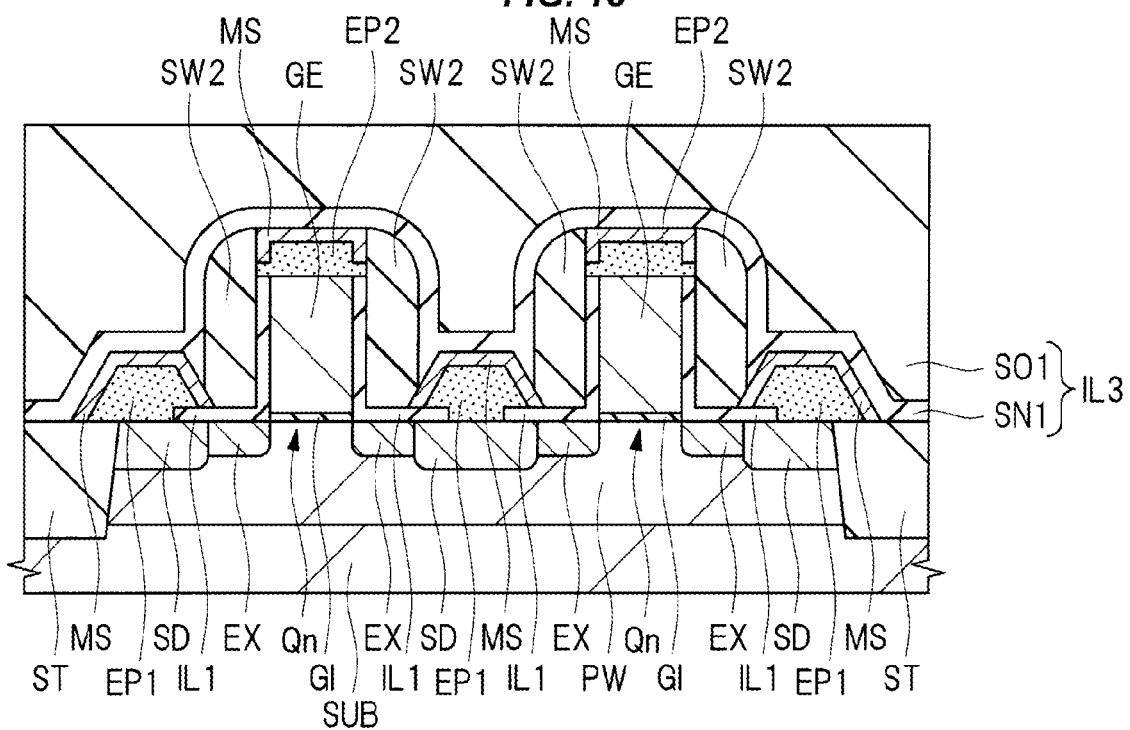
FIG. 18 is an essential part cross-sectional view in the process of manufacturing the semiconductor device following FIG. 17.

Next, as shown in FIG. 18, over the main surface (the whole main surface) of the semiconductor substrate, an insulating film (an interlayer insulating film) IL3 is formed as an interlayer insulating film, so as to cover the gate electrode GE, the sidewall spacer SW2, the semiconductor layers EP1 and EP2, and the metal silicide layer MS (Step S15 in FIG. 3).

The insulating film IL3 may be a stacked film, for example, of a silicon nitride film SN1 and a silicon oxide film S01 thicker than the film SN1. The silicon nitride film SN1 lies on the lower side, and the silicon oxide film S01 is formed over the silicon nitride film SN1. The silicon oxide film S01 is an insulating film mainly containing silicon oxide, which may also contain one or more kinds of carbon (C), fluorine (F), nitrogen (N), boron (B) and phosphorous (P). Further, as another mode, the insulating film IL3 may be a single body film of the silicon oxide film S01.

After forming the insulating film IL3, if necessary, the upper face of the insulating film IL3 may be polished by a CMP (Chemical Mechanical Polishing) method to improve the flatness of the upper face of the insulating film IL3.

Figure 19:
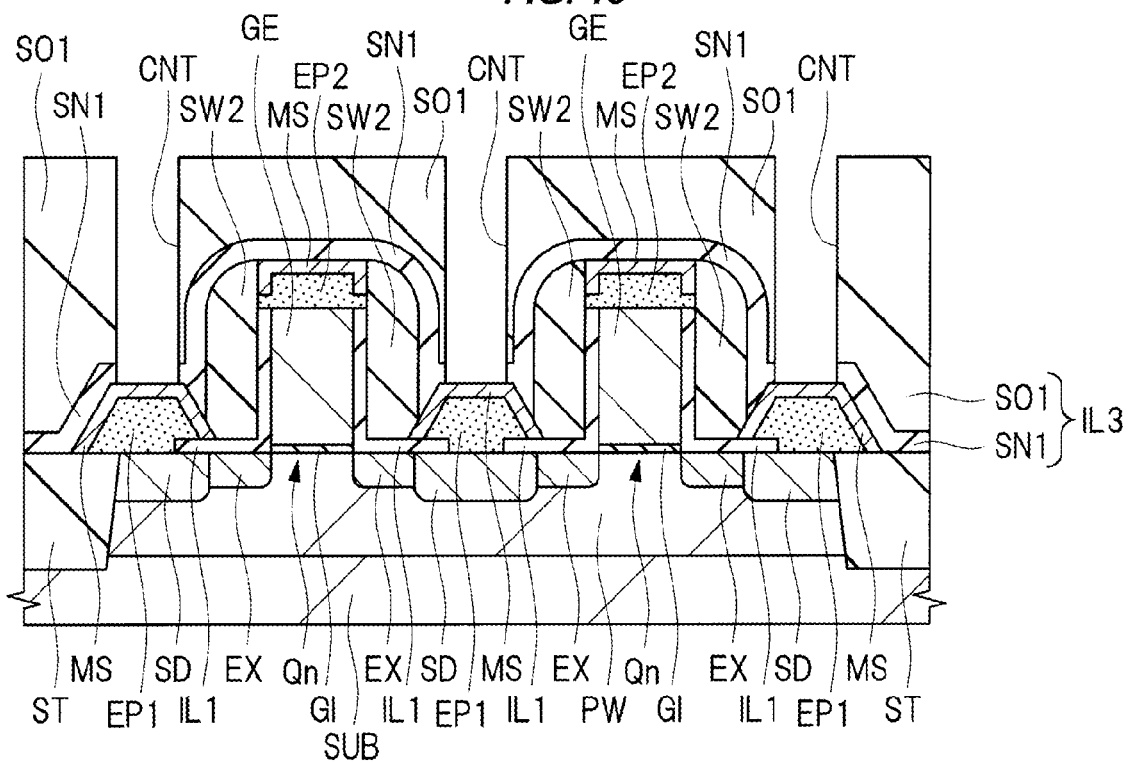
FIG. 19 is an essential part cross-sectional view in the process of manufacturing the semiconductor device following FIG. 18.

Next, as shown in FIG. 19, by dry etching the insulating film IL3 using a photoresist pattern (not shown) formed over the insulating film IL3 as an etching mask, a contact hole (a through hole, hole) CNT is formed in the insulating film IL3. The contact hole CNT is formed so as to pass through the insulating film IL3. The contact hole CNT can be formed as described below.

In order to form the contact hole CNT, first, the silicon oxide film S01 is dry etched under such a condition that the silicon oxide film SO1 is etched more easily than the silicon nitride film SN1 to allow the silicon nitride film SN1 to function as an etching stopper film, thereby forming a hole CNT' in the silicon oxide film S01. Then, the silicon nitride film SN1 at the bottom part of the hole CNT' is dry etched and removed under such a condition that the silicon nitride film SN1 is etched more easily than the silicon oxide film S01, thereby forming the contact hole CNT as a through hole.

The contact hole CNT is formed, for example, in an upper part of the semiconductor layer EP1 (that is, an upper part of the metal silicide layer MS formed over the upper part of the semiconductor layer EP1) or the like. At the bottom part of the contact hole CNT formed in the upper part of the semiconductor layer EP1, the metal silicide layer MS over the semiconductor layer EP1 is exposed. By allowing the silicon nitride film SN1 to function as an etching stopper film when forming the contact hole CNT, it is possible to suppress or prevent excessive digging of the contact hole CNT or damage on the foundation.

Figure 20:
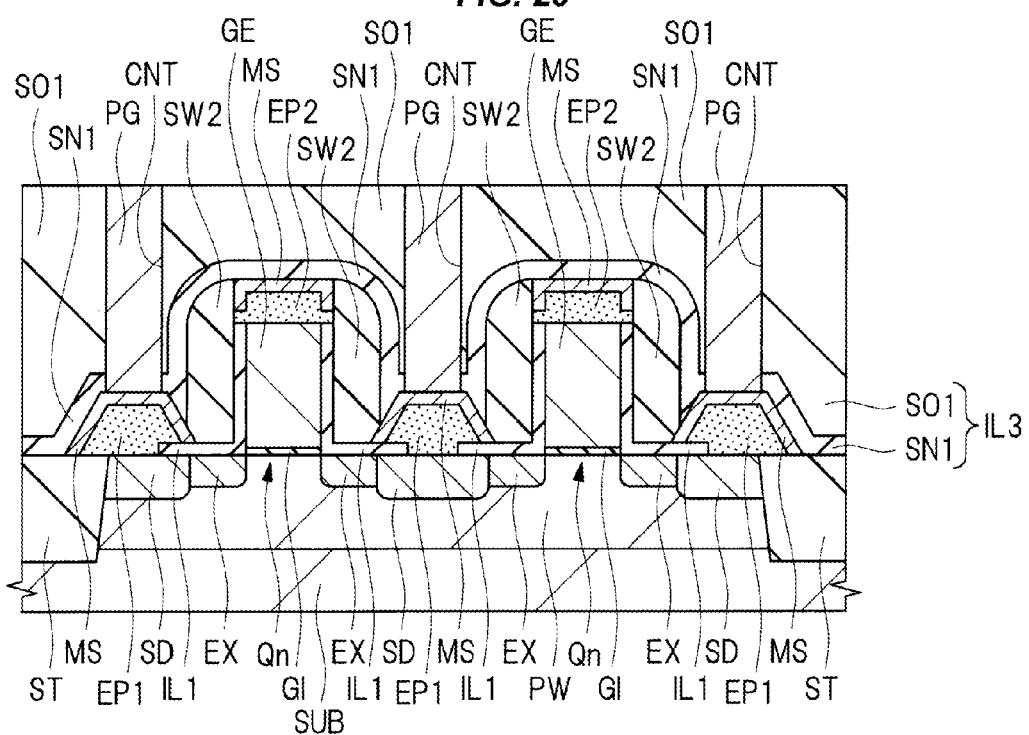
FIG. 20 is an essential part cross-sectional view in the process of manufacturing the semiconductor device following FIG. 19.

Next, as shown in FIG. 20, in the contact hole CNT, an electroconductive plug PG including tungsten (W) or the like is formed (embedded) as an electric conductor part for connection. The plug PG can be formed as described below.

In order to form the plug PG, first, over the insulating film IL3 including the inside of the contact hole CNT (over the bottom part and side wall), a barrier conductor film (for example, a titanium film, a titanium nitride film, or a stacked film thereof) is formed by a sputtering method, a plasma CVD method or the like. After that, a main conductor film including a tungsten film or the like is formed over the barrier conductor film so as to be embedded in the contact hole CNT by a CVD method or the like. After that, the unnecessary main conductor film and barrier conductor film lying outside the contact hole CNT (over the insulating film IL3) are removed by a CMP method, an etch back method or the like. Consequently, the upper face of the insulating film IL3 is exposed, and, by the barrier conductor film and the main conductor film embedded and left in the contact hole CNT of the insulating film IL3, the plug PG is formed. Meanwhile, for simplification of the drawing, in FIG. 20, the barrier conductor film and the main conductor film configuring the plug PG are shown integrally.

The plug PG formed in the upper part of the semiconductor layer EP1 (that is, the plug PG embedded in the contact hole CNT formed in the upper part of the semiconductor layer EP1) is in contact and electrically coupled with the metal silicide layer MS over the surface of the semiconductor layer EP1, at the bottom part thereof. Consequently, it becomes possible to supply a desired voltage (a source voltage or a drain voltage) to the metal silicide layer MS over the surface of the semiconductor layer EP1 (accordingly, to semiconductor layer EP1 below the metal silicide layer MS, and the $n^+$-type semiconductor region SD and $n^-$-type semiconductor region EX electrically coupled to the semiconductor layer EP1) from a wiring M1 to be described later through the plug PG.

Further, although not shown, when the contact hole CNT and the plug PG embedded therein are formed also in the upper part of the gate electrode GE, the plug PG contacts and is electrically coupled, at the bottom part of the plug PG, with the metal silicide layer MS over the surface of the semiconductor layer EP2 over the gate electrode GE.

Figure 21:
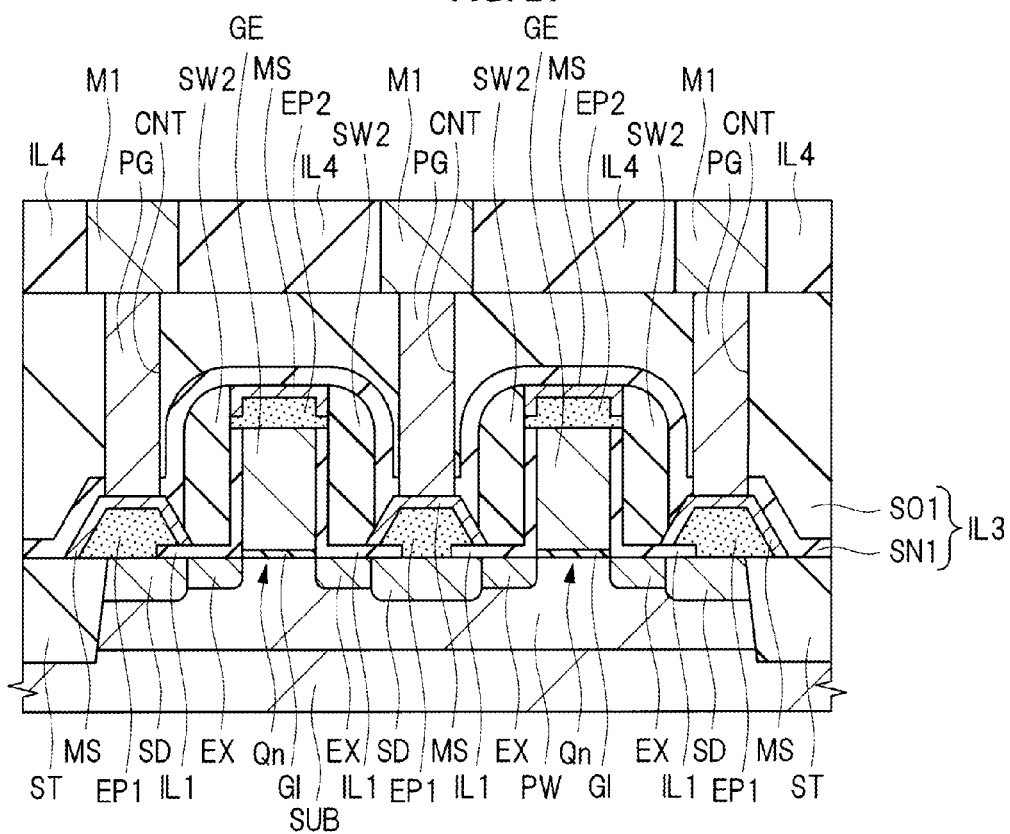
FIG. 21 is an essential part cross-sectional view in the process of manufacturing the semiconductor device following FIG. 20.

Next, as shown in FIG. 21, over the insulating film IL3 in which the plug PG is embedded, an insulating film IL4 for forming wiring is formed. The insulating film IL4 may be made into a single body film (a single body insulating film) or into a stacked film (a stacked insulating film).

Next, by a single damascene method, a first layer wiring is formed. First, a wiring trench (a trench in which a wiring M1 is to be embedded) is formed in a prescribed region of the insulating film IL4 by dry etching using a photoresist pattern (not shown) as a mask. After that, over the main surface of the semiconductor substrate SUB (that is, over the insulating film IL4 including over the bottom part and the side wall of the wiring trench), the barrier conductor film (the barrier metal film) is formed. As the barrier conductor film, for example, a titanium nitride film, a tantalum film, a tantalum nitride film or the like can be employed. Subsequently, over the barrier conductor film, a seed layer of copper is formed by a CVD method, a sputtering method or the like, and, furthermore, using an electrolytic plating method or the like, a copper-plated film (a main conductor film) is formed over the seed layer. With the copper-plated film, the inside of the wiring trench is filled. Then, the copper-plated film, the seed layer and the barrier metal film in regions other than the wiring trench are removed by a CMP method to form the first layer wiring M1 having copper as a main electroconductive material in the wiring trench. Meanwhile, for simplification of the drawing, in FIG. 21, the copper-plated film, the seed layer and the barrier metal film configuring the wiring M1 are shown integrally. The wiring M1 is coupled to the plug PG, and, via the plug PG, is electrically coupled to the semiconductor layer EP1 and the like. Consequently, it is so configured that a prescribed voltage (a source voltage or a drain voltage) can be applied to the semiconductor layer EP1 from the wiring M1 through the plug PG and the metal silicide layer MS (the metal silicide layer MS that is formed over the semiconductor layer EP1 and contacts with the plug PG).

After that, wirings of the second and subsequent layers are formed by a dual damascene method, but, here, illustration and explanation thereof are omitted. The wiring M1 and wirings of the second and subsequent layers are not limited to the damascene wiring, but may be formed by patterning a conductor film for wiring, for example, of tungsten wiring, aluminum wiring or the like.

In the present embodiment, the case, where the n-channel type MISFET is formed as a MISFET, is explained, but, while reversing conductivity types, a p-channel type MISFET may also be formed. Further, it is also possible to form both the n-channel type MISFET and the p-channel type MISFET over the identical semiconductor substrate SUB. This is applicable also to a Second to a Fifth Embodiments below.

<About Examination Example>

Next, Examination Examples that the present inventors examined will be explained. FIGS. 22 to 25 are essential part cross-sectional views in a process of manufacturing a semiconductor device of a First Examination Example examined by the present inventors. Meanwhile, in FIGS. 22 to 25, there is shown the case where, while holding a source/drain region (an $n^+$-type semiconductor region SD101 and a semiconductor layer EP101 over the $n^+$-type semiconductor region SD101) in common, two n-channel type MISFETs (gate electrodes GE101 thereof) are adjacent to each other in the gate length direction.

Figure 22:
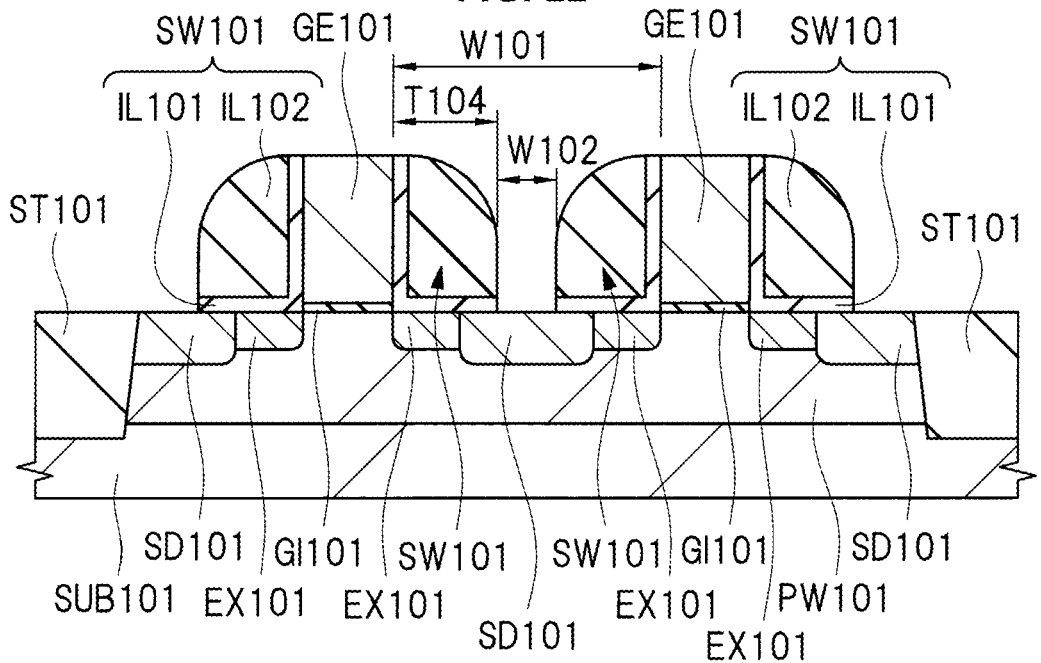
FIG. 22 is an essential part cross-sectional view in the process of manufacturing a semiconductor device of a First Examination Example.

In the First Examination Example, too, approximately the same processes as those in Steps S1 to S10 are performed to give the structure in FIG. 22 corresponding to that in FIG. 12. In FIG. 22, a semiconductor substrate SUB101 corresponds to the semiconductor substrate SUB, an element isolation region ST101 corresponds to the element isolation region ST, a p-type well PW101 corresponds to the p-type well PW, an $n^-$-type semiconductor region EX101 corresponds to the $n^-$-type semiconductor region EX, and the $n^+$-type semiconductor region SD101 corresponds to the $n^+$-type semiconductor region SD. Further, an insulating film GI101 corresponds to the insulating film GI, agate electrode GE101 corresponds to the gate electrode GE, an insulating film IL101 corresponds to the insulating film IL1, an insulating film IL102 corresponds to the insulating film IL2, and a sidewall spacer SW101 corresponds to the sidewall spacer SW1.

Figure 23:
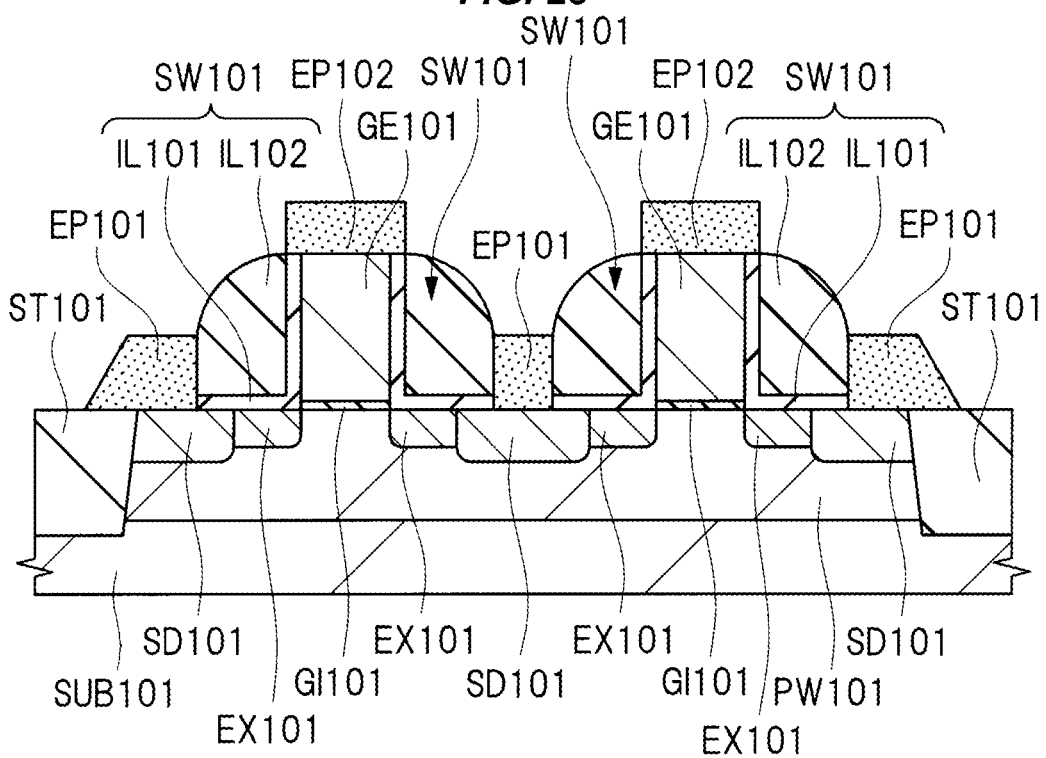
FIG. 23 is an essential part cross-sectional view in the process of manufacturing the semiconductor device following FIG. 22.

After that, in the First Examination Example, a process corresponding to Step S12 is performed without performing Step S11, differing from the present embodiment, and, as shown in FIG. 23, semiconductor layers EP101 and EP102, which are epitaxial layers (epitaxially grown layers), are formed by epitaxial growth. Meanwhile, in FIG. 23, hatching of dots is given to the semiconductor layers EP101 and EP102. A semiconductor material configuring the semiconductor layers EP101 and EP102 is the same as the semiconductor material configuring the semiconductor layers EP1 and EP2.

Since the semiconductor layers EP101 and EP102 are formed by epitaxial growth, the epitaxial layer (the semiconductor layer EP101) grows selectively on an exposed face (a Si face) of the semiconductor substrate SUB, and, the semiconductor layer EP102 grows on the gate electrode GE101. That is, on an exposed face (an exposed upper face) of the $n^+$-type semiconductor region SD101 not covered with the sidewall spacer SW101 but exposed, the semiconductor layer EP101 grows selectively.

In the First Examination Example, as known from FIGS. 22 and 23, growth direction of the semiconductor layer EP101 that grows epitaxially on the exposed face of the $n^+$-type semiconductor region SD101 is almost limited to the upper direction (the direction approximately vertical to the main surface of the semiconductor substrate SUB101) due to the existence of the sidewall spacer SW101.

Figure 24:
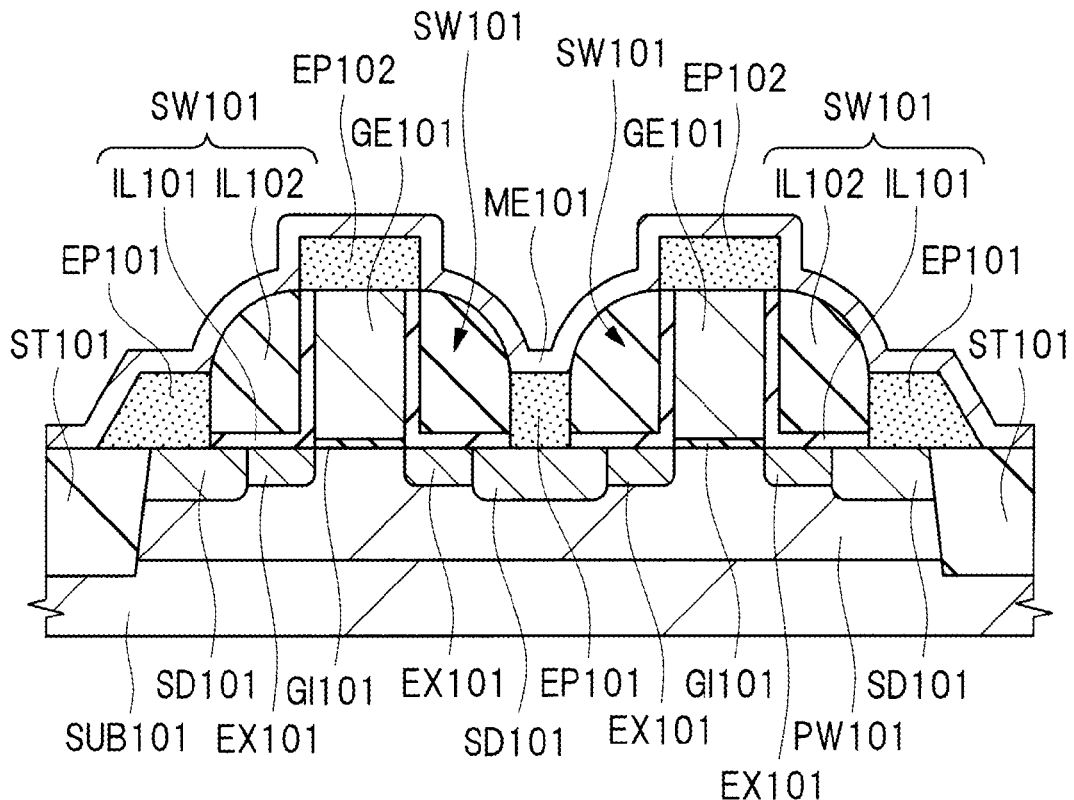
FIG. 24 is an essential part cross-sectional view in the process of manufacturing the semiconductor device following FIG. 23.
Figure 25:
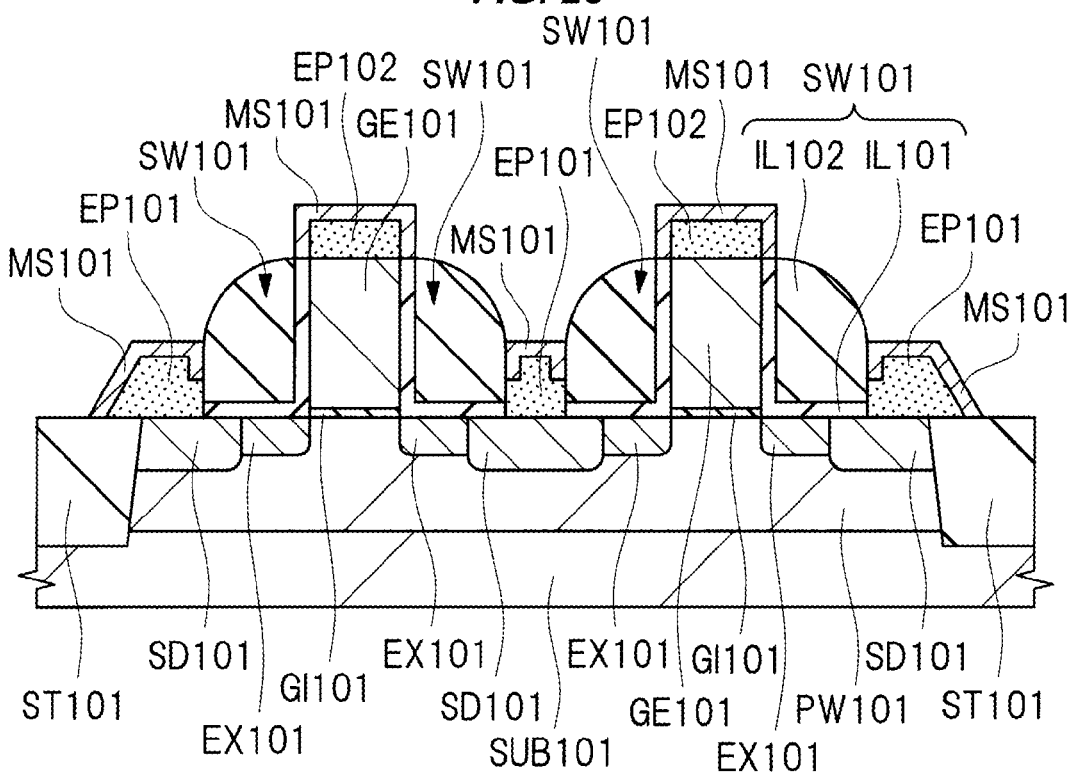
FIG. 25 is an essential part cross-sectional view in the process of manufacturing the semiconductor device following FIG. 24.

After that, by the salicide technique, over the surfaces of the semiconductor layers EP101 and EP102, a metal silicide layer MS101 corresponding to the metal silicide layer MS is formed. That is, as shown in FIG. 24, over the whole main surface of the semiconductor substrate SUB101, a metal film ME101 is formed so as to cover the gate electrode GE101, the sidewall spacer SW101, and the semiconductor layers EP101 and EP102. The metal film ME101 corresponds to the metal film ME. After that, by reacting the metal film ME101 with the semiconductor layers EP101 and EP102 by a heat treatment, as shown in FIG. 25, over the surface (the upper layer part) of the semiconductor layers EP101 and EP102, a metal silicide layer MS101, which is a reacted layer of the metal film ME101 with the semiconductor layers EP101 and EP102, is formed. After that, the unreacted metal film ME101 is removed. In FIG. 25, this step is shown.

Subsequent processes are approximately the same as those in FIGS. 18 to 21 in the First Examination Example, too, and, therefore, the illustration and explanation thereof are omitted here.

In the case of the First Examination Example as shown in FIGS. 22 to 25, it was known that there was such a problem as described below by the examination of the present inventors.

That is, space W101 (the space W101 is shown in FIG. 22) between gate electrodes GE101 adjacent to each other in the gate length direction with the source/drain region (the $n^+$-type semiconductor region SD101 and the semiconductor layer EP101 thereover) interposed (having the region in common) tends to be smaller with the decrease in size (miniaturization) of semiconductor elements. Since the sidewall spacer SW101 is formed over the side wall of the gate electrode GE101, when the space W101 between the gate electrodes GE101 becomes smaller, adjacent space W102 (the adjacent space W102 is shown in FIG. 22) of the sidewall spacers SW101 formed over side walls of these gate electrodes GE101 also becomes smaller. Meanwhile, the relation W101=W102+T104×2 is met, in which T104 (the thickness T104 is shown in FIG. 22) is thickness of the sidewall spacer SW101 (the thickness in the direction along the gate length direction).

Consequently, the semiconductor layer EP101 grows epitaxially in a narrow gap (region) between the sidewall spacers SW101. Since the semiconductor layer EP101 grows epitaxially on the exposed face of the $n^+$-type semiconductor region SD101, which is not covered with the sidewall spacer SW101 but is exposed, the growth direction of the semiconductor layer EP101 is approximately limited only to the upward direction by the side wall of the sidewall spacer SW101. Consequently, when the gate electrodes GE101 are adjacent to each other in the gate length direction, the semiconductor layer EP101 is formed in the narrow gap (region) between the adjacent sidewall spacers SW101, and the planar dimension (the planar area) of the semiconductor layer EP101 becomes smaller. That is, the dimension of the semiconductor layer EP101 in the gate length direction becomes approximately equal to the adjacent space W102 of the sidewall spacers SW101.

Over the surface of the semiconductor layer EP101, the metal silicide layer MS, which is a reacted layer (a compound layer) of the semiconductor layer EP101 and a metal, is formed. However, in the First Examination Example in FIGS. 22 to 25, since the planar dimension (the planar area) of the semiconductor layer EP101 is small, the area of the boundary between the metal silicide layer MS101 formed over the surface of the semiconductor layer EP101 and the semiconductor layer EP101 is small to result in the increase in parasitic resistance. This leads to the lowering in the performance of the semiconductor device.

In the First Examination Example in FIGS. 22 to 25, when the $n^+$-type semiconductor region SD101 is adjacent to the element isolation region ST101, the semiconductor layer EP101 that grows on the $n^+$-type semiconductor region SD101 can grow also over the element isolation region ST side and run over the element isolation region ST, but the growth over the gate electrode GE101 side is inhibited by the side face of the sidewall spacer SW101. Consequently, the growth direction of the semiconductor layer EP101 is limited to the upward direction, except for the element isolation region ST side.

Consequently, not only in the case where the semiconductor layer EP101 is to be grown in the region interposed between the adjacent gate electrodes GE101 but even in the case where the semiconductor layer EP101 is to be grown in regions other than the region interposed between the adjacent gate electrodes GE101, the growth of the semiconductor layer EP101 in lateral directions is blocked by the side faces of the sidewall spacers SW101, and, therefore, the planar dimension (the planar area) of the semiconductor layer EP101 is suppressed. Consequently, the area of the boundary between the metal silicide layer MS101 formed over the surface of the semiconductor layer EP101 and the semiconductor layer EP101 becomes small, which results in the increase in parasitic resistance. This leads to the lowering of the performance of the semiconductor device.

As to the parasitic resistance of a MISFET (excluding metal wiring parts), the boundary resistance between the semiconductor region (the semiconductor layer) configuring the source/drain region and the metal silicide layer formed thereover (or, a metal germanide layer or a metal silicon germanide layer, depending on the semiconductor material of the foundation) is the largest. Therefore, the decrease in the boundary area between the semiconductor region (the semiconductor layer) configuring the source/drain region and the metal silicide layer formed thereover directly leads to the increase in the parasitic resistance. Therefore, it is desired to increase the exposed area of the semiconductor layer EP101 in the process step in FIG. 23 to increase the boundary area between the semiconductor layer EP101 and the metal silicide layer MS in the process step in FIG. 25 (accordingly, in the semiconductor device after the manufacturing).

Figure 26:
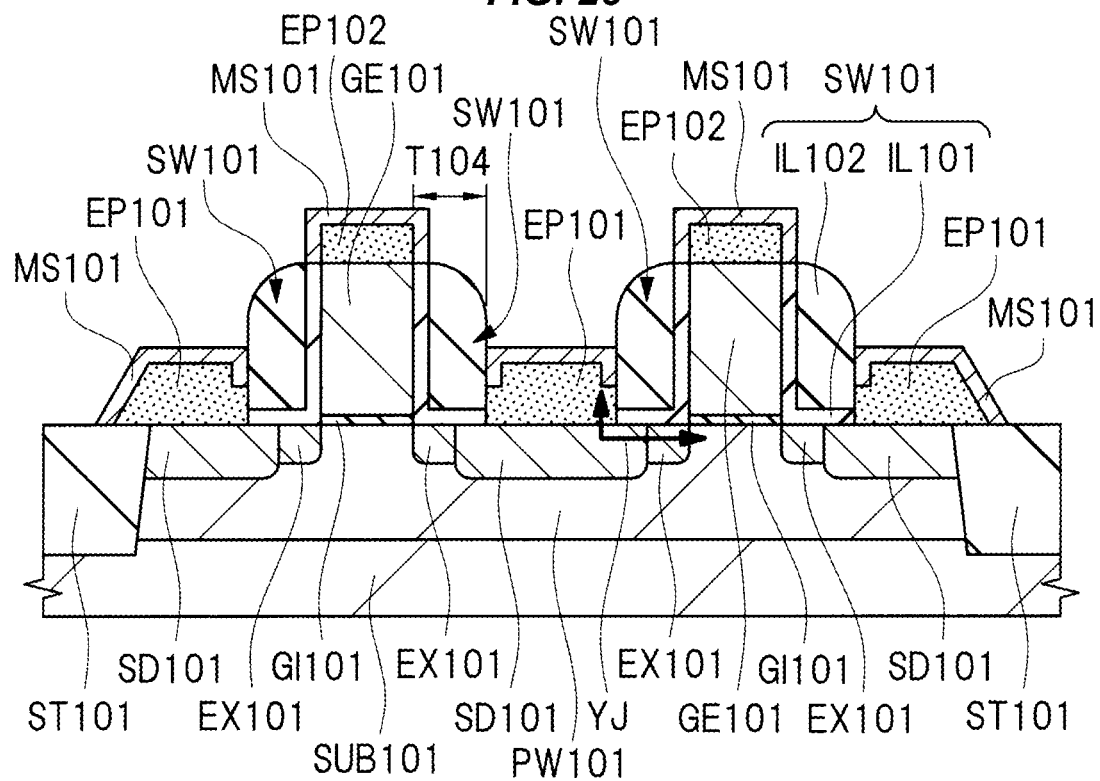
FIG. 26 is an essential part cross-sectional view in a manufacturing process of a semiconductor device of a Second Examination Example.

Then, it is considered to make thickness T104 of the sidewall spacer SW101 smaller. FIG. 26 is an essential part cross-sectional view in the process of manufacturing a semiconductor device of a Second Examination Example. The Second Examination Example shown in FIG. 26 corresponds to the case where the thickness T104 of the sidewall spacer SW101 is made smaller than that of the First Examination Example in FIGS. 22 to 25. That is, the structure in FIG. 26 corresponding to that in FIG. 25 is obtained, while making the thickness T104 of the sidewall spacer SW101 smaller (this can be realized by making the total of the film thicknesses of the insulating films IL101 and IL102 in deposition smaller) in the step of forming the sidewall spacer SW101 and performing the same processes as those in the First Examination Example except for the above.

As compared with the First Examination Example in FIG. 25, in the Second Examination Example in FIG. 26, the planner dimension (the planner area) of the semiconductor layer EP101 can be made larger by the reduced amount of the thickness T104 of the sidewall spacer SW101. Consequently, as compared with the First Examination Example in FIG. 25, in the Second Examination Example in FIG. 26, it is possible to make the area of the boundary between the metal silicide layer MS101 and the semiconductor layer EP101 formed over the surface of the semiconductor layer EP101 larger and to suppress the parasitic resistance.

However, to make the thickness T104 of the sidewall spacer SW101 small as in the Second Examination Example in FIG. 26 causes a problem below.

That is, when the thickness T104 of the sidewall spacer SW101 is made small as in the Second Examination Example in FIG. 26, distance (distance along a current path, which corresponds to the distance of pathway YJ shown by an arrow in FIG. 26) between the metal silicide layer MS101 and the channel region (the channel region below the gate electrode GE101) becomes shorter, and, therefore, a leak current increases. The increase in the leak current leads to the lowering of performance of the semiconductor device. Further, the increase in the leak current leads to the lowering of the yield caused by the leak current.

Consequently, in order to suppress the leak current, it is necessary to make the distance between the metal silicide layer MS101 and the channel region (the distance along a current pathway) large to some extent, but, when the thickness T104 of the sidewall spacer SW101 is made large for the purpose as in the First Examination Example, the above-mentioned problem of parasitic resistance is likely to be generated.

Accordingly, in order to improve performance of a semiconductor device, it is desired to make the boundary area between the semiconductor region (the semiconductor layer) configuring the source/drain region and the metal silicide layer formed over the surface thereof larger, while maintaining the distance (the distance along a current pathway) between the metal silicide layer and the channel region.

When forming the metal silicide layer MS101 by a salicide technique, the metal film ME101 formed in a trench (which corresponds to the region between the sidewall spacers SW101 adjacent to each other with the adjacent space W102) is dependent on the trench dimension, and, when the trench becomes narrower, the thickness of the metal film ME101 formed in the trench tends to become smaller. When the thickness of the metal film ME101 becomes smaller, the thickness of the metal silicide layer MS101 formed using the metal film ME101 also becomes smaller.

When decrease in size (miniaturization) of semiconductor elements proceeds and the trench dimension (which corresponds to the adjacent space W102 of the sidewall spacers SW101) becomes smaller, a large difference is generated in the formed film thickness of the metal film ME101 between a trench part having the narrowest trench dimension and a trench part having a wide trench dimension (or a broad and flat region instead of a trench-shaped region). When the metal film ME101 becomes thinner (becomes thinner, for example, in the range of not more than 10 nm), the metal silicide layer MS101 is not formed uniformly, and, on the other hand, when the thickness of the metal film ME101 becomes larger (as compared with the depth optimized relative to junction depth), the possibility of increase in a junction leak current becomes higher. When a trench part with a narrow trench dimension and a trench part with a wide trench dimension (or a broad and flat region instead of a trench-shaped region) exist together within a face of the semiconductor wafer, if the thickness of the metal film ME101 is optimized for the narrow trench part, the junction leak current is likely to increase in the wide trench part (or a broad and flat region instead of a trench shape). On the other hand, if the thickness of the metal film ME101 is optimized for the wide trench part (or a broad and flat region instead of a trench-shaped region), the possibility that formation fault of the metal silicide layer MS101 is generated in the narrow trench part becomes higher. That is, the relationship of trade-off is generated and optimization for the whole semiconductor device (semiconductor chip) becomes difficult. Such phenomenon becomes prominent when the trench dimension (which corresponds to the adjacent space W102 between the sidewall spacers SW101) is not more than 70 nm.

Accordingly, in order to improve the performance of semiconductor devices, the dimension of the trench-shaped part (the trench part) formed between gate electrodes adjacent to each other is desirably made larger in the step of forming the metal film to be used in the salicide process. However, in order to realize the above, to make the thickness T104 of the sidewall spacer SW101 smaller as in the Second Examination Example in FIG. 26 causes the above-mentioned problem of the increase in the leak current.

<Main Characteristics of the Embodiment>

The semiconductor device of the present embodiment has the MISFET including the gate electrode GE formed over the semiconductor substrate SUB via the gate insulating film (the insulating film GI), the insulating film (the side wall insulating film) IL1 extending from over the side wall of the gate electrode GE to over the semiconductor substrate SUB, and the semiconductor layer (the epitaxial semiconductor layer) EP1 formed on the semiconductor substrate SUB exposed from the insulating film IL1. Further, the insulating film IL1 has a part extending over the side wall of the gate electrode GE and a part extending over the semiconductor substrate SUB, and a part of the semiconductor layer EP1 lies over the insulating film IL1 in the part extending over the semiconductor substrate SUB. In other words, a part of the semiconductor layer EP1 runs over the insulating film IL1.

When the semiconductor layer EP1 having grown on the semiconductor substrate SUB exposed from the insulating film IL1 does not run over the insulating film IL1, differing from the present embodiment, since the planar dimension (the planar area) of the semiconductor layer EP1 is approximately the same as the planar dimension (the planar area) of a substrate-exposed face on which the semiconductor layer EP1 grows, the planar dimension (the planar area) of the semiconductor layer EP1 is suppressed.

In contrast, in the present embodiment, since a part of the semiconductor layer EP1 lies over the insulating film IL1 (that is, apart of the semiconductor layer EP1 runs over the insulating film IL1), the planar dimension (the planar area) of the semiconductor layer EP1 can be made larger than the planar dimension (the planar area) of the substrate-exposed face on which the semiconductor layer EP1 grows. Here, the substrate-exposed face on which the semiconductor layer EP1 grows is a substrate surface which is exposed from the insulating film IL1 and on which the semiconductor layer EP1 has grown, corresponding to a part in contact with the semiconductor layer EP1 in the main surface of the semiconductor substrate SUB.

Consequently, in the present embodiment, the planar dimension (the planar area) of the semiconductor layer EP1 can be made larger than the planar dimension (the planar area) of the substrate-exposed face on which the semiconductor layer EP1 grows to the extent that apart of the semiconductor layer EP1 lies (runs) over the insulating film IL1, and the planar dimension (the planar area) of the semiconductor layer EP1 can be increased. Consequently, it is possible to reduce the resistance component of the MISFET, and to improve the performance of the semiconductor device.

As the result of enlargement of the planar dimension (the planar area) of the semiconductor layer EP1 by allowing a part of the semiconductor layer EP1 to lie (run) over the insulating film IL1, when the compound layer of a metal and an element configuring the semiconductor layer EP1 (here, the metal silicide layer MS) is formed in the upper part of the semiconductor layer EP1, the boundary area between the compound layer (the metal silicide layer MS) and the semiconductor layer EP1 can be made larger. Since, as described above, the resistance at the boundary between the semiconductor layer EP1 and the metal silicide layer MS formed in the upper part thereof is the main generation source of the parasitic resistance, in order to reduce the parasitic resistance, the increase in the boundary area between the semiconductor layer EP1 and the metal silicide layer MS formed in the upper part thereof is effective. In the present embodiment, a compound layer (here, the metal silicide layer MS) of a metal and an element configuring the semiconductor layer EP1 is formed in the upper part of the semiconductor layer EP1, and the boundary area between the compound layer (the metal silicide layer MS) and the semiconductor layer EP1 can be made larger. Therefore, the parasitic resistance caused by the boundary resistance between the compound layer (the metal silicide layer MS) and the semiconductor layer EP1 can be reduced. By reducing the parasitic resistance, the performance of the semiconductor device can be improved.

The semiconductor layer EP1 is a semiconductor layer for source/drain. Since the semiconductor layer EP1 for source/drain is formed on the main surface of the semiconductor substrate SUB, even when the junction depth of a semiconductor region for source/drain formed over the semiconductor substrate SUB (here, the $n^+$-type semiconductor region SD) is made small, the thickness of the source/drain region can be assured. Consequently, a short channel effect can be prevented. Further, sheet resistance in the source/drain region can be reduced. Accordingly, the performance of the semiconductor device can be improved. Further, the miniaturization of a semiconductor element (accordingly, decrease in size of a semiconductor device) can be achieved.

In the Second Examination Example shown in FIG. 26, the planar dimension (the planar area) of the semiconductor layer EP101 is made larger by making the thickness T104 of the sidewall spacer SW101 smaller. Therefore, the distance between the metal silicide layer MS101 and the channel region (the distance along a current pathway) becomes shorter, and there is a risk of increase in the leak current.

In contrast, in the present embodiment, the insulating film (side wall insulating film) IL1 extends from over the side wall of the gate electrode GE to over the semiconductor substrate SUB, the insulating film IL1 has a part extending over the gate electrode GE and a part extending over the semiconductor substrate SUB, and a part of the semiconductor layer EP1 lies (runs) over insulating film IL1 in the part extending over the semiconductor substrate SUB. Since there exists the insulating film IL1 with the part extending over the semiconductor substrate SUB, the distance (the distance along the current pathway) between the metal compound layer (the compound layer of a metal and the element configuring the semiconductor layer EP1, here, the metal silicide layer MS) formed in the upper part of the semiconductor layer EP1 and the channel region (the channel region on the lower side of the gate electrode GE) can be made longer. Consequently, the leak current can be suppressed or prevented. Accordingly, the performance of the semiconductor device can be improved.

Suppose a case where the thickness T4 of the sidewall spacer SW1 in the present embodiment (see FIG. 11) and the thickness T104 of the sidewall spacer SW101 in the First Examination Example (see FIG. 22) are set to be approximately the same. In this case, the length T12 of the insulating film IL1 in the part extending over the semiconductor substrate SUB in the present embodiment (see FIGS. 1 and 13) and the thickness T104 of the sidewall spacer SW101 in the First Examination Example are approximately the same. In this case, when comparing the present embodiment with the First Examination Example, distances from the metal silicide layers MS and MS101 to the channel region (distance along the current pathway) are approximately the same. However, to the extent that apart of the semiconductor layer EP1 runs over the insulating film IL1, the planar dimension (the planar area) of the semiconductor layer EP1 in the present embodiment can be made larger than the planar dimension (the planar area) of the semiconductor layer EP101 in the First Examination Example.

Further, when comparing the present embodiment with the Second Examination Example, in the case where the planar dimension (the planar area) of the semiconductor layer EP101 in the Second Examination Example and the planar dimension (the planar area) of the semiconductor layer EP1 in the present embodiment are approximately the same, distances from the metal silicide layers MS and MS101 to the channel region (the distance along the current pathway) can be made longer in the present embodiment than in the Second Examination Example.

Accordingly, in the present embodiment, it is possible to meet both increasing the planar dimension (the planar area) of the semiconductor layer EP1 and lengthening the distance from the metal silicide layer MS (the compound layer of a metal and the element configuring the semiconductor layer EP1) to the channel region (the distance along the current pathway). Consequently, it is possible to reduce the parasitic resistance, and to suppress or prevent the leak current. Accordingly, the performance of the semiconductor device can be improved. Further, the yield of the semiconductor device can be improved.

In the present embodiment, the manufacturing method of the semiconductor device is devised in order to obtain the above-mentioned structure (the structure in which the insulating film IL1 extends from over the side wall of the gate electrode GE to over the semiconductor substrate SUB, and a part of the semiconductor layer EP1 runs over the insulating film IL1 in the part extending over the semiconductor substrate SUB) and the effect thereof.

That is, after forming the sidewall spacer SW1 using the stacked film LM having the insulating film IL1 and the insulating film IL2 over the insulating film IL1, the insulating film IL2 configuring the sidewall spacer SW1 is removed, and, after that, on the semiconductor substrate SUB exposed from the insulating film IL1, the semiconductor layer EP1 is grown epitaxially. On this occasion, since the insulating film IL2 configuring the sidewall spacer SW1 has been removed, the semiconductor layer EP1 can grow not only in the upward direction but also in a lateral direction (the gate length direction), and a part of the epitaxially grown semiconductor layer EP1 can run over the insulating film IL1. As a result of the fact that apart of the semiconductor layer EP1 has run over the insulating film IL1, the planar dimension (the planar area) of the semiconductor layer EP1 becomes larger than the planar dimension (the planar area) of the substrate-exposed face on which the semiconductor layer EP1 is grown. Consequently, it is possible to make the planar dimension (the planar area) of the semiconductor layer EP1 larger, and to reduce the resistance component of the MISFET to improve the performance of the semiconductor device.

In addition, after forming the semiconductor layer EP1 in Step S12, the reacted layer of a metal and the semiconductor layer EP1 (here, the metal silicide layer MS) is formed over the semiconductor layer EP1 in Step S14, and, as a result of the fact that apart of the semiconductor layer EP1 has run over the insulating film IL1, it is possible to make the planar dimension of the semiconductor layer EP1 larger and to make the boundary area between the reacted layer (the metal silicide layer MS) and the semiconductor layer EP1 larger. Consequently, it is possible to reduce the parasitic resistance caused by the boundary resistance between the reacted layer (the metal silicide layer MS) and the semiconductor layer EP1, and to improve the performance of the semiconductor device.

Further, by removing the insulating film IL2 configuring the sidewall spacer SW1 in Step S11, and allowing the semiconductor layer EP1 to run over the remaining insulating film IL1 in Step S12, as the result of the existence of the insulating film IL1, the distance between the reacted layer formed in the upper part of the semiconductor layer EP1 (here, the metal silicide layer MS) and the channel region (the distance along the current pathway) can be made longer. Consequently, it is possible to suppress or prevent the leak current, and to improve the performance of the semiconductor device.

In Step S11, it is preferable to perform etching under such a condition that the insulating film IL1 is etched less easily than the insulating film IL2, to remove the insulating film 1L2 configuring the sidewall spacer SW1. Consequently, it is possible to make the insulating film IL1 that configured the sidewall spacer SW1 be left appropriately so as to extend from over the side wall of the gate electrode GE to over the semiconductor substrate SUB in Step S11.

In Step S11 (the process of removing the insulating film IL2), the insulating film IL1 that configured the sidewall spacer SW1 is left so as to extend from over the side wall of the gate electrode GE to over the semiconductor substrate SUB. Further, in the step of performing the process of forming the semiconductor layer EP1 in Step S12, the thickness of the insulating film IL1 (the thickness of the part extending over the semiconductor substrate SUB) is preferably not more than 10 nm. When the thickness of the insulating film IL1 in the part extending over the semiconductor substrate SUB is too large in the step of performing the process of forming the semiconductor layer EP1 in Step S12, there may be such a risk that the semiconductor layer EP1 hardly runs over the insulating film IL1, or, even when it runs over the film IL1, the dimension of the run-over part (the dimension in the gate length direction) becomes smaller. As the result of setting the thickness of the insulating film IL1 in the part extending over the semiconductor substrate SUB to be not more than 10 nm in the step of performing the process of forming the semiconductor layer EP1 in Step S12, the semiconductor layer EP1 is likely to run easily over the insulating film IL1, and the dimension of the run-over part (the dimension in the gate length direction) is likely to be made larger easily. Consequently, the planar dimension (the planar area) of the semiconductor layer EP1 is likely to be made larger easily.

The thickness of the insulating film IL1 (the thickness of the part extending over the semiconductor substrate SUB) is preferably not more than 10 nm in the step of performing the process of forming the semiconductor layer EP1 in Step S12, and, when removing the insulating film IL2 configuring the sidewall spacer SW1 in Step S11, the insulating film IL1 may also be etched to some extent. Consequently, when depositing the insulating film IL1 in Step S7, it is preferable to set a thickness while considering that it will be etched in Step S11 to some extent. Consequently, when depositing the insulating film IL1 in Step S7, the formed film thickness of the insulating film IL1 (the thickness T1) may be set, for example, to be around 10 to 20 nm.

In the present embodiment, the thickness T6 (the thickness T6 is shown in FIG. 15) of the sidewall spacer SW2 is made smaller (thinner) than the thickness T5 (the thickness T5 is shown in FIG. 11) of the insulating film IL2 configuring the sidewall spacer SW1 (that is, T6<T5). Consequently, the adjacent space (the adjacent space in the gate length direction) W2 between the sidewall spacers SW2 formed over side walls facing each other of the gate electrodes GE adjacent in the gate length direction is larger than the adjacent space (the adjacent space in the gate length direction) W1 between the sidewall spacers SW1 formed over the side walls facing each other of the gate electrodes GE adjacent in the gate length direction (that is, W1<W2). Meanwhile, the adjacent space W1 is shown in FIG. 11, and the adjacent space W2 is shown in FIG. 15.

Consequently, when assuming the case where the thickness T4 of the sidewall spacer SW1 in the present embodiment is made approximately the same as the thickness T104 of the sidewall spacer SW101 in the First Examination Example, the adjacent space W1 between the sidewall spacers SW1 in the present embodiment becomes approximately the same as the adjacent space W102 (see FIG. 22) between the sidewall spacers SW101 in the First Examination Example. In this case, by the amount of two times the difference between the thickness T5 and the thickness T6, the adjacent space W2 between the sidewall spacers SW2 in the present embodiment is larger than the adjacent space W102 between the sidewall spacers SW101 in the First Examination Example. Therefore, in the present embodiment, the adjacent space W2 between the sidewall spacers SW2 can be made larger in the step of forming the metal film ME in Step S14. Accordingly, even if the space between the gate electrodes GE adjacent to each other in the gate length direction becomes narrower caused by miniaturization of a semiconductor element, the adjacent space W2 between the sidewall spacers SW2 can be made larger. Therefore, it is possible to suppress or prevent such a phenomenon that the thickness of the metal film ME formed over the semiconductor layer EP1 lying between the gate electrodes GE adjacent closely to each other in the gate length direction becomes smaller than thicknesses of the metal film ME in other regions. Consequently, the evenness of the formed film thickness (the thickness of the film actually formed) of the metal film ME in the main surface of the semiconductor substrate SUB can be improved. Accordingly, it is possible to form more appropriately the metal silicide layer MS, and to suppress or prevent the generation of formation fault of the metal silicide layer MS. Consequently, the performance of the semiconductor device can be improved. Further, the reliability of the semiconductor device can be improved.

(Second Embodiment)

FIGS. 27 to 31 are essential part cross-sectional views in the process of manufacturing a semiconductor device of a Second Embodiment.

In the First Embodiment, after Step S12 (the process of forming the semiconductor layer EP1), the sidewall spacer SW2 is formed in Step S13, and then Step S14 (the process of forming the metal silicide layer MS) is performed.

In contrast, in the present Second Embodiment, the process of forming the sidewall spacer SW2 in Step S13 is omitted. That is, in the present Second Embodiment, after Step S12 (the process of forming the semiconductor layer EP1), Step S14 (the process of forming the metal silicide layer MS) is performed, without performing Step S13 (the process of forming the sidewall spacer SW2). Except for this process, the Second Embodiment is basically the same as the First Embodiment.

Hereinafter, the present Second Embodiment will be explained in detail with a focus on different points from the First Embodiment, specifically with reference to the drawings.

Figure 27:
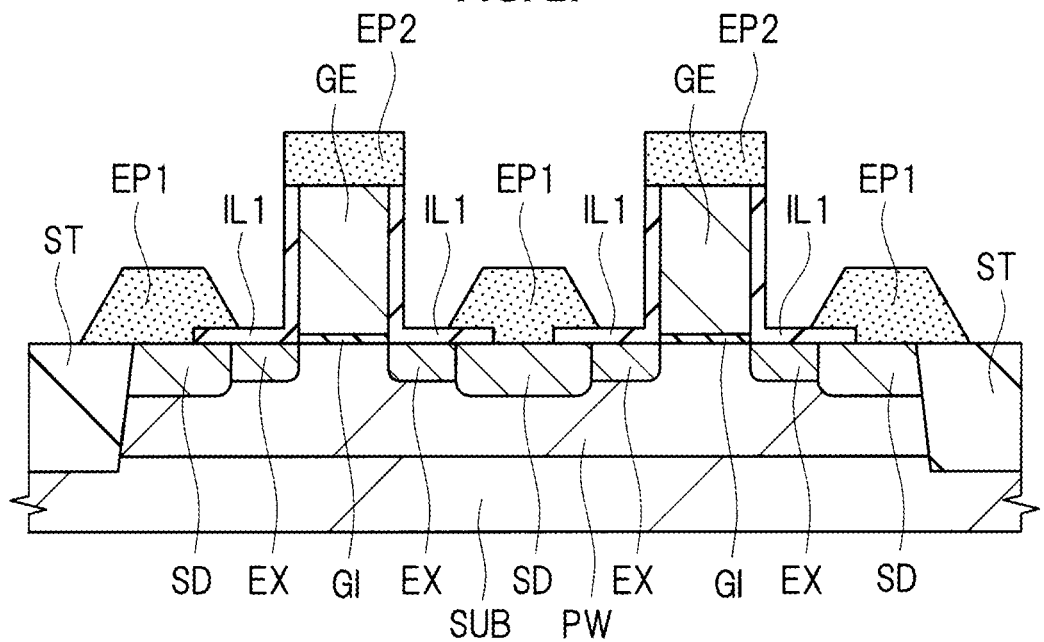
FIG. 27 is an essential part cross-sectional view in a manufacturing process of a semiconductor device of a Second Embodiment.

In the present Second Embodiment, processes up to Step S11 (the process of forming the semiconductor layer EP1) are performed in the same manner as in the First Embodiment, to obtain a structure in FIG. 27, the same as that in FIG. 14. Processes up to obtaining the structure in FIG. 27 are the same as those in the First Embodiment, and repeated explanation thereof is omitted here.

Figure 28:
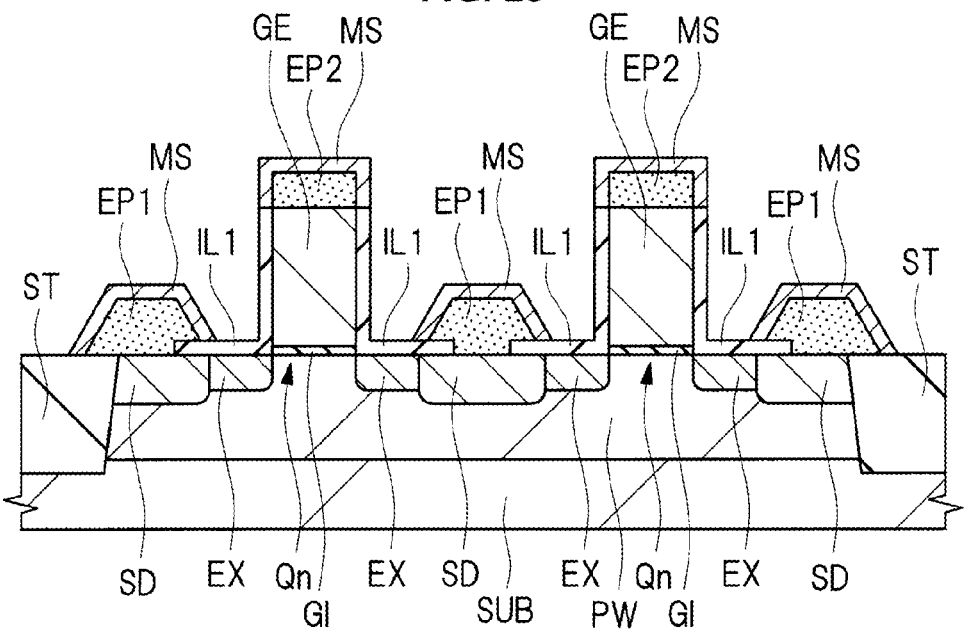
FIG. 28 is an essential part cross-sectional view in the process of manufacturing the semiconductor device following FIG. 27.

In the present Second Embodiment, after obtaining the structure in FIG. 27, Step S14 is performed without performing Step S13 (the process of forming the sidewall spacer SW2) to form, as shown in FIG. 28, the metal silicide layer MS over the surface (the upper layer part) of the semiconductor layers EP1 and EP2. Since the process of forming the metal silicide layer MS in Step S14 is the same as that in the First Embodiment, repeated explanation thereof is omitted here.

Subsequent processes are, in the present Second Embodiment, too, basically the same as those in the First Embodiment.

Figure 29:
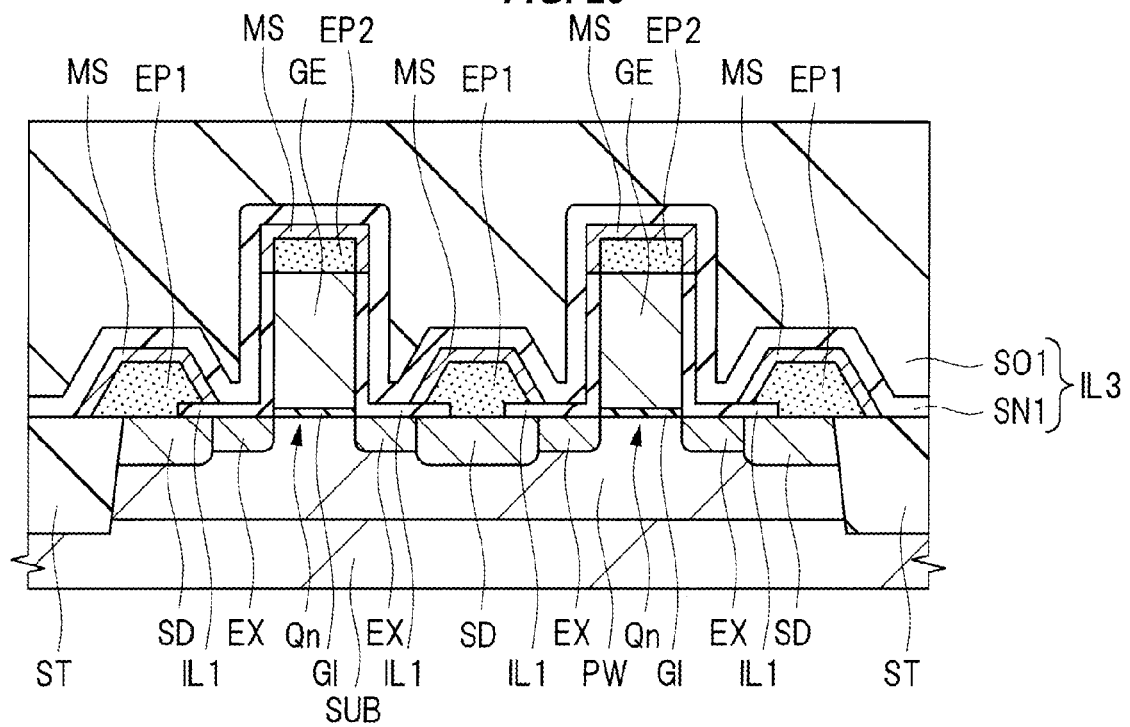
FIG. 29 is an essential part cross-sectional view in the process of manufacturing the semiconductor device following FIG. 28.
Figure 30:
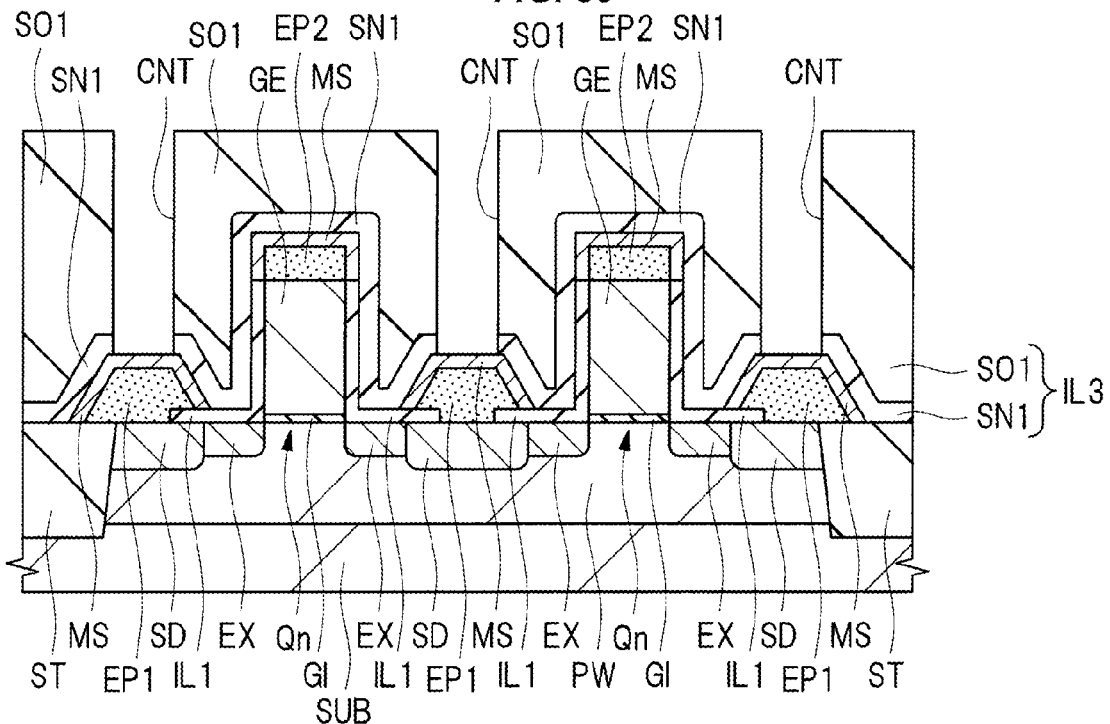
FIG. 30 is an essential part cross-sectional view in the process of manufacturing the semiconductor device following FIG. 29.
Figure 31:
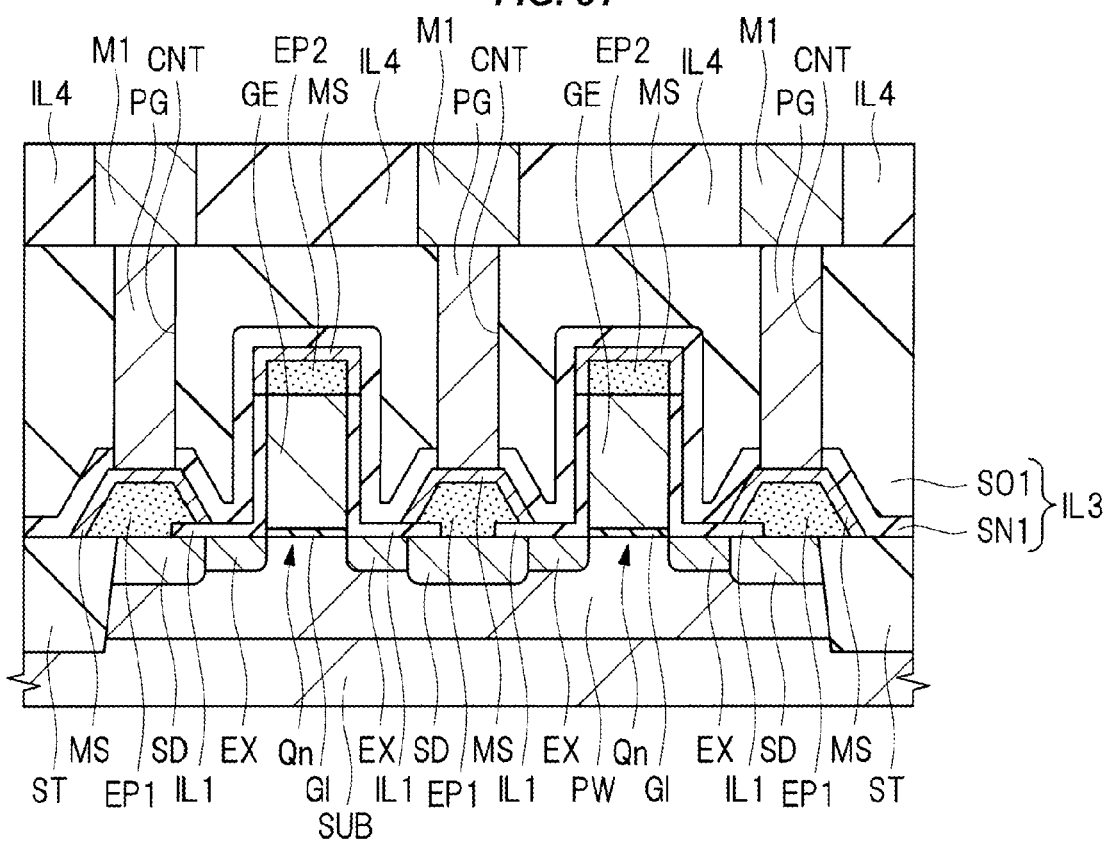
FIG. 31 is an essential part cross-sectional view in the process of manufacturing the semiconductor device following FIG. 30.

That is, as shown in FIG. 29, over the main surface (the whole main surface) of the semiconductor substrate, the insulating film IL3 is formed as the interlayer insulating film so as to cover the gate electrode GE, the semiconductor layers EP1 and EP2, and the metal silicide layer MS. Since no sidewall spacer SW2 is formed, the sidewall spacer SW2 is not interposed between the insulating film IL1 and the insulating film IL3, and the surface of the insulating film IL1 in a part not covered with the semiconductor layer EP1 and the metal silicide layer MS contacts the insulating film IL3. Then, in the same manner as in the First Embodiment, as shown in FIG. 30, the contact hole CNT is formed in the insulating film IL3, and, as shown in FIG. 31, the plug PG is formed (embedded) in the contact hole CNT. Then, in the same manner as in the First Embodiment, over the insulating film IL3 in which the plug PG is embedded, an insulating film IL4 for forming wiring is formed, a wiring trench is formed in the insulating film IL4, and wiring M1 is formed (embedded) in the wiring trench.

The present Second Embodiment can also give the effect as described in the First Embodiment. Furthermore, in the present embodiment, it is possible, to the extent that the sidewall spacer SW2 is not formed, to furthermore suppress or prevent such a phenomenon that the thickness of the metal film ME formed over the semiconductor layer EP1 between the gate electrodes GE adjacent closely to each other in the gate length direction becomes smaller than the thickness of the metal film ME in other regions. Consequently, it is possible to form more appropriately the metal silicide layer MS, and to furthermore suppress or prevent the generation of formation fault of the metal silicide layer MS.

On the other hand, in the First Embodiment, by performing the process of forming the sidewall spacer SW2 in Step S13, following effects can be obtained.

That is, in the First Embodiment, since the sidewall spacer SW2 is formed, even if deviation of the contact hole CNT (shift of the formation position of the contact hole CNT from the design) is generated when forming the contact hole CNT, exposure of the n⁻-type semiconductor region EX from the contact hole CNT can more appropriately be prevented because of the existence of the sidewall spacer SW2. Further, in the First Embodiment, since the sidewall spacer SW2 is formed, when introducing an impurity into the semiconductor layer EP1 by ion implantation after forming the semiconductor layer EP1, the sidewall spacer SW2 functions as an ion implantation-blocking mask to make it possible to prevent more appropriately additional implantation of the impurity up to the n⁻-type semiconductor region EX. In this case, it is preferable to implant ions into the semiconductor layer EP1 after forming the sidewall spacer SW2. It is also preferable, in order to enhance these effects, the side end part side in the sidewall spacer SW2 (the side opposite to the side adjacent to the gate electrode GE) has run over the semiconductor layer EP1. That is, it is preferable that the side end part of the sidewall spacer SW2 (the side face lower part on the side opposite to the side adjacent to the gate electrode GE) lies over the semiconductor layer EP1.

(Third Embodiment)

FIGS. 32 to 41 are essential part cross-sectional views in the process of manufacturing a semiconductor device of a Third Embodiment.

In the First Embodiment, when forming the semiconductor layer EP1 on the exposed face of the semiconductor substrate SUB in Step S12, the semiconductor layer EP2 is also formed on the gate electrode GE. In contrast, in the present Third Embodiment, it is so configured that an epitaxial layer (an epitaxial semiconductor layer) is not to be formed over the gate electrode GE when forming the semiconductor layer EP1 on the exposed face of the semiconductor substrate SUB in Step S12.

Further, in the First Embodiment, the n⁺-type semiconductor region SD is formed over the semiconductor substrate SUB. In contrast, in the present Third Embodiment, the formation of the n⁺-type semiconductor region SD is omitted. Consequently, in the present Third Embodiment, the n⁻-type semiconductor region EX extends (elongates) up to the region in which the n⁺-type semiconductor region SD is formed in the First Embodiment in the semiconductor substrate SUB, and the semiconductor layer EP1 grows on the n⁻-type semiconductor region EX.

Except for these, the present Third Embodiment is basically the same as the First Embodiment.

Hereinafter, the present Third Embodiment will be explained in detail with a focus on different points from the First Embodiment, specifically with reference to the drawings.

In the present Third Embodiment, too, processes up to Step S4 (the process of forming the insulating film GI) are performed, in the same manner as in the First Embodiment, to obtain the structure in FIG. 5. Then, in the present Third Embodiment, as shown in FIG. 32, a silicon film PS such as a polycrystalline silicon (polysilicon) film is formed over the whole main surface of the semiconductor substrate SUB (that is, over the insulating film GI) as an electroconductive film for forming the gate electrode, in the same manner as in the First Embodiment. It is preferable to introduce an impurity of the conductivity type into the silicon film PS in deposition or after deposition to be made into a semiconductor film (a doped polysilicon film) with a low resistivity.

Then, as shown in FIG. 33, an impurity is implanted in a high concentration into an upper layer part (a surface layer part) of the silicon film PS by ion implantation to form an impurity-implanted layer PS1. Consequently, the upper layer part (the surface layer part) of the silicon film PS becomes an impurity-implanted layer PS1 having been implanted with an impurity in a high concentration. The impurity that is implanted into the impurity-implanted layer PS1 is, preferably, As (arsenic), boron (B), phosphorous (P), antimony (Sb), nitrogen (N), argon (Ar), oxygen (O) or the like, and one or more kinds of these are ion implanted. Implantation energy in the ion implantation for forming the impurity-implanted layer PS1 may be set, for example, to be around 1 to 10 keV, and dose amount may be set, for example, to be around $5\times10^{14}/cm^2$. The thickness of the silicon film PS in the deposition of the silicon film PS may be set, for example, to be around 60 to 150 nm, and the thickness of the impurity-implanted layer PS1 may be set, for example, to be around 10 to 30 nm. To the extent that an impurity is ion implanted into the silicon film PS in the process in FIG. 33, the impurity concentration in the impurity-implanted layer PS1 is higher than the impurity concentration in the silicon film PS below the impurity-implanted layer PS1. The impurity-implanted layer PS1 is formed in order that the semiconductor layer EP2 does not grow later over the gate electrode GE.

Then, by patterning the silicon film PS with the impurity-implanted layer PS1 formed in the upper layer part thereof, in the same manner as in the First Embodiment, using a photolithographic method and a dry etching method, as shown in FIG. 34, the gate electrode GE is formed. In this case, it results in a state, in which the gate electrode GE has the patterned silicon film PS (the silicon film PS with the impurity-implanted layer PS1 formed in the upper layer part thereof) and the upper part (the surface layer part) of the gate electrode GE has the impurity-implanted layer PS1. The gate electrode GE is formed over the semiconductor substrate SUB (the p-type well PW) via the insulating film GI as the gate insulating film.

Then, as shown in FIG. 35, Step S6 is performed in the same manner as in the First Embodiment to form the n$^-$-type semiconductor region EX. In the present Third Embodiment, too, Step S6 (the process of forming the n$^-$-type semiconductor region EX) is the same as that in the First Embodiment, and repeated explanation thereof is omitted.

Figure 36:
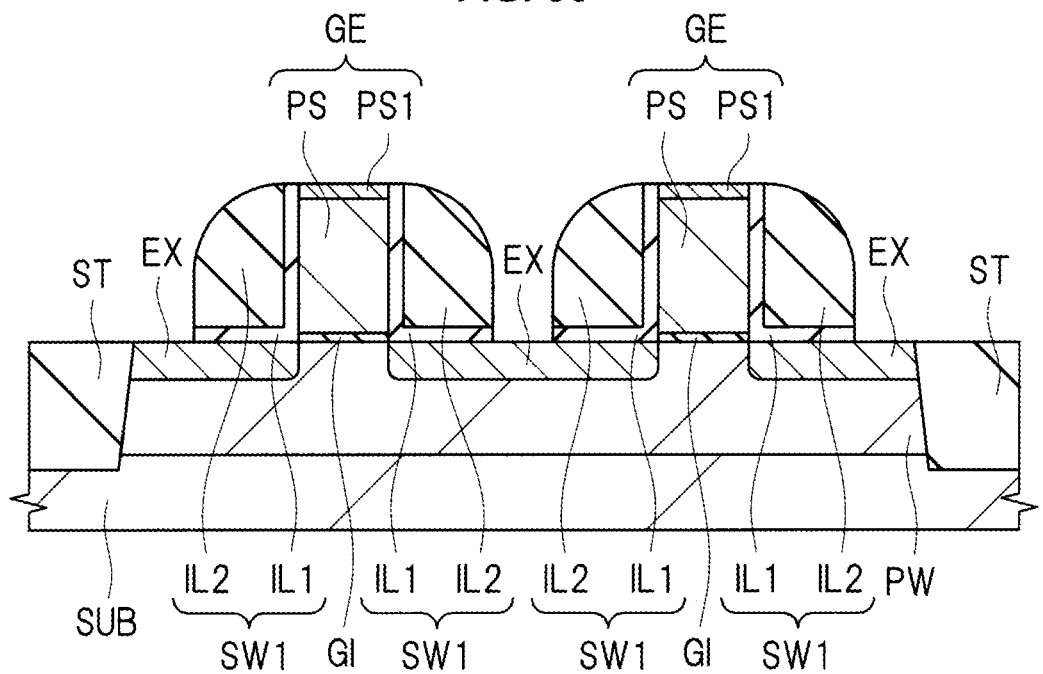
FIG. 36 is an essential part cross-sectional view in the process of manufacturing the semiconductor device following FIG. 35.

Then, as shown in FIG. 36, Steps S7, S8 and S9 are performed in the same manner as those in the First Embodiment to form the sidewall spacer SW1 having the stacked film of the insulating film IL1 and the insulating film IL2 over the insulating film IL1, over the side wall of the gate electrode GE. The process of forming the sidewall spacer SW1 (that is, Steps S7, S8 and S9) and the configuration of the sidewall spacer SW1 are, in the present Third Embodiment, too, the same as those in the First Embodiment, and repeated explanation thereof is omitted here.

In the First Embodiment, after forming the sidewall spacer SW1 through Steps S7, S8 and S9, ion implantation is performed in Step S10 to form the n$^+$-type semiconductor region SD, and, after that, Step S11 (the process of removing the insulating film IL2) is performed. In contrast, in the present Third Embodiment, after forming the sidewall spacer SW1 through Step S7, S8 and S9, the process of removing the insulating film IL2 in Step S11 is performed, without performing Step S10 (the process of forming the n$^+$-type semiconductor region SD).

Figure 37:
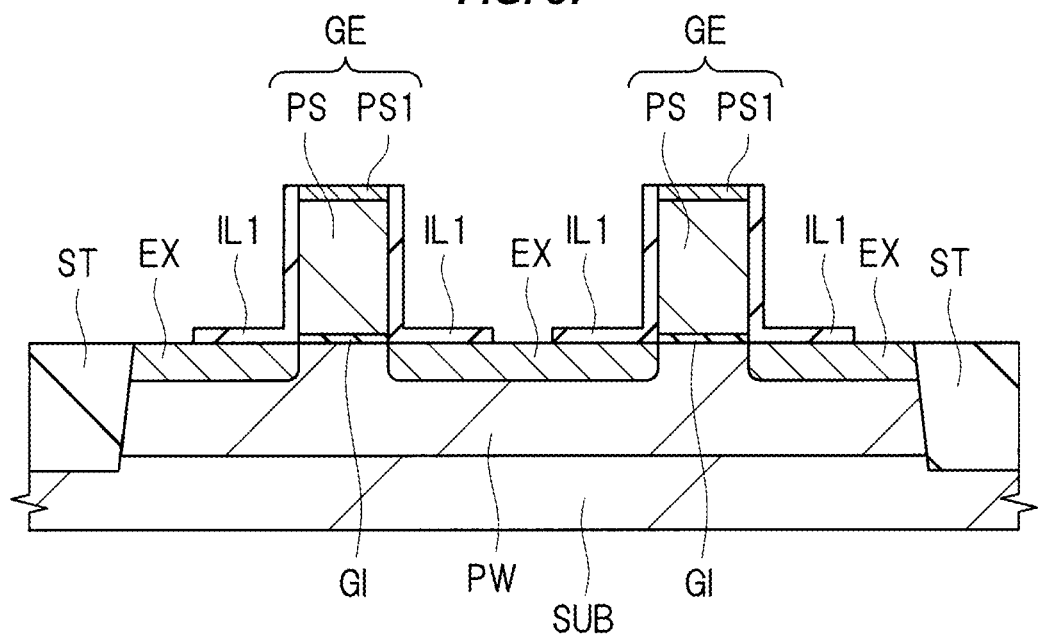
FIG. 37 is an essential part cross-sectional view in the process of manufacturing the semiconductor device following FIG. 36.

That is, after forming the sidewall spacer SW1, without performing Step S10 (the process of forming the n$^+$-type semiconductor region SD), as shown in FIG. 37, Step S11 is performed to etch and remove the insulating film IL2 configuring the sidewall spacer SW1. Step S11 (the process of removing the insulating film IL2) is, in the present Third Embodiment, too, the same as that in the First Embodiment, and repeated explanation thereof is omitted here.

Then, as shown in FIG. 38, Step S12 is performed to form the semiconductor layer EP1, which is an epitaxial layer (an epitaxially grown layer, epitaxial semiconductor layer), on the semiconductor substrate SUB by epitaxial growth.

In Step S12, the semiconductor layer EP1 is formed by epitaxial growth. Therefore, the epitaxial layer (the semiconductor layer EP1) grows selectively on an exposed face (a Si face) of the semiconductor substrate SUB. Consequently, in Step S12, of the main surface of the semiconductor substrate SUB, on the Si face not covered with the gate insulating film (the insulating film GI) and the insulating film IL1 but exposed (the Si-exposed face), the epitaxial layer (the epitaxial layer to be the semiconductor layer EP1) grows selectively.

In the First Embodiment, since the upper face of the n$^+$-type semiconductor region SD (the Si face) is exposed from the insulating film IL1 in the step just before Step S12, in Step S12, the semiconductor layer EP1 grows selectively on the exposed face of the n$^+$-type semiconductor region SD (the exposed upper face). On the other hand, in the present Third Embodiment, the n$^+$-type semiconductor region SD is not formed, and the n$^-$-type semiconductor region EX extends to the region in which the n$^+$-type semiconductor region SD is formed in the First Embodiment. Consequently, in the present Third Embodiment, the upper face (the Si face) of apart of the n$^-$-type semiconductor region EX is exposed from the insulating film IL1 in the step just before Step S12, and, in Step S12, the semiconductor layer EP1 grows selectively on the exposed face (the exposed upper face) of the n$^-$-type semiconductor region EX.

In the present Third Embodiment, the state where a part of the semiconductor layer EP1 runs (extends) over the insulating film IL1 is the same as that in the First Embodiment, and repeated explanation thereof is omitted here.

In the present Third Embodiment, the upper layer part of the gate electrode GE is the impurity-implanted layer PS1, and, over the impurity-implanted layer PS1, an epitaxial layer (an epitaxial semiconductor layer) does not grow in Step S12. Therefore, in the present Third Embodiment, no semiconductor layer EP2 is formed over the gate electrode GE.

That is, the impurity-implanted layer PS1 is previously formed in the upper layer part of the gate electrode GE, and the kind and concentration of the impurity having implanted in the impurity-implanted layer PS1 are set to be such a kind and concentration of an impurity that can hinder (suppress) the epitaxial growth on the impurity-implanted layer PS1. Consequently, it is possible that an epitaxial layer (an epitaxial semiconductor layer) such as the semiconductor layer EP2 is not to be formed over the impurity-implanted layer PS1 (that is, over the gate electrode GE) in Step S12. From this viewpoint, as to the kind and dose amount of the impurity in the ion implantation for forming the impurity-implanted layer PS1, the above-exemplified conditions can favorably be employed.

Then, in the present Third Embodiment, too, Step S13 is performed in the same manner as in the First Embodiment to form, as shown in FIG. 39, the sidewall spacer SW2 over the side wall of the gate electrode GE via the insulating film IL1. In the present Third Embodiment, since the process of forming the sidewall spacer SW2 (that is, Step S13) and the configuration of the sidewall spacer SW2 are also the same as those in the First Embodiment, repeated explanation thereof is omitted here.

The semiconductor layer EP1 functions as the semiconductor region for source/drain of the MISFET and has the same conductivity type (here, the n-type) as the n$^-$-type semiconductor region EX, but preferably has an impurity concentration higher than that in the n$^-$-type semiconductor region EX.

For this purpose, by introducing a doping gas into a deposition gas when allowing the semiconductor layer EP1 to grow epitaxially in Step S12 to form (grow) the semiconductor layer EP1 in which an impurity of the conductivity type (here, an n-type impurity such as phosphorous (P) or arsenic (As)) is introduced in a high concentration, it is possible to make the semiconductor layer EP1 have a higher impurity concentration (than the n$^-$-type semiconductor region EX) in the step of forming the semiconductor layer EP1. Alternatively, after forming the semiconductor layer EP1 by epitaxial growth in Step S12, by introducing (implanting) an impurity (here, an n-type impurity such as phosphorous (P) or arsenic (As)) into the semiconductor layer EP1 by ion implantation, it is possible to make the semiconductor layer EP1 have an impurity concentration higher (than that in the n$^-$-type semiconductor region EX). Further, if necessary, an impurity for applying stress or for suppressing diffusion of the impurity may additionally be implanted into the semiconductor layer EP1. Meanwhile, when an impurity is to be ion implanted into the semiconductor layer EP1, by reason of the same reason as described in the First Embodiment, it is preferable to perform the ion implantation of an impurity into the semiconductor layer EP1 after forming the sidewall spacer SW2 in Step S13 (and before the salicide process in Step S14).

Figure 40:
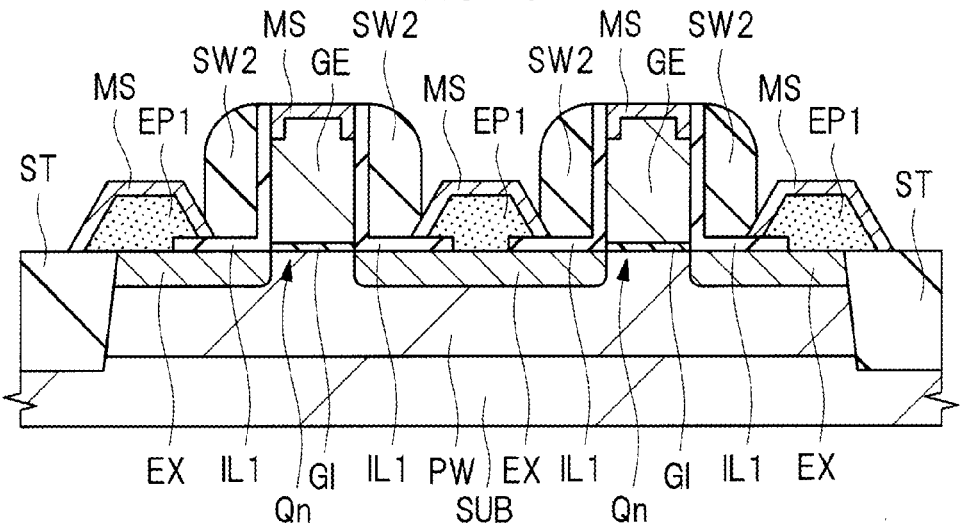
FIG. 40 is an essential part cross-sectional view in the process of manufacturing the semiconductor device following FIG. 39.

Then, in the present Third Embodiment, Step S14 is performed in the same manner as in the First Embodiment to form, as shown in FIG. 40, the metal silicide layer MS over the surface (the upper layer part) of the semiconductor layer EP1 and the upper face of the gate electrode GE.

The process of forming the metal silicide layer MS in Step S14 is basically the same as that in the First Embodiment, but, since the semiconductor layer EP2 is not formed over the gate electrode GE in the present Third Embodiment, it differs from the First Embodiment in that the metal silicide layer MS is formed over the upper face of the gate electrode GE instead of the upper face of the semiconductor layer EP2.

In the present Third Embodiment, too, subsequent processes are basically the same as those in the First Embodiment.

Figure 41:
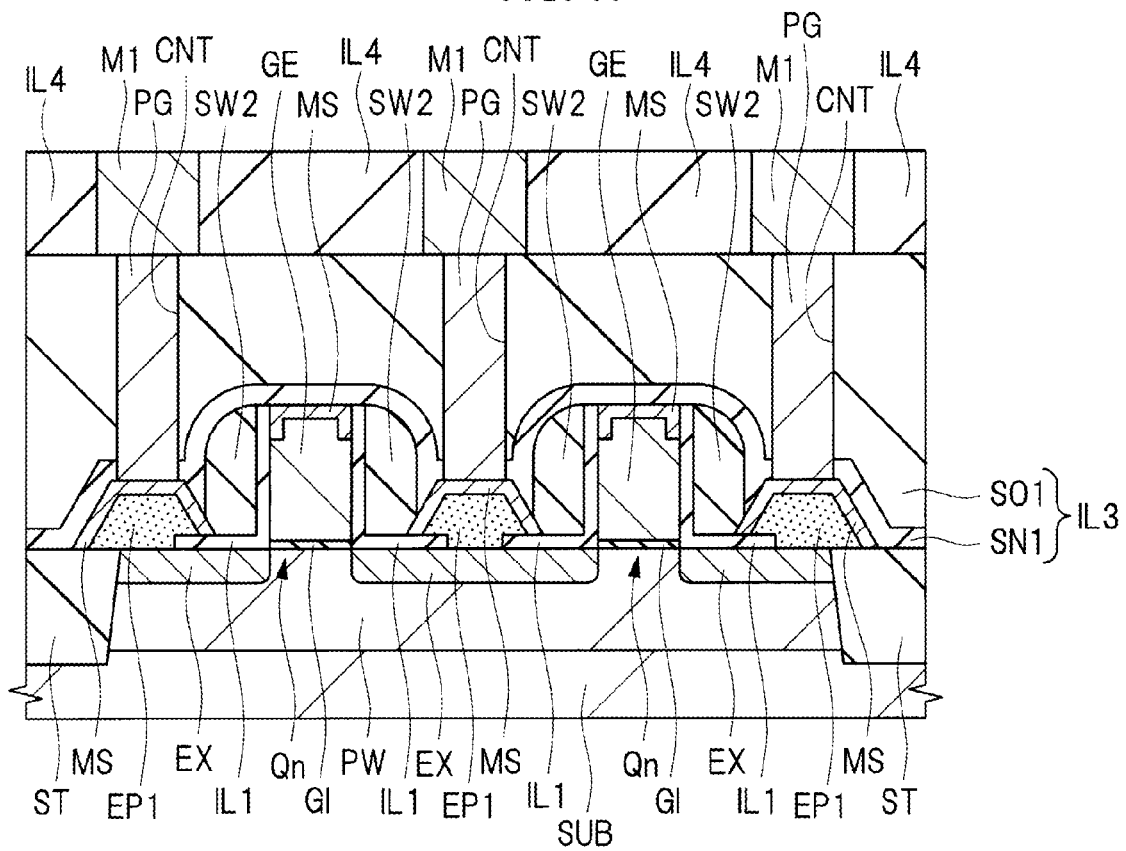
FIG. 41 is an essential part cross-sectional view in the process of manufacturing the semiconductor device following FIG. 40.

That is, also in the present Third Embodiment, as shown in FIG. 41, the insulating film IL3 is formed as an interlayer insulating film over the main surface of the semiconductor substrate SUB so as to cover the gate electrode GE, semiconductor layer EP1, metal silicide layer MS and sidewall spacer SW2, the contact hole CNT is formed in the insulating film IL3, and the plug PG is formed (embedded) in the contact hole CNT, in the same manner as that in the First Embodiment. Then, in the same manner as in the First Embodiment, the insulating film IL4 for forming wiring is formed over the insulating film IL3 in which the plug PG is embedded, a wiring trench is formed in the insulating film IL4, and the wiring M1 is formed (embedded) in the wiring trench.

In the present Third Embodiment, in addition to the effect given in the First Embodiment, following effects can also be given.

That is, in the present Third Embodiment, it is so configured that an epitaxial layer (an epitaxial semiconductor layer) is not to be formed over the gate electrode GE.

When an epitaxial layer is formed on the gate electrode GE and the epitaxial layer grows not only in the upward direction but also in lateral directions, the planar dimension (the planar area) of the epitaxial layer on the gate electrode GE becomes larger than the planar dimension (the planar area) of the gate electrode GE. In this case, when the deviation of the contact hole CNT to be formed over the semiconductor layer EP1 is generated, there is such a risk that the plug PG to be coupled to the semiconductor layer EP1 lies close to or contacts the epitaxial layer on the gate electrode GE. The state where the plug PG lies close to the epitaxial layer on the gate electrode GE causes the leak current, or, when the plug PG contacts the epitaxial layer on the gate electrode GE, short circuit is brought about. This leads to the lowering of the reliability and yield of the semiconductor device.

In contrast, in the present Third Embodiment, it is so configured that an epitaxial layer (an epitaxial semiconductor layer) is not to be formed over the gate electrode GE. Consequently, an epitaxial layer larger than the planar dimension (the planar area) of the gate electrode GE is never formed over the gate electrode GE. Therefore, even if the deviation of the contact hole CNT is generated, the possibility that the plug PG stands close to or contacts the gate electrode GE can be lowered. Consequently, it is possible to suppress or prevent that the plug PG stands close to the gate electrode GE to generate the leak current, or that the plug PG contacts the gate electrode GE to result in a short circuit. Consequently, the reliability and yield of the semiconductor device can be improved furthermore.

In the present Third Embodiment, the formation of the $n^+$-type semiconductor region SD is omitted and the semiconductor layer EP1 is grown on the $n^-$-type semiconductor region EX. An epitaxial layer tends to grow hardly and grows at a slower speed, when the impurity concentration in the semiconductor region of the foundation is high. In the present Third Embodiment, the semiconductor layer EP1 is grown epitaxially not on the $n^+$-type semiconductor region SD of a high impurity concentration but on the $n^-$-type semiconductor region EX of a low impurity concentration. Therefore, the semiconductor layer EP1 is grown easily, and the growth speed of the semiconductor layer EP1 can be enhanced. Consequently, it is possible to shorten the time necessary for the process of forming the semiconductor layer EP1, and to improve the throughput of the semiconductor device.

The difference in the growth speed of an epitaxial layer growing on an n-type semiconductor region and the growth speed of an epitaxial layer growing on an p-type semiconductor region tends to become larger when impurity concentrations in these semiconductor regions to be foundations are higher. In the present Third Embodiment, the epitaxial layer for source/drain (the semiconductor layer EP1) is epitaxially grown not on the $n^+$-type semiconductor region SD of a high impurity concentration but on the $n^-$-type semiconductor region EX of a low impurity concentration. Consequently, when forming an n-channel type MISFET and a p-channel type MISFET over the identical semiconductor substrate SUB, the difference between the growth speed of the epitaxial layer for source/drain of the n-channel type MISFET (the semiconductor layer EP1) and the growth speed of the epitaxial layer for source/drain of the p-channel type MISFET (the semiconductor layer EP1) can be made smaller. Consequently, the difference between the thickness of the epitaxial layer for source/drain of the n-channel type MISFET (the semiconductor layer EP1) and the thickness of the epitaxial layer for source/drain of the p-channel type MISFET (the semiconductor layer EP1) can be made smaller.

Further, in the present Third Embodiment, a semiconductor region having a higher impurity concentration and larger junction depth than the $n^-$-type semiconductor region EX (one corresponding to the $n^+$-type semiconductor region SD) is not formed over the semiconductor substrate SUB. Consequently, the short channel effect can furthermore be reduced. In addition, it is advantageous for the miniaturization of semiconductor elements.

As described above, in the First and Second Embodiments, when the semiconductor layer (the epitaxial semiconductor layer) EP1 is formed in Step S12, the semiconductor layer (the epitaxial semiconductor layer) EP2 is formed also on the gate electrode GE. On the other hand, in the present Third Embodiment, and Fourth and Fifth Embodiments to be described later, it is so configured that, when forming the semiconductor layer (the epitaxial semiconductor layer) EP1 in Step S12, an epitaxial layer (an epitaxial semiconductor layer) is not to be formed over the gate electrode GE. As a technique for realizing this, in the present Third Embodiment, it is so configured that the gate electrode GE formed in Step S5 includes a silicon layer having the ion-implanted layer and, when forming the semiconductor layer EP1 in Step S12, an epitaxial layer (an epitaxial semiconductor layer) is not to be formed over the gate electrode GE. In the Fourth Embodiment to be described later, it is so configured that the gate electrode GE formed in Step S5 is made to be one having a stacked structure in which an insulating film (an insulating film IL5 to be described later) is stacked in an upper part and an epitaxial layer (an epitaxial semiconductor layer) is not to be formed over the gate electrode GE when forming the semiconductor layer EP1 in Step S12. In the Fifth Embodiment to be described later, it is so configured that the gate electrode GE formed in Step S5 includes a metal (that is, the gate electrode GE is made to be a metallic gate electrode) and an epitaxial layer (an epitaxial semiconductor layer) is not to be formed over the gate electrode GE when forming the semiconductor layer EP1 in Step S12.

The present Third Embodiment, and Fourth and Fifth Embodiments to be described later have such a characteristic that an epitaxial layer (an epitaxial semiconductor layer) is not to be formed over the gate electrode GE in Step S12 and a characteristic that the semiconductor layer EP1 is grown on the n⁻-type semiconductor region EX while omitting the formation of the n⁺-type semiconductor region SD, and one or both of these can be applied to the First and Second Embodiments.

(Fourth Embodiment)

FIGS. 42 to 46 are essential part cross-sectional views in the process of manufacturing a semiconductor device in a Fourth Embodiment.

In the Third Embodiment, it is so configured that an epitaxial layer (an epitaxial semiconductor layer) is not to be formed over the gate electrode GE by providing the impurity-implanted layer PS1 in the upper part of the gate electrode GE. In contrast, in the present Fourth Embodiment, it is so configured that an epitaxial layer (an epitaxial semiconductor layer) is not to be formed over the gate electrode GE by providing an insulating film IL5 in the upper part of the gate electrode GE. Except for that, the present Fourth Embodiment is basically the same as the Third Embodiment.

Hereinafter, the present Fourth Embodiment will be explained specifically with reference to the drawings.

Figure 42:
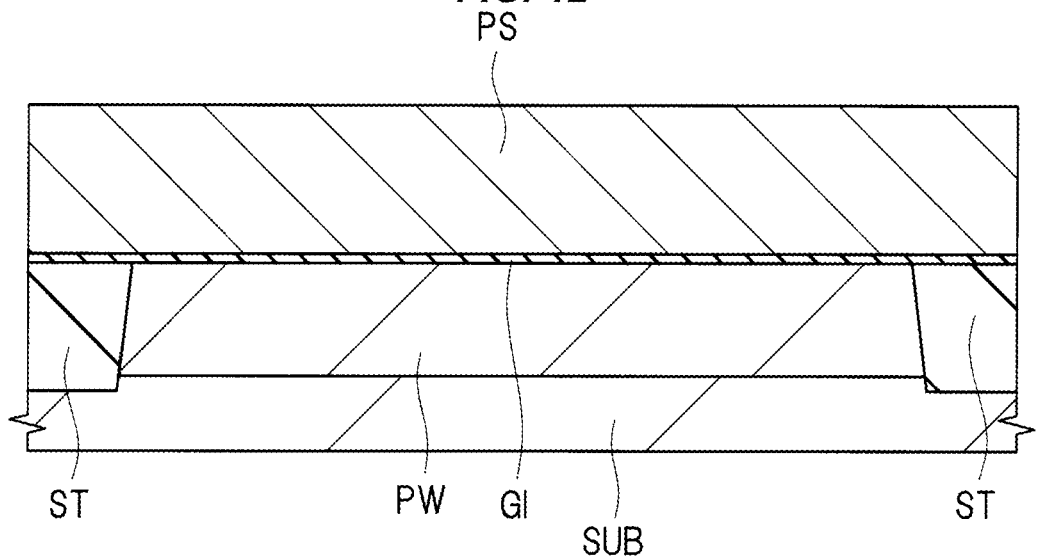
FIG. 42 is an essential part cross-sectional view in a manufacturing process of a semiconductor device of a modification of the Third Embodiment.

In the present Fourth Embodiment, too, in the same manner as that in the First Embodiment, processes up to Step S4 (the process of forming the insulating film GI) are performed to give the structure in FIG. 5. Then, in the present Fourth Embodiment, too, as shown in FIG. 42, in the same manner as that in the First Embodiment, the silicon film PS such as a polycrystalline silicon (a polysilicon) film is formed over the whole main surface of the semiconductor substrate SUB (that is, over the insulating film GI) as an electroconductive film for forming the gate electrode. It is preferable to introduce an impurity into the silicon film PS in deposition or after deposition to be a semiconductor film of low resistivity (a doped polysilicon film).

Figure 43:
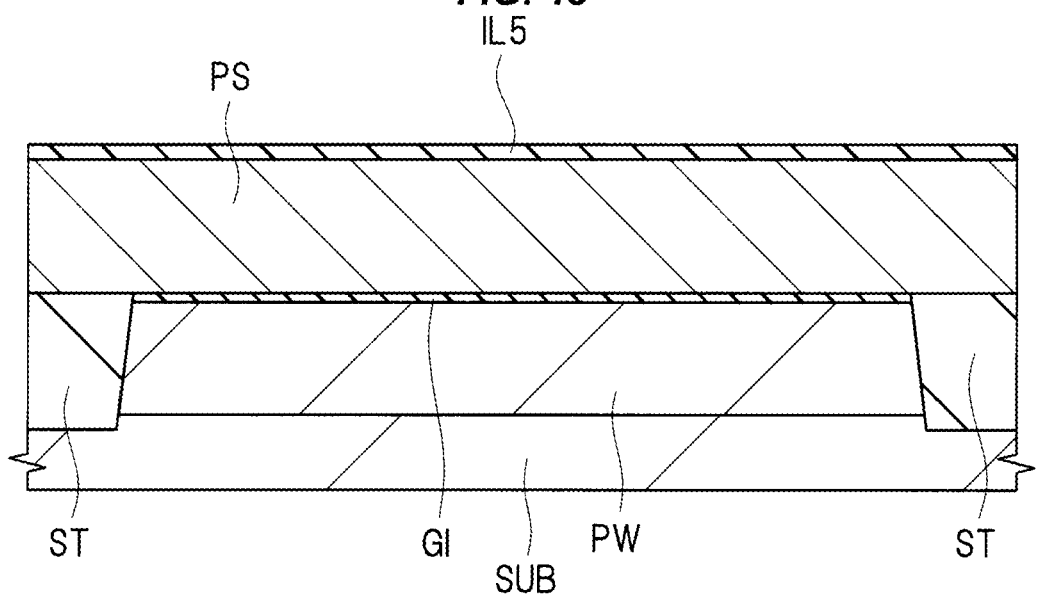
FIG. 43 is an essential part cross-sectional view in the process of manufacturing the semiconductor device following FIG. 42.

Then in the present Fourth Embodiment, as shown in FIG. 43, the insulating film (the insulating layer) IL5 is formed over the whole main surface of the semiconductor substrate SUB, that is, over the silicon film PS. The insulating film IL5 is preferably formed of a material different from the material of the insulating film IL2 to be formed later, and, for example, may be a silicon nitride film. The insulating film IL5 is formed in order not to allow the semiconductor layer EP2 to grow over the gate electrode GE later.

Figure 44:
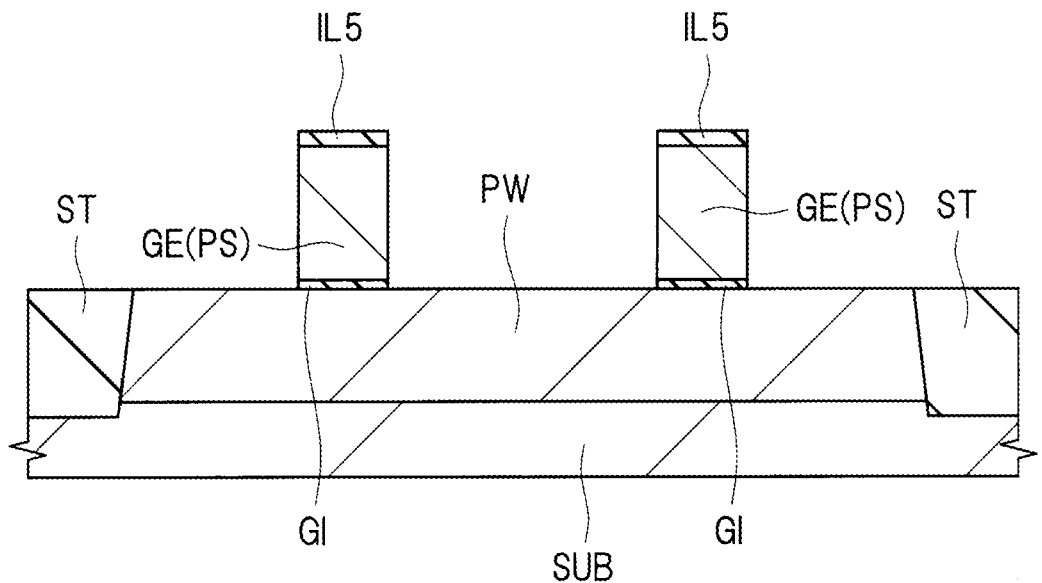
FIG. 44 is an essential part cross-sectional view in the process of manufacturing the semiconductor device following FIG. 43.

Then, by patterning a stacked film of the silicon film PS and the insulating film IL5 over the silicon film PS using a photolithographic method and a dry etching method, as shown in FIG. 44, the gate electrode GE is formed. On this occasion, the use of the insulating film IL5 as a hard mask may be possible. The gate electrode GE contains the patterned silicon film PS, to lead to such a state that the insulating film IL5 (the planar-shaped insulating film IL5 similar to the gate electrode GE containing the silicon film PS) is formed in the upper part of the gate electrode GE. That is, the gate electrode GE is to have a stacked structure in which the insulating film IL5 is stacked in the upper part. The gate electrode GE is formed over the semiconductor substrate SUB (the p-type well PW) via the insulating film GI as the gate insulating film. Since the insulating film IL5 is formed of an insulator, it is a part that does not function as a gate electrode of the MISFET, and the stacked structure of the silicon film PS and the insulating film IL5 over the silicon film PS may also be considered as the gate electrode (a gate structure).

Figure 45:
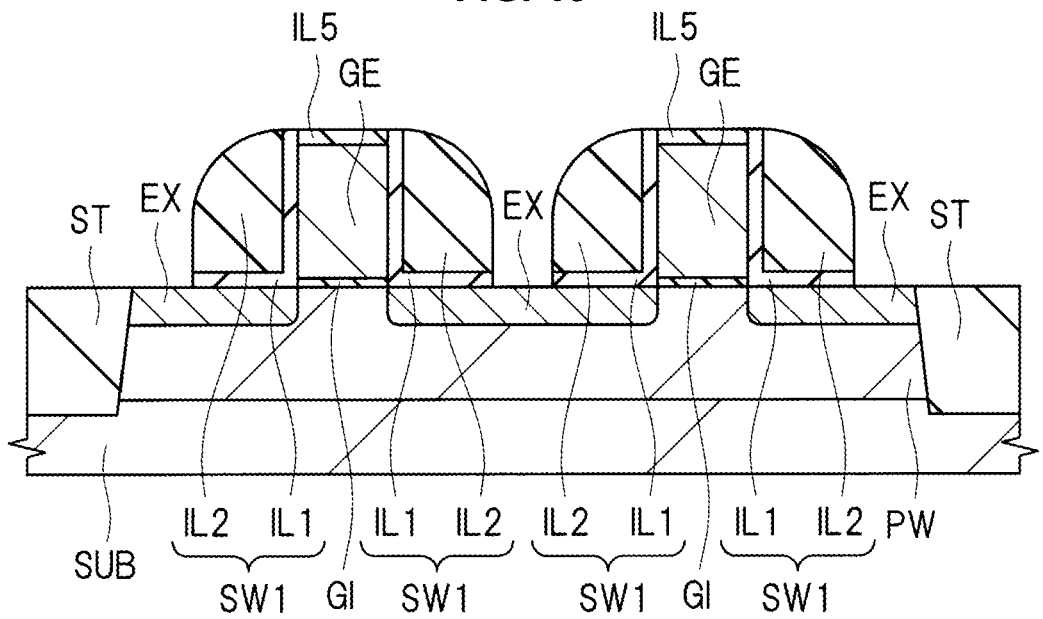
FIG. 45 is an essential part cross-sectional view in the process of manufacturing the semiconductor device following FIG. 44.

Then, as shown in FIG. 45, Step S6 is performed in the same manner as that in the First Embodiment to form the n⁻-type semiconductor region EX. In the present Fourth Embodiment, too, Step S6 (the process of forming the n⁻-type semiconductor region EX) is the same as that in the First Embodiment, and repeated explanation thereof is omitted here.

Then, Steps S7, S8 and S9 are performed in the same manner as that in the First Embodiment to form, over the side wall of the gate electrode GE, the sidewall spacer SW1 containing the stacked film of the insulating film IL1 and the insulating film IL2 over the insulating film IL1. In the present Fourth Embodiment, too, the process of forming the sidewall spacer SW1 (that is, Steps S7, S8 and S9) and the configuration of the sidewall spacer SW1 are the same as those in the First Embodiment and repeated explanation thereof is omitted here.

Then, in the present Fourth Embodiment, too, in the same manner as that in the Third Embodiment, the sidewall spacer SW1 is formed in Steps S7, S8 and S9, and, after that, the process of removing the insulating film IL2 in Step S11 is performed, without performing Step S10 (the process of forming the n⁺-type semiconductor region SD).

Figure 46:
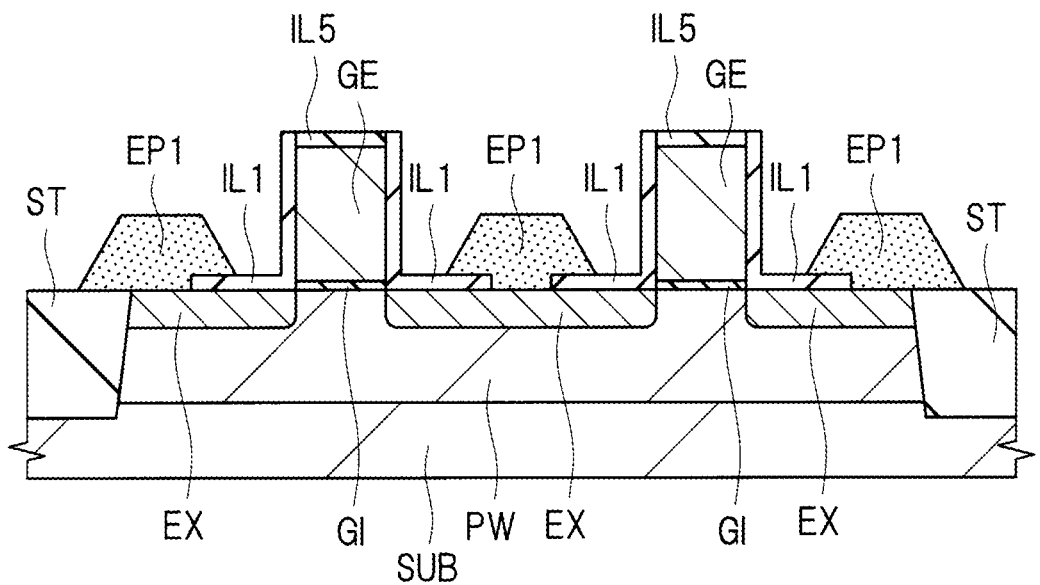
FIG. 46 is an essential part cross-sectional view in the process of manufacturing the semiconductor device following FIG. 45.

That is, after forming the sidewall spacer SW1, the insulating film IL2 configuring the sidewall spacer SW1 is etched and removed, as shown in FIG. 46, by performing Step S11 without performing Step S10 (the process of forming the n⁺-type semiconductor region SD). Step S11 (the process of removing the insulating film IL2) is, in the present Fourth Embodiment, too, the same as that in the First Embodiment, and repeated explanation thereof is omitted here.

Meanwhile, in the present Fourth Embodiment, Step S11 (the process of removing the insulating film IL2) is performed in the state where the insulating film IL5 is formed over the gate electrode GE. Therefore, in Step S11 (the process of removing the insulating film IL2), the insulating film IL5 over the gate electrode GE is to be left in a layer shape so that the gate electrode GE (the silicon film PS configuring the gate electrode GE) is not exposed. Consequently, in Step S11 (the process of removing the insulating film IL2), preferably etching is performed under such etching conditions that the insulating films IL1 and IL5 are hard to etch as compared with the insulating film IL2. From this viewpoint, so as to secure the etching selection ratio of the insulating film IL2 relative to the insulating film IL5, the insulating film IL5 preferably contains a material different from the material of the insulating film IL2.

Then, Step S12 is performed to form the semiconductor layer EP1, which is an epitaxial layer (an epitaxially grown layer, epitaxial semiconductor layer), on the semiconductor substrate SUB by epitaxial growth.

In the Third Embodiment, it is so configured that, by providing the impurity-implanted layer PS1 in the upper part of the gate electrode GE, an epitaxial layer (an epitaxial semiconductor layer) does not grow over the gate electrode GE in Step S12. In contrast, in the present Fourth Embodiment, it is so configured that, by having formed the insulating film IL5 over the gate electrode GE, that is, by covering the upper face of the gate electrode GE with the insulating film IL5 so that the silicon film PS configuring the gate electrode GE is not exposed, an epitaxial layer (an epitaxial semiconductor layer) does not grow over the gate electrode GE in Step S12. That is, since the gate electrode GE has the stacked structure in which the insulating film IL5 is stacked in the upper part, an epitaxial layer (an epitaxial semiconductor layer) does not grow over the gate electrode GE in Step S12.

Consequently, in the same manner as that in the Third Embodiment, in the present Fourth Embodiment, too, an epitaxial layer (an epitaxial semiconductor layer, corresponding to the semiconductor layer EP2) is not formed over the gate electrode GE in Step S12. In the present Fourth Embodiment, too, the semiconductor layer EP1 is the same as that in the Third Embodiment. That is, in the same manner as that in the Third Embodiment, in the present Fourth Embodiment, too, the semiconductor layer EP1 grows selectively on the exposed face (the exposed upper face) of the $n^-$-type semiconductor region EX in Step S12, to lead to the state where a part of the semiconductor layer EP1 runs (extends) over the insulating film IL1.

In the present Fourth Embodiment, too, subsequent processes are basically the same as those in the Third Embodiment, and repeated explanation thereof is omitted here. Meanwhile, when performing Step S14 (the process of forming the metal silicide layer MS) in the state where the insulating film IL5 is left over the gate electrode GE, no metal silicide layer MS is formed over the gate electrode GE.

In the present Fourth Embodiment, too, approximately the same effect as that in the Third Embodiment can be given.

Meanwhile, in the present Fourth Embodiment, since the insulating film IL5 is formed over the gate electrode GE, the formation of an epitaxial layer (an epitaxial semiconductor layer) over the gate electrode GE can be prevented more surely as compared with the Third Embodiment. On the other hand, in the Third Embodiment, the metal silicide layer MS can be formed in the upper part of the gate electrode GE, which is more advantageous for making the resistance of the gate electrode GE lower and for reducing the contact resistance when coupling the plug PG to the gate electrode GE.

In the present Fourth Embodiment, after Step S12 (the epitaxial growth process) and before Step S14 (the process of forming the metal silicide layer MS), the insulating film IL5 may be removed from over the gate electrode GE. In this case, in Step S14 (the process of forming the metal silicide layer MS), the metal silicide layer MS can be formed also over the gate electrode GE.

(Fifth Embodiment)

FIGS. 47 to 50 are essential part cross-sectional views in the process of manufacturing a semiconductor device of a Fifth Embodiment.

In the Third Embodiment, it is so configured that an epitaxial layer (an epitaxial semiconductor layer) is not to be formed over the gate electrode GE by providing the impurity-implanted layer PS1 in the upper part of the gate electrode GE. Further, in the Fourth Embodiment, it is so configured that an epitaxial layer (an epitaxial semiconductor layer) is not to be formed over the gate electrode GE by providing the insulating film IL5 in the upper part of the gate electrode GE. In contrast, in the present Fifth Embodiment, it is so configured that an epitaxial layer (an epitaxial semiconductor layer) is not to be formed over the gate electrode GE by making the gate electrode GE be a metal gate electrode containing a metal (a metallic material). Further, one corresponding to the metal silicide layer MS is not formed over the gate electrode. Except for these, the present Fifth Embodiment is basically the same as the Third Embodiment.

Hereinafter, the present Fifth Embodiment will be explained in detail specifically with reference to the drawings.

Figure 47:
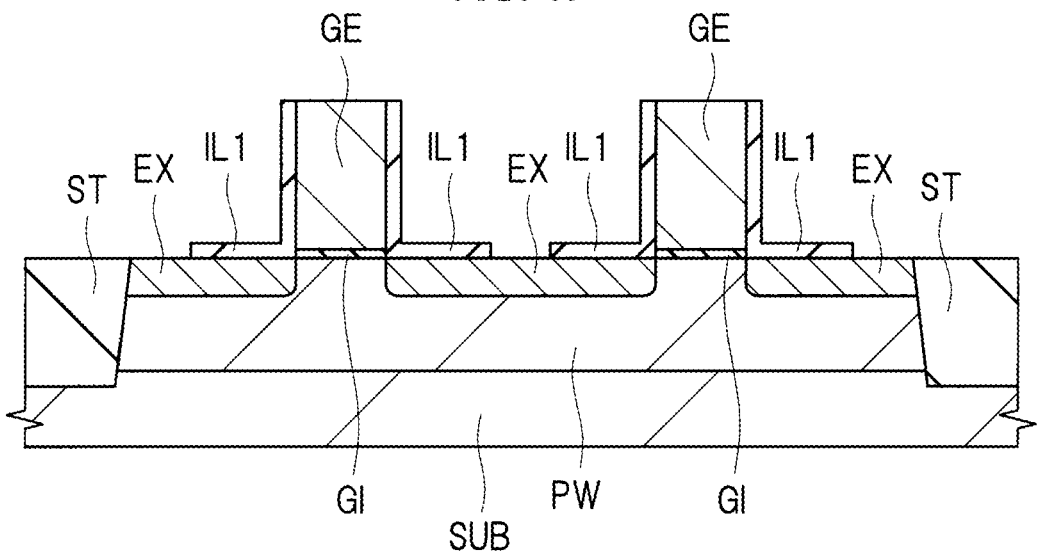
FIG. 47 is an essential part cross-sectional view in a manufacturing process of a semiconductor device of a modification of a Fourth Embodiment.

In the present Fifth Embodiment, too, processes up to Step S11 (the process of removing the insulating film IL2) are performed, in the approximately same manner as those in the Third Embodiment, to obtain the structure in FIG. 47 corresponding to that in FIG. 37. In processes described above, the difference of the present Fifth Embodiment from the Third Embodiment is that, in the present Fifth Embodiment, the gate electrode GE contains a metal (metallic material). That is, in the present Fifth Embodiment, since the gate electrode GE contains a metal (metallic material), it is what we call a metal gate electrode (a metallic gate electrode). Meanwhile, the term "a metal (metallic material)" here means a conductor showing metallic conduction, which shall include not only single metals (pure metals) and alloys but also metallic compounds showing metallic conduction (such as metal nitride and metal carbide).

For example, as to the gate electrode GE, by forming a metal film (for example, a tungsten film) instead of the silicon film PS and patterning the same using a photolithographic method and a dry etching method, the gate electrode GE containing a patterned metal film (for example, a patterned tungsten film) can be formed. The insulating film GI contains, more preferably, a high permittivity gate insulating film having a permittivity higher than that of silicon nitride (for example, a metal oxide film such as a hafnium oxide film or an aluminum oxide film).

Figure 48:
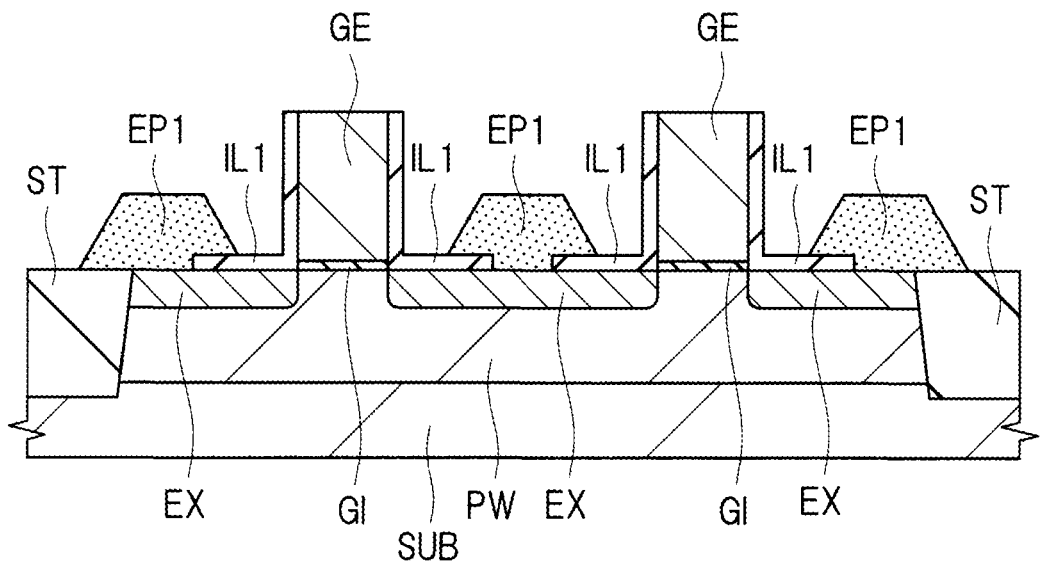
FIG. 48 is an essential part cross-sectional view in the process of manufacturing the semiconductor device following FIG. 47.

Then, as shown in FIG. 48, Step S12 is performed to form the semiconductor layer EP1, which is an epitaxial layer (an epitaxially grown layer, epitaxial semiconductor layer), on the semiconductor substrate SUB by epitaxial growth.

In the Third Embodiment, it is so configured that, by providing the impurity-implanted layer PS1 in the upper layer part of the gate electrode GE, an epitaxial layer (an epitaxial semiconductor layer) does not grow over the gate electrode GE in Step S12. Further, in the above present Fourth Embodiment, it is so configured that, by providing the insulating film IL5 in the upper part of the gate electrode GE, an epitaxial layer (an epitaxial semiconductor layer) does not grow over the gate electrode GE. In contrast, in the present Fifth Embodiment, since the gate electrode GE contains a metal (a metallic material) instead of a semiconductor material, an epitaxial layer (an epitaxial semiconductor layer) does not grow over the gate electrode GE in Step S12.

Consequently, in the same manner as that in the Third and Fourth Embodiments, in the present Fifth Embodiment, too, an epitaxial layer (an epitaxial semiconductor layer, which corresponds to the semiconductor layer EP2) does not grow over the gate electrode GE in Step S12. As to the semiconductor layer EP1, the situation in the present Fifth Embodiment, too, is the same as that in the Third and Fourth Embodiments. That is, in the same manner as that in the Third and Fourth Embodiments, in the present Fifth Embodiment, too, the semiconductor layer EP1 grows selectively on the exposed face of the $n^-$-type semiconductor region EX (the exposed upper face) in Step S12 to result in the state where a part of the semiconductor layer EP1 runs (extends) over the insulating film IL1.

The subsequent processes are basically the same as those in the Third Embodiment.

Figure 49:
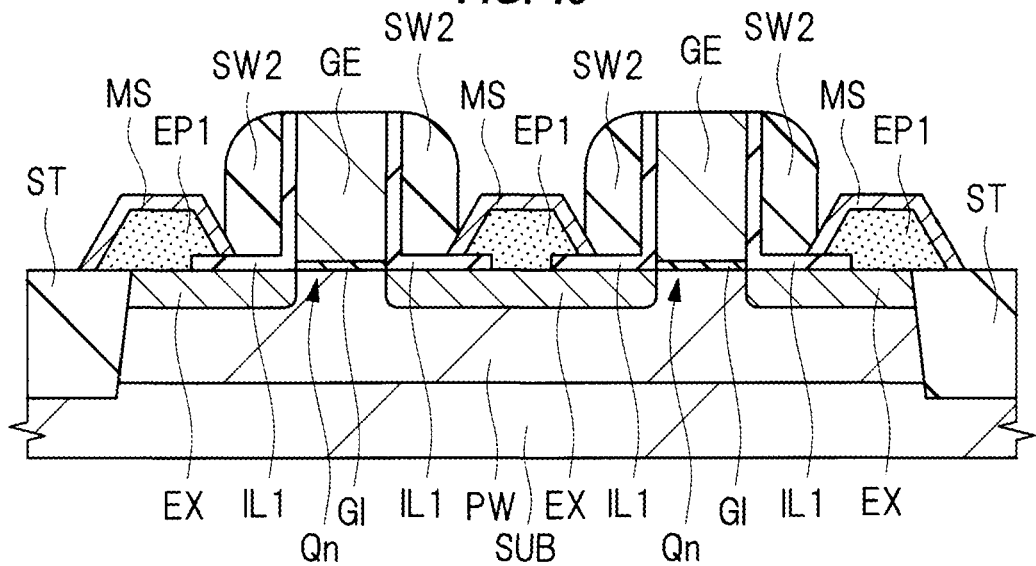
FIG. 49 is an essential part cross-sectional view in the process of manufacturing the semiconductor device following FIG. 48.

That is, in the present Fifth Embodiment, too, in the same manner as that in the Third Embodiment, Step S13 is performed to form, as shown in FIG. 49, the sidewall spacer SW2 over the side wall of the gate electrode GE via the insulating film IL1. In the present Fifth Embodiment, too, the process of forming the sidewall spacer SW2 (that is, Step S13) and the configuration of the sidewall spacer SW2 are the same as those in the First, Third and Fourth Embodiments. The semiconductor layer EP1 functions as a semiconductor region for source/drain of the MISFET and has the same conductivity type as that of the n⁻-type semiconductor region EX (here, the n-type), and preferably has an impurity concentration higher than that in the n⁻-type semiconductor region EX. In this case, the technique of introducing an impurity into the semiconductor layer EP1 is the same as that in the Third Embodiment.

Then, in the present Fifth Embodiment, too, Step S14 is performed in the same manner as that in the First Embodiment and the Third Embodiment to form, as shown in FIG. 40, the metal silicide layer MS over the surface (the upper layer part) of the semiconductor layer EP1.

However, although the process of forming the metal silicide layer MS in Step S14 is basically the same as that in the First Embodiment and the Third Embodiment, the present Fifth Embodiment is different from the First Embodiment and the Third Embodiment in that the semiconductor layer EP2 is not formed over the gate electrode GE and, since the gate electrode GE contains a metal (a metallic material), the metal silicide layer MS is not formed over the gate electrode GE. Meanwhile, the point that the metal silicide layer MS is formed over the semiconductor layer EP1 is the same in the present Fifth Embodiment, too, as in the First to Fourth Embodiments.

Figure 50:
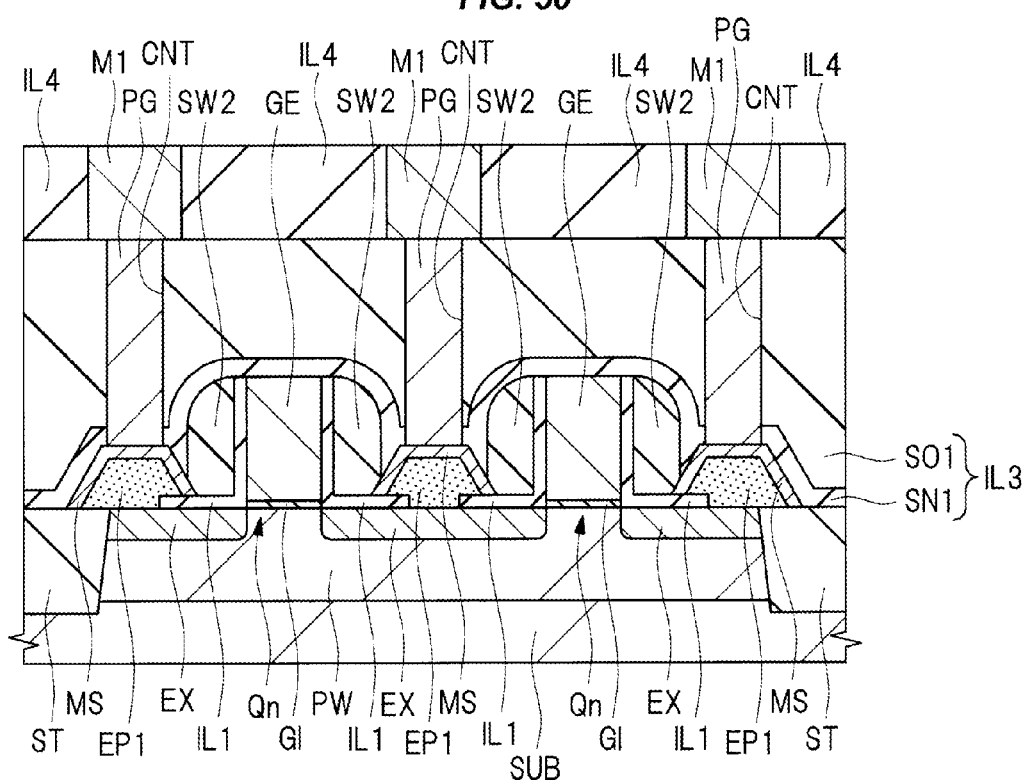
FIG. 50 is an essential part cross-sectional view in the process of manufacturing the semiconductor device following FIG. 49.

After that, in the same manner as that in the First Embodiment and the Third Embodiment, in the present Fifth Embodiment, too, the insulating film IL3 is formed as the interlayer insulating film, as shown in FIG. 50, over the main surface of the semiconductor substrate SUB so as to cover the gate electrode GE, the semiconductor layer EP1, the metal silicide layer MS and the sidewall spacer SW2, the contact hole CNT is formed in the insulating film IL3, and the plug PG is formed in the contact hole CNT. Then, in the same manner as that in the First Embodiment and the Third Embodiment, over the insulating film IL3 in which the plug PG has been embedded, the insulating film IL4 for forming wiring is formed, the wiring trench is formed in the insulating film IL4, and the wiring M1 is formed in the wiring trench.

In the present Fifth Embodiment, in addition to the effects given in the Third Embodiment, following effects can also be given.

That is, in the present Fifth Embodiment, the gate electrode GE contains a metal gate electrode. Consequently, such an advantage that a depletion phenomenon of the gate electrode GE can be suppressed to eliminate parasitic capacity can be given. In addition, such an advantage that decrease in size of a MISFET element (decrease in the thickness of the gate insulating film) becomes possible can also be given. When the gate insulating film (insulating film GI) contains a high permittivity film (what we call a High-k film) having a permittivity (a relative permittivity) higher than that of a silicon nitride film, the physical thickness of the gate insulating film (the insulating film GI) can be increased as compared with a case where a silicon oxide film is used. Therefore, such an advantage that the leak current can be reduced is given.

Further, as the result that the gate electrode GE contains a metal (a metallic material), the formation of an epitaxial layer (an epitaxial semiconductor layer) over the gate electrode GE can be prevented. Therefore, the attendant effect as described in the Third Embodiment can be given without performing a special process (for example, the process of forming the impurity-implanted layer PS1 in the Third Embodiment).

In the First to Fifth Embodiments, the case where a silicon substrate is used as the semiconductor substrate SUB is explained. As other modes, in place of the silicon substrate, a semiconductor substrate other than the silicon substrate (such as a SiGe substrate or a Ge substrate), or a substrate in which another (other than silicon) semiconductor material layer is formed over the main surface of a silicon substrate may be used as the semiconductor substrate SUB. In the First to Fifth Embodiments, the explanation is performed while focusing on the case where a selectively epitaxially grown layer of silicon is used as the semiconductor layers EP1 and EP2, but, as another mode, a selectively epitaxially grown layer of silicon germanium, germanium or the like may be used. Further, in the First to Fourth Embodiments, the case where the gate electrode GE contains silicon (polysilicon) is explained, but, as another mode, the gate electrode GE may also contain a semiconductor material other than silicon (such as SiGe).

The stacked film LM may contain three or more layers of insulating films. On this occasion, in Step S11 above, in the stacked film LM configuring the sidewall spacer SW1, at least the insulating film of the uppermost layer is removed, and, in the stacked film LM configuring the sidewall spacer SW1, at least the insulating film of the lowermost layer is left in a layer shape. That is, in Step S11, in the stacked film LM configuring the sidewall spacer SW1, insulating films of one or more layers including the insulating film of the uppermost layer are removed, and insulating films of one or more layers including the insulating film of the lowermost layer are left. The semiconductor layer EP1 formed in Step S12 runs over the remaining insulating film in the part extending over the semiconductor substrate SUB.

Hereinbefore, the invention achieved by the present inventors is explained specifically on the basis of embodiments thereof, but, needless to say, the present invention is not limited to the Embodiments but may be variously changed in the range that does not deviate from the purport thereof.

What is claimed is:

1. A semiconductor device having a MISFET, the MISFET comprising:
   a semiconductor substrate;
   a gate electrode formed over the semiconductor substrate via a gate insulating film;
   a first side wall insulating film extending from over a side wall of the gate electrode to over the semiconductor substrate;
   a first epitaxial semiconductor layer formed on the semiconductor substrate exposed from the first side wall insulating film; and
   a second side wall insulating film formed over the side wall of the gate electrode via the first side wall insulating film, wherein
   the first side wall insulating film has a part extending over the side wall of the gate electrode and a part extending over the semiconductor substrate,
   a part of the first epitaxial semiconductor layer lies over the first side wall insulating film in the part extending over the semiconductor substrate, and
   a thickness of the first side wall insulating film and the second side wall insulating film in a gate length direction is shorter than a length of the part of the first side wall insulating film in the gate length direction.

2. The semiconductor device according to claim 1, wherein the first epitaxial semiconductor layer is a semiconductor layer for source/drain.

3. The semiconductor device according to claim 2, wherein, in an upper part of the first epitaxial semiconductor layer, a compound layer of a metal and an element configuring the first epitaxial semiconductor layer is formed.

4. The semiconductor device according to claim 3, wherein a part of the second side wall insulating film lies over the first epitaxial semiconductor layer.

* * * * *